United States Patent
Takemura et al.

(10) Patent No.: US 8,247,166 B2
(45) Date of Patent: Aug. 21, 2012

(54) DOUBLE PATTERNING PROCESS

(75) Inventors: Katsuya Takemura, Joetsu (JP); Tsunehiro Nishi, Joetsu (JP); Jun Hatakeyama, Joetsu (JP); Masaki Ohashi, Joetsu (JP); Takeshi Kinsho, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 400 days.

(21) Appl. No.: 12/549,792

(22) Filed: Aug. 28, 2009

(65) Prior Publication Data
US 2010/0062380 A1    Mar. 11, 2010

(30) Foreign Application Priority Data
Sep. 5, 2008   (JP) .................. 2008-227775

(51) Int. Cl.
G03F 7/26    (2006.01)
(52) U.S. Cl. ...................... 430/324; 430/394
(58) Field of Classification Search .................. 430/311, 430/394
See application file for complete search history.

(56) References Cited

U.S. PATENT DOCUMENTS

| 5,650,483 | A | 7/1997 | Malik et al. |
| 6,312,867 | B1 | 11/2001 | Kinsho et al. |
| 6,936,400 | B2 | 8/2005 | Takasu et al. |
| 2002/0146645 | A1 | 10/2002 | Tachikawa et al. |

(Continued)

FOREIGN PATENT DOCUMENTS
JP    2000-336121 A    12/2000

(Continued)

OTHER PUBLICATIONS

Masato Shibuya, et al. "Performance of Resolution Enhancement Technique Using Both Multiple Exposure and Nonlinear Resist." Japanese Journal of Applied Physics, vol. 33, 1994.

(Continued)

*Primary Examiner* — Kathleen Duda
(74) *Attorney, Agent, or Firm* — Westerman, Hattori, Daniels & Adrian, LLP

(57) ABSTRACT

A double pattern is formed by coating a first positive resist composition onto a substrate, patternwise exposure to radiation, and development with alkaline developer to form a first resist pattern; applying heat and/or radiation to render the first resist pattern insoluble in a second solvent and in a second developer; coating a second resist composition on the first resist pattern, patternwise exposure to radiation, and development with second developer to form a second resist pattern. The resin in the first resist composition comprises recurring units of formula (1) wherein $R^1$ is H, $CH_3$ or $CF_3$, m=1 or 2, n=0 or 1.

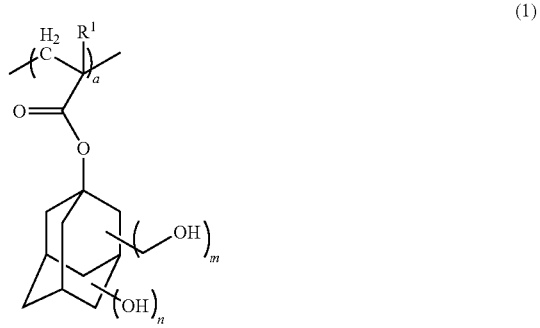

(1)

8 Claims, 3 Drawing Sheets

U.S. PATENT DOCUMENTS

| | | |
|---|---|---|
| 2004/0241576 A1 | 12/2004 | Iwashita et al. |
| 2006/0134545 A1 | 6/2006 | Iwashita et al. |
| 2006/0246377 A1 | 11/2006 | Yamato et al. |
| 2008/0166665 A1* | 7/2008 | Jung .............................. 430/313 |
| 2009/0035697 A1 | 2/2009 | Iwashita |
| 2009/0142693 A1 | 6/2009 | Iwashita |
| 2009/0142698 A1 | 6/2009 | Iwashita et al. |
| 2010/0035177 A1* | 2/2010 | Ishikawa et al. ........... 430/270.1 |

FOREIGN PATENT DOCUMENTS

| | | |
|---|---|---|
| JP | 2004-4794 A | 1/2004 |
| JP | 2004-252146 A | 9/2004 |
| JP | 2004-294638 A | 10/2004 |
| JP | 2004-318080 A | 11/2004 |
| JP | 2004-341432 A | 12/2004 |
| JP | 2005-3862 A | 1/2005 |
| JP | 2005-3863 A | 1/2005 |
| JP | 2005-336452 A | 12/2005 |
| JP | 2006-145775 A | 6/2006 |
| JP | 2006-145788 A | 6/2006 |
| JP | 2006-163066 A | 6/2006 |
| JP | 2006-195050 A | 7/2006 |
| JP | 2006-215067 A | 8/2006 |
| JP | 2006-301289 A | 11/2006 |
| JP | 2006-317803 A | 11/2006 |
| JP | 2006-350198 A | 12/2006 |
| WO | 2004-074242 A2 | 9/2004 |
| WO | 2004-074936 A1 | 9/2004 |

OTHER PUBLICATIONS

BJ Lin, "Semiconductor Foundry, Lithography, and Partners." TSMC, Inc. Micropatterning Division.

Maenhoudt, M. et al., "Double Patterning Scheme for sub-0.25 k1 Single Damascene Structures at NA=0.75, $\lambda$=193nm." Optical Microlithography XVIII, 2005, pp. 1508-1518, vol. 5754.

Owa, S. et al., "Immersion Lithography; Its Potential Performance and Issues." Optical Microlithography XVI, 2003, pp. 724-733, vol. 5040.

* cited by examiner

FIG. 2

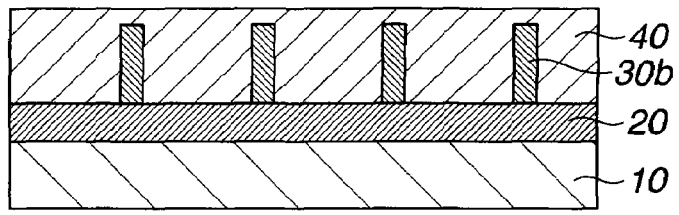
(D) COATING OF SECOND RESIST MATERIAL

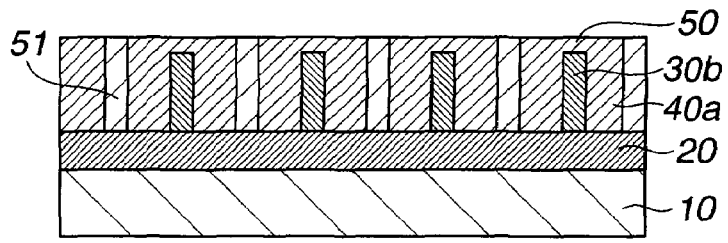
(E-1) EXPOSURE TO FORM SECOND POSITIVE RESIST LINE PATTERN BETWEEN FIRST RESIST PATTERN

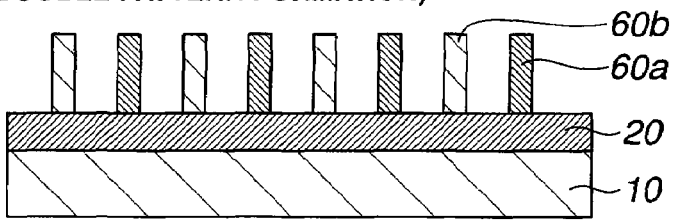
(E-2) FORMATION OF SECOND POSITIVE RESIST LINE PATTERN BETWEEN FIRST RESIST PATTERN (DOUBLE PATTERN FORMATION)

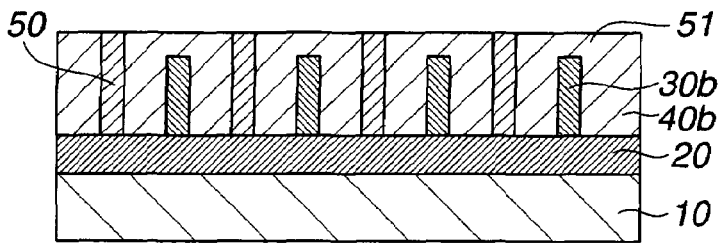
(E-3) EXPOSURE TO FORM SECOND NEGATIVE RESIST LINE PATTERN BETWEEN FIRST RESIST PATTERN

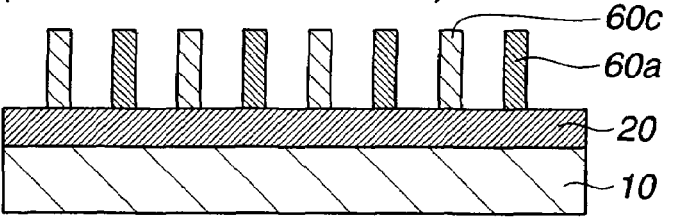
(E-4) FORMATION OF SECOND NEGATIVE RESIST LINE PATTERN BETWEEN FIRST RESIST PATTERN (DOUBLE PATTERN FORMATION)

FIG. 3
(E-5) EXPOSURE TO FORM SECOND POSITIVE RESIST LINE PATTERN PERPENDICULAR TO FIRST RESIST PATTERN
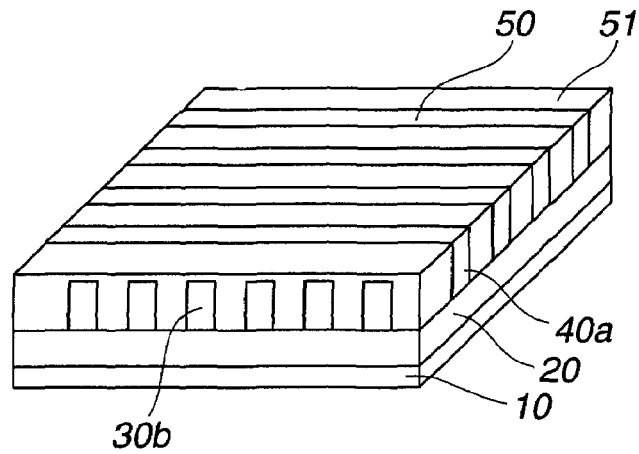
(E-6) FORMATION OF SECOND POSITIVE RESIST LINE PATTERN PERPENDICULAR TO RETAINED FIRST RESIST PATTERN (DOUBLE PATTERN FORMATION), CONTACT HOLE FORMATION
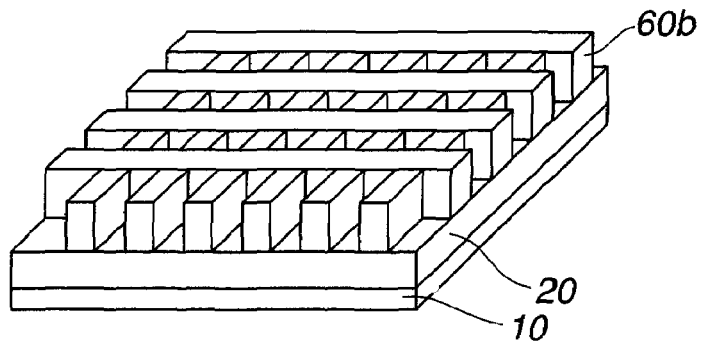

DOUBLE PATTERNING PROCESS

CROSS-REFERENCE TO RELATED APPLICATION

This non-provisional application claims priority under 35 U.S.C. §119(a) on Patent Application No. 2008-227775 filed in Japan on Sep. 5, 2008, the entire contents of which are hereby incorporated by reference.

TECHNICAL FIELD

This invention relates to a double patterning process for forming a first positive resist pattern and a second resist pattern simultaneously in an overlapping manner, involving the steps of forming a first positive pattern through exposure and development, applying heat and/or high-energy radiation to render the first pattern insoluble in organic solvent and alkaline developer, coating a second resist composition thereon, and forming a second resist pattern through exposure, bake and development.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 μm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 μm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of $1/100°$ C. while it was recognized that the impact of heat from the resist film upon light exposure drew little concern. There was a likelihood that micro-bubbles in water could be transferred to the pattern. It was found that the risk of bubble generation is obviated by thorough deaeration of water and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE, Vol. 5040, p 724). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-width roughness (LWR) of resist coating, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm despite successful resolution of 35 nm. For resolution of 32 nm, a liquid with a refractive index of 1.8 or greater and resist and protective films with a refractive index of 1.8 or greater are necessary. Among the materials with a refractive index of 1.8 or greater, the high refractive index liquid seems least available. Such a liquid material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern between features of the first pattern. See Proc. SPIE, Vol. 5754, p 1508 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern.

An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching.

In either process, the hard mask is processed by two dry etchings. Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in a higher alcohol of 4 or more carbon atoms, in which the positive resist material is not dissolvable, in a second exposure. Since negative resist materials with low resolution are used, these methods entail degradation of resolution.

A method which does not involve post-exposure bake (PEB) and development between first and second exposures is the simplest method with high throughputs. This method involves first exposure, replacement by a mask having a shifted pattern drawn, second exposure, PEB, development and dry etching. However, the energy of light for second exposure offsets the energy of light for first exposure so that the contrast becomes zero, leading to a failure of pattern formation. If an acid generator capable of two photon absorption or a contrast enhancement layer (CEL) is used to provide nonlinear acid generation, then the energy offset is relatively reduced even when second exposure is performed at a half-pitch shifted position. Thus a pattern having a half pitch corresponding to the shift can be formed, though at a low contrast. See Jpn. J. Appl. Phy. Vol. 33 (1994) p 6874-6877, Part 1, No. 12B, December 1994. In this regard, if the mask is replaced on every exposure, the throughput is substantially reduced. Then first exposure is performed on a certain number of wafers before second exposure is performed. Due to acid diffusion during the standing time between the first and second exposures, there can occur dimensional variations which are of concern.

In addition to the double patterning technique, the technology for forming a fine space pattern or hole pattern includes use of negative resist, thermal flow, and RELACS. The negative resist material suffers from the problem that the resist itself has a low resolution as discussed above. The thermal flow is another process of forming a fine space pattern. The space pattern once formed is heated at a temperature above the glass transition temperature (Tg) of the resist pattern, causing the pattern to flow to narrow the spaces. The RELACS known as a further process of forming a fine space pattern is by applying on the space pattern a composition in a solvent in which the resist pattern is not soluble and adding chemical attachment by heat, thereby narrowing the space.

Citation List
Non-Patent Document 1: Proc. SPIE, Vol. 4690, xxix
Non-Patent Document 2: Proc. SPIE, Vol. 5040, p 724
Non-Patent Document 3: Proc. SPIE, Vol. 5754, p 1508 (2005)
Non-Patent Document 4: Jpn. J. Appl. Phy. Vol. 33 (1994) p 6874-6877, Part 1, No. 12B, December 1994

SUMMARY OF INVENTION

In connection with the fabrication of LSIs which are advancing toward higher integration and operating speeds, double patterning is proposed and reported as being able to process to a very fine pattern rule. However, the process is not simple, and is regarded rather complex as requiring first lithography, subsequent etching, second lithography, and further etching (two lithography and two etching steps). There is a desire to have a technique capable of processing by a single etching after patterning by two lithography processes. However, the technique of converting the first pattern to be insoluble in an organic solvent used in the second resist composition, and improvements in the resolving performance of both the first and second resist compositions remain as outstanding problems to be solved.

In addition to the double patterning technique, the technology for forming fine spaces is very important and includes use of negative resist, thermal flow, and RELACS. The negative resist material suffers from the problem that the resist itself has a low resolution. The thermal flow is another process of forming a fine space pattern. Because the quantity of pattern material available for flow is reduced as the feature size becomes finer, the thermal flow process becomes difficult to reserve a sufficient quantity of flow. In general, resist compositions capable of high resolution performance have a high glass transition temperature (Tg) so that a sufficient flow may not occur during the thermal flow step at a certain heating temperature. It is also said that the size reduction by thermal flow encounters a limit. The RELACS known as a further process of forming a fine space pattern is by adding chemical attachment to the space pattern by heat, thereby narrowing the space. There are problems that the amount of attachment varies depending on the type of resist composition of which spaces are formed, and variations occur during dimensional shrinkage by heat. Another potential problem is a likelihood of generating pattern defects.

Accordingly, an object of the invention is to provide a double pattern forming process which needs only simple process management without complex steps as the technology of processing patterns to very fine rules as required in the manufacture of LSIs featuring higher integration and faster operation.

The inventors have found that when a resin in a first chemically amplified positive resist composition of which a positive resist pattern is composed is subjected to crosslinking treatment, the first positive resist pattern is endowed with the necessary organic solvent resistance, i.e., resistance to an organic solvent in a second resist composition to be subsequently applied and also rendered insoluble in an alkaline developer used to develop the second resist composition to form a second resist pattern. Then the first positive resist pattern is retained, without disruption or dissolution, during the patterning of the second resist film. A combination of the first resist pattern with the second resist pattern leads to double pattern formation. Absent a need to etch a processable substrate beneath the pattern after the first resist patterning, this double pattern forming process may proceed to the steps of coating and patterning a second resist composition immediately after the first resist patterning. The process is thus simple and useful.

Accordingly, in a first aspect (Claim 1), the invention provides a double pattern forming process comprising the steps of:

coating a first chemically amplified positive resist composition onto a processable substrate, the resist composition comprising a resin comprising recurring units having an alkali-soluble group protected with an acid labile group which is eliminatable with acid, an acid generator, and a solvent, and prebaking the resist composition to remove the unnecessary solvent and form a first resist film, exposing the first resist film to high-energy radiation in a first pattern of exposed and unexposed areas, post-exposure baking for causing the acid generated by the acid generator upon exposure to act on the acid labile groups on the resin whereby the acid labile groups on the resin in the exposed area undergo elimination reaction so that the resin in the exposed area becomes alkali soluble, and developing the exposed resist film with an alkaline developer to form a first positive resist pattern, rendering the first positive resist pattern insoluble in a solvent used in a second resist composition to be subsequently coated and also insoluble in an alkaline developer to be applied upon subsequent patterning of the second resist composition, the insolubilizing step including application of heat and/or high-energy radiation, coating a second chemically amplified resist composition on the first resist pattern, prebaking the second resist composition to remove the unnecessary solvent and form a second resist film, exposing the second resist film to high-energy radiation in a second pattern of exposed and unexposed areas, and developing the exposed second resist film with an alkaline developer to form a second resist pattern. The resin in the first resist composition comprises recurring units of the general formula (1):

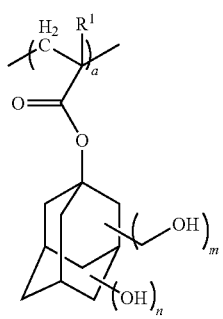

(1)

wherein $R^1$ is each independently hydrogen, methyl or trifluoromethyl, m is 1 or 2, n is 0 or 1, and "a" indicative of a ratio of the recurring units incorporated in the resin is in the range: $0.01 \leq a < 1$.

The inventors have found that by crosslinking the resin in the first resist composition of which a positive resist pattern is composed, the first positive resist pattern is endowed with the necessary organic solvent resistance, i.e., resistance to an organic solvent used in a second resist composition to be subsequently applied and also rendered insoluble in an alkaline developer used to develop the second resist composition to form a second resist pattern. That is, the first positive resist pattern is insolubilized in both organic solvent and alkaline developer. Then the first positive resist pattern is retained, without disruption or dissolution, during the patterning of the second resist film. The process enables double pattern formation by combining the first resist pattern with the second resist pattern. The recurring units of formula (1) allow for crosslinking reaction to occur due to their advantages to be described below, which enables the double pattern forming process.

In one embodiment wherein the second resist composition is positive, the double pattern forming process involves the steps of coating a first chemically amplified positive resist composition onto a processable substrate, the resist composition comprising a resin comprising recurring units having an alkali-soluble group protected with an acid labile group which is eliminatable with acid, an acid generator, and a solvent, and prebaking the resist composition to remove the unnecessary solvent and form a first resist film; exposing the first resist film to high-energy radiation in a first pattern of exposed and unexposed areas, post-exposure baking for causing the acid generated by the acid generator upon exposure to act on the acid labile groups on the resin whereby the acid labile groups on the resin in the exposed area undergo elimination reaction so that the resin in the exposed area becomes alkali soluble, and developing the exposed resist film with an alkaline developer to form a first positive resist pattern; rendering the first positive resist pattern insoluble in a solvent used in a second resist composition to be subsequently coated and also insoluble in an alkaline developer to be applied upon subsequent patterning of the second resist composition, the insolubilizing step including application of high-temperature heat and/or high-energy radiation; then coating a second chemically amplified resist composition on the first resist pattern, the second resist composition comprising a resin comprising recurring units having an alkali-soluble group protected with an acid labile group which is eliminatable with acid, an acid generator, and a solvent, prebaking the second resist composition to remove the unnecessary solvent and form a second resist film, exposing the second resist film to high-energy radiation in a second pattern of exposed and unexposed areas, post-exposure baking for causing the acid generated by the acid generator upon exposure to act on the acid labile groups on the resin whereby the acid labile groups on the resin in the exposed area undergo elimination reaction, and developing the exposed second resist film with an alkaline developer to form a second resist pattern.

The recurring units of formula (1) contain a highly nucleophilic primary alcohol which participates in crosslinking reaction. More specifically, in the step of applying high-temperature heat and/or high-energy radiation for crosslinking the first positive resist pattern so that the pattern becomes insoluble in both organic solvent and alkaline developer, those unreacted acid labile groups remaining in the resin of the first positive pattern are converted to carboxylic acid through elimination with the acid diffusing from the exposed area or the residual acid, elimination by heat, and further, elimination reaction of acid labile groups caused by the acid which is generated by the unreacted acid generator remaining in the first resist pattern upon exposure to high-energy radiation, whereby the first resist pattern is converted to be soluble in alkaline developer. At this point, the primary alcohol contained in the recurring units of formula (1) acts on this carboxylic acid which is alkali soluble, so that esterification reaction takes place, thereby blocking alkali solubility.

By the way, the esterification reaction between the primary alcohol contained in the recurring units of formula (1) and the carboxylic acid resulting from elimination reaction of acid labile groups may occur within molecules and between molecules of the resin in the first resist composition. When esterification reaction occurs between molecules of the resin, it corresponds to crosslinking reaction in the resin, indicating that the resin undergoes a noticeable molecular weight buildup and becomes insoluble in organic solvents commonly used in resist compositions.

Accordingly, in the double pattern forming process involving coating a second resist composition immediately after patterning of the first resist and patterning the second resist, the recurring units of formula (1) are essential as the means for rendering the first resist pattern insoluble in organic solvent and insoluble in alkaline developer. Thus by incorporating the recurring units of formula (1) in the resin in the first chemically amplified positive resist composition, the object of the invention is attained.

The second chemically amplified resist composition to be coated immediately after patterning of the first resist may be either positive or negative. Now that it is possible to render the first resist pattern insoluble in organic solvents commonly used in resist compositions, the process does not depend on whether the second resist composition is positive or negative.

In a preferred embodiment (Claim 2) that pertains to the resin contained in the first chemically amplified positive resist composition for pattern formation of the first resist film, the recurring units having an alkali-soluble group protected with an acid labile group which is eliminatable with acid are represented by the general formula (2), and the resin further comprises recurring units represented by the general formula (3). That is, the resin in this embodiment comprises recurring units of formulae (1), (2), and (3).

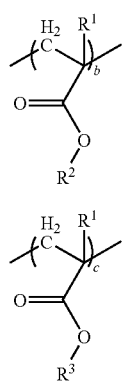

Herein $R^1$ is each independently hydrogen, methyl or trifluoromethyl, $R^2$ is an acid labile group, $R^3$ is a group of lactone structure, b and c indicative of a ratio of the respective recurring units incorporated in the resin are in the range: $0.01 \leq b < 1$, $0.01 \leq c < 1$, and $0.3 \leq a+b+c \leq 1$.

In a preferred embodiment (Claim 3) of the double pattern forming process involving coating a second resist composition immediately after patterning of the first resist and patterning the second resist, it is also advantageous to incorporate recurring units having a 7-oxanorbornane ring structure represented by the general formula (4), (5) or (6) in the resin in the first chemically amplified positive resist composition, as the means for rendering the first resist pattern insoluble in organic solvent and insoluble in alkaline developer.

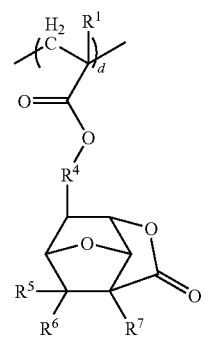

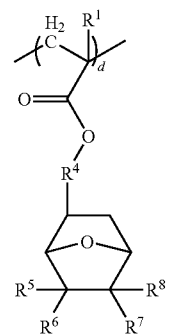

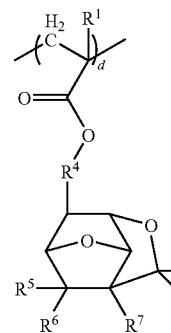

Herein $R^1$ is each independently hydrogen, methyl or trifluoromethyl, $R^4$ is a single bond, or a straight, branched or cyclic $C_1$-$C_6$ alkylene group which may have an ether or ester group and which has a primary or secondary carbon atom through which it is linked to the ester moiety in the formula, $R^5$, $R^6$, $R^7$, and $R^8$ are each independently hydrogen or a straight, branched or cyclic $C_1$-$C_6$ alkyl group, $R^9$ and $R^{10}$ are each independently hydrogen, a straight, branched or cyclic $C_1$-$C_6$ alkyl group or $-CO_2R^{11}$, or may bond together to form a cyclic alkyl group with the carbon atom to which they are attached, $R^{11}$ is hydrogen or a straight, branched or cyclic $C_1$-$C_6$ alkyl group, and d is a number in the range: $0 \leq d \leq 0.5$ and $0.3 \leq a+b+c+d \leq 1$. Specifically, the 7-oxanorbornane ring structure units represented by formula (4), (5) or (6) undergo ring-opening/crosslinking reaction, during the step of applying high-temperature heat and/or high-energy radiation for rendering the first resist pattern insoluble in organic solvent and alkaline developer, under the catalysis of the acid diffusing from the exposed area or the residual acid, and the acid which is generated by the unreacted acid generator remaining in the first resist pattern upon exposure to high-energy radiation. This makes up the reaction to render the first resist pattern insoluble in organic solvent and insoluble in alkaline developer.

The recurring units having a 7-oxanorbornane ring structure to be incorporated in the resin in the first positive resist composition themselves undergo ring-opening/crosslinking reaction, ensuring that the first resist pattern becomes insoluble in the solvent used in the second resist composition and also insoluble in the alkaline developer applied in patterning of the second resist film. It is then believed that since the resin in the first resist composition contains recurring units of formula (1), the primary alcohol in formula (1) positively makes a nucleophilic attack to the 7-oxanorbornane ring structure, helping ring-opening/crosslinking reaction proceed more efficiently on the recurring units having a 7-oxanorbornane ring structure. Advantageously, this ensures that the first resist pattern becomes insoluble in the solvent used in the second resist composition and also insoluble in the alkaline developer applied in patterning of the second resist film.

It is also preferred (Claim 4), in the step of applying high-temperature heat and/or high-energy radiation for rendering the first positive resist pattern insoluble in a solvent used in a second resist composition to be subsequently coated and also insoluble in an alkaline developer to be applied upon subsequent patterning of the second resist composition, a compound capable of generating an acid upon exposure to high-energy radiation and/or a compound capable of generating an acid upon heating is added for the purpose of promoting insolubilization in both organic solvent and alkaline developer. The addition of this compound serves for the purpose of making up the acid catalyst for esterification reaction or intermolecular crosslinking between the primary alcohol containing in the recurring units of formula (1) and the carboxylic acid resulting from elimination of acid labile groups in the first resist pattern, and additionally for the purpose of making up the acid for promoting ring-opening/crosslinking reaction on the recurring units having a 7-oxanorbornane ring structure represented by formulae (4), (5) and (6).

In a preferred embodiment (Claim 5) wherein patterning to a finer feature size is necessary in patterning of the first chemically amplified resist composition and also in patterning of the second chemically amplified resist composition, the step of exposing each resist film to a pattern of high-energy radiation is effected by the immersion lithography wherein a high refractive index liquid having a refractive index of at least 1.0 intervenes between the resist film and a projection lens.

When the step of exposing the first or second resist film to a pattern of high-energy radiation is effected by the immersion lithography wherein a high refractive index liquid having a refractive index of at least 1.0 intervenes between the resist film and a projection lens, a preferred embodiment (Claim 6) further includes the step of applying a protective coating on the first or second resist film.

ADVANTAGEOUS EFFECTS OF INVENTION

The double pattern forming process of the invention is combinable with the immersion lithography capable of processing a finer size pattern. The double pattern forming process, combined with the immersion lithography, is able to process a finer size pattern in a simple manner.

BRIEF DESCRIPTION OF DRAWINGS

FIG. 1(A) illustrating a processable substrate and a first resist film disposed on a substrate;

FIG. 1(B) illustrating that the first resist film is exposed and developed;

FIG. 1(B-1) illustrating that lines of thinner size are finished in the first resist film by over-exposure and development;

FIG. 1(C) illustrating that the resist pattern is crosslinked by flood exposure or heat treatment.

FIG. 2 schematically illustrates in cross-sectional view the pattern forming process of the invention after coating of a second resist composition;

FIG. 2(D) illustrating that the second resist composition is coated;

FIG. 2(E-1) illustrating that where the second resist composition is positive, the second resist film is exposed to a pattern of transmitting and shielding areas so that lines of a second resist pattern are disposed between lines of the first resist pattern;

FIG. 2(E-2) illustrating that after the exposure of the second resist film in (E-1), PEB and development with alkaline developer are performed to pattern the second resist film, thus forming the (retained) first resist pattern lines and second resist pattern lines, i.e., double pattern formation;

FIG. 2(E-3) illustrating that where the second resist composition is negative, the second resist film is exposed to a pattern so that lines of a second resist pattern are disposed between lines of the first resist pattern;

FIG. 2(E-4) illustrating that after the exposure of the second resist film in (E-3), PEB and development with alkaline developer are performed to pattern the second resist film, thus forming the (retained) first resist pattern lines and second resist pattern lines, i.e., double pattern formation.

FIG. 3 schematically illustrates in cross-sectional view the pattern forming process in another embodiment of the invention;

FIG. 3(E-5) illustrating that where the second resist composition is positive, the second resist film is exposed so that lines of a second resist pattern are perpendicular to lines of the first resist pattern;

FIG. 3(E-6) illustrating that after the exposure of the second resist film in (E-5), PEB and development with alkaline developer are performed to pattern the second resist film to define the (retained) first resist pattern lines and second resist pattern lines, thus forming a pattern (double pattern) like a contact hole pattern wherein lines of a second resist pattern are perpendicular to lines of the first resist pattern.

DESCRIPTION OF THE PREFERRED EMBODIMENTS

Figure 1:
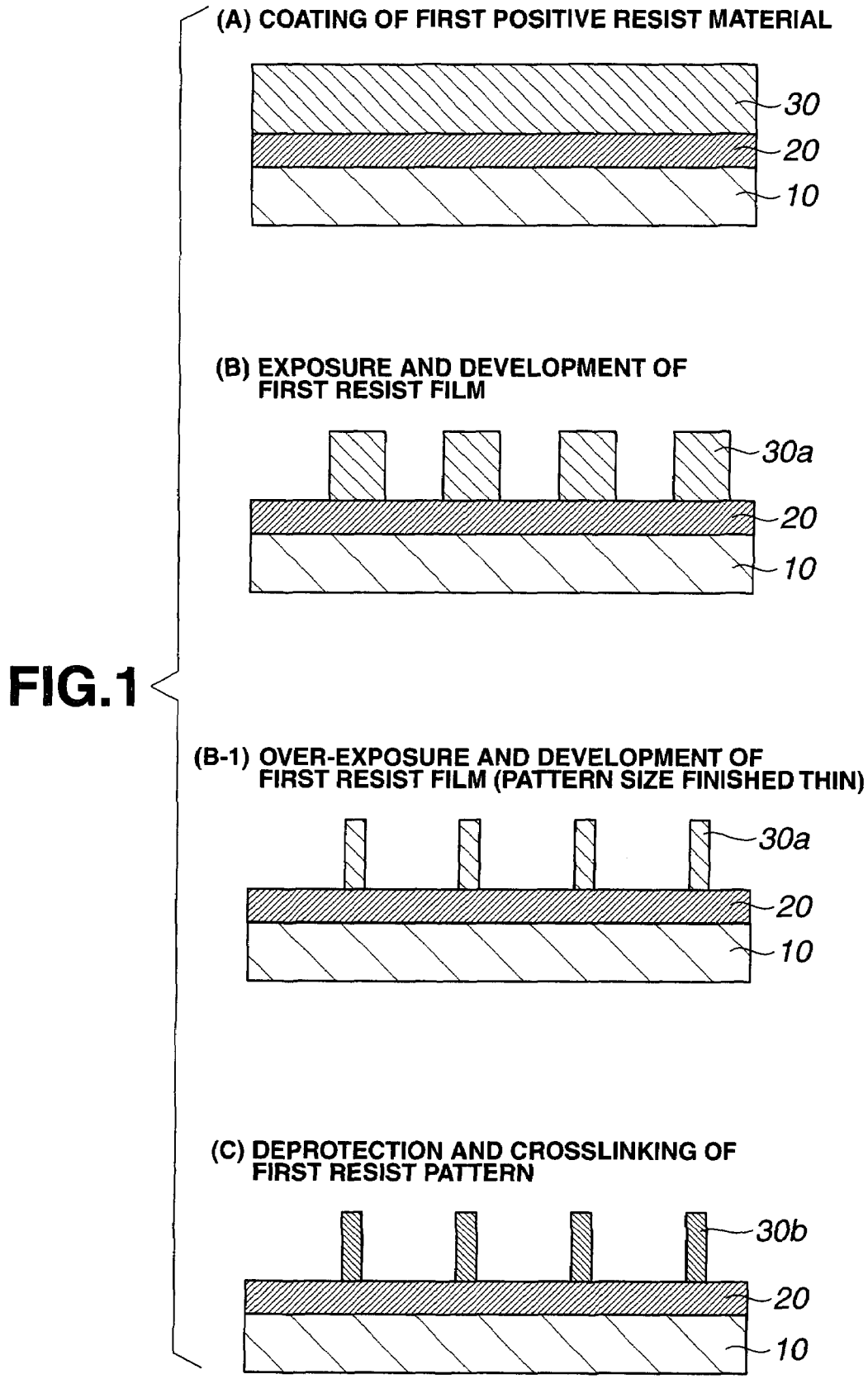
FIG. 1 schematically illustrates in cross-sectional view the pattern forming process in one embodiment of the invention.

The terms "a" and "an" herein do not denote a limitation of quantity, but rather denote the presence of at least one of the referenced item. As used herein, the notation ($C_n$-$C_m$) means a group containing from n to m carbon atoms per group. The abbreviation "phr" refers to parts by weight per 100 parts by weight of resin. Me is methyl.

There were several problems to be overcome in the course of development works. The process generally involves forming a first resist pattern, coating a second resist composition on the first resist pattern, and patterning a second resist film with an alkaline developer. One problem is to render the first resist pattern insoluble in a solvent used in the second resist composition. Another problem which is more important is to render the first resist pattern completely insoluble in the alkaline developer used in patterning of the second resist film. Complete insolubilization means that the first resist pattern once formed is retained intact, i.e., neither deformed nor disrupted, during the steps of patterning the second resist film, that is, the first resist pattern is not dissolved or substantially altered in pattern profile or size when contacted with the alkaline developer. For example, even when the first resist film is insolubilized in the alkaline developer, there is still a likelihood that the fine pattern of the first resist film may be disrupted, deformed with concomitant swell, or extinguished rather than being retained. The inventors have found that a first chemically amplified positive resist composition comprising a specific resin forms a first resist pattern which can be insolubilized so that the first resist pattern may not be disrupted during the step of patterning the second resist film.

The double pattern forming process of the invention must seek for the process convenience that enables immediate transition from the step of causing crosslinking reaction to proceed on the first resist pattern to render it insoluble in organic solvent and in alkaline developer to the step of coating and patterning the second resist composition. If an etching step is introduced between the step of patterning the first resist film and the step of patterning the second resist film for transferring the first resist pattern to the processable substrate, then the process proceeds to the step of coating and patterning the second resist composition after the etching step. This process is not regarded efficient because it is complex and time consuming. It is desired that the means for rendering the first resist pattern insoluble in organic solvent and in alkaline developer be simple, if possible.

It seems undesirable to employ a special means of applying an insolubilizing agent to the surface of the first resist pattern. The reason is that the insolubilizing agent is applied onto the first resist pattern through many steps including the step of coating the insolubilizing agent onto the first resist pattern, the step of heating to effect insolubilization reaction, and the step of removing the unnecessary remainder of the insolubilizing agent. The overall process is not regarded efficient. Moreover, if the removal of the unnecessary remainder of insolubilizing agent is insufficient, such residues become pattern defects, with a possibility of substantially detracting from the yield of device manufacture. Also, the insolubilizing agent deposited on the first resist pattern can adversely affect the second resist composition, causing profile degradation and pattern size variation. It is thus desirable that the first resist pattern itself has a crosslinking and insolubilizing capability, if possible.

Similarly, it seems undesirable to install a special apparatus for rendering the first resist pattern insoluble. Namely, a study was made on an approach for the insolubilization of the first resist pattern by evaporating a silicon compound or the like onto the surface of the first resist pattern. However, use of an evaporation apparatus is undesirable because it is very expensive. It seems better if only those tools available in the steps of lithography process for semiconductor manufacture, for example, the hot plate used in the heating step and the exposure tool used in the patternwise exposure step are utilized for insolubilization as well.

Besides the problems to be overcome, there are several issues which must be taken into account in the practice of the invention.

A first issue relates to the step of heating the first resist pattern at high temperature for rendering it organic solvent-insoluble and alkaline developer-insoluble. To promote crosslinking reaction for insolubilization, the temperature is preferably high, and more preferably higher than the temperatures of the steps of prebaking and post-exposure baking the first resist film. If the temperature at which crosslinking reaction takes place is close to the prebaking and PEB temperatures of the first resist film, there is a possibility that crosslinking reaction takes place during patterning of the first resist film, failing to clear a risk of substantially degrading the lithographic properties of the first resist pattern. If the first resist pattern is heated at a higher temperature than its glass transition temperature (Tg), a thermal flow can occur in the first resist pattern, leading to an increased pattern size. Thus micropatterning becomes difficult. In the event a thermal flow occurs, the height of the resist pattern is also reduced.

An optimum temperature at which the first resist pattern is heated for causing the first resist pattern to develop alkaline solubility and for inducing crosslinking reaction to endow the first resist pattern with resistance to an organic solvent used in coating of the second resist composition is preferably at least 150° C., and more preferably in the range of 180 to 220° C. A chemically amplified resist composition essentially contains a photoacid generator and basic compound which generally serve as a plasticizer to lower the Tg of the resist pattern so that thermal flow may start at a lower temperature. Since the photoacid generator and basic compound are components commonly compounded in the chemically amplified resist composition, the resist base resin must be designed to have an elevated Tg, in consideration of the identity and plasticizing effect of these components. Accordingly, the resist base resin should have an optimum Tg of at least 150° C., and more preferably at least 180° C. If the temperature at which the first resist pattern is heated for inducing crosslinking reaction is higher than 220° C., the first resist pattern experiences noticeable thermal shrinkage or thermal damage. If the heating step for inducing crosslinking reaction is lower than 150° C., crosslinking reaction takes place to a less extent.

As described above, some acid which has diffused from exposed areas and remains in the first resist pattern or the acid generated by thermal decomposition of the acid generator in the resist composition remaining in the first resist pattern during the step of applying high-temperature heat and/or high-energy radiation for endowing the first resist pattern with resistance to organic solvent for the second resist film and with insolubility in alkaline developer serves as a catalyst for promoting crosslinking reaction on the first resist pattern. In this regard, positive addition to the first resist composition of a thermal acid generator capable of generating acid under the action of heat was devised for the purpose of making up for some acid in the first resist pattern. Regrettably, it was found that excess thermal acid generator added to the first resist composition can adversely affect the resolution performance and process margin of the first resist film when it is patterned. For example, the thermal acid generators are ammonium salts of acids. It is inferred that an anion exchange occurs between the ammonium salt and an onium salt used as the photoacid generator within the resist material, failing to achieve the desired resolution capability. For example, a resist material having a thermal acid generator added is observed as behaving to enhance the diffusion of acid acting on acid labile groups within the resist film. The enhanced acid diffusion exacerbates process margins of a resist pattern to be formed such as exposure latitude and mask error factor (MEF).

It was also found that the addition of a thermal acid generator can deteriorate the thermal properties of the first resist pattern. The thermal acid generator added behaves as a plasticizer in the step of heating at high temperature the first resist pattern to induce crosslinkage to endow it with resistance to solvent for the second resist material and to render it insoluble in alkaline developer, giving rise to the problem that the first resist pattern undergoes thermal flow during this heating step.

As discussed above, the addition of a thermal acid generator to the first resist composition is preferred in that it assists in endowing the first resist pattern with resistance to an organic solvent used in coating of the second resist composition and promotes crosslinking reaction to render the first resist pattern insoluble in alkaline developer, but excess addition gives rise to several problems. The thermal acid generator is added in such amounts as to avoid any substantial impacts on the lithography of patterning the first resist film and on the thermal properties of the first resist pattern. The amount of thermal acid generator added is generally up to 5%, preferably up to 3%, and more preferably 1 to 0.01% based on the weight of the base resin in the first resist composition.

Making extensive investigations on the task of endowing the first resist pattern with organic solvent resistance, the task of rendering the first resist pattern completely insoluble in alkaline developer, and other issues to be overcome in implementing the invention, the inventors have completed the double patterning process.

Now the invention is described in further detail.

The base resin in the first positive resist composition used in the pattern forming process is a polymer or high-molecular weight compound comprising recurring units of the general formula (1).

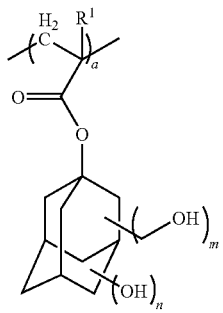

(1)

Herein $R^1$ is each independently hydrogen, methyl or trifluoromethyl, m is 1 or 2, n is 0 or 1, and "a" indicative of a ratio of the recurring units incorporated in the resin is in the range: $0.01 \leq a < 1$.

In the double pattern forming process, the base resin used in the first positive resist composition is a resin comprising recurring units of the general formula (1) which is designed for complete insolubilization such that the first resist pattern itself crosslinks to become insoluble in an organic solvent used in the second resist composition and the first resist pattern may not be disrupted, deformed with concomitant swell, or dissolved away during the steps of forming the second resist pattern, especially the alkaline development step. This is based on the fact that the recurring units of formula (1) contain a highly nucleophilic primary alcohol which participates in crosslinking reaction. More specifically, in the step of applying high-temperature heat and/or high-energy radiation for crosslinking the first positive resist pattern so that the pattern becomes insoluble in both organic solvent and alkaline developer, those unreacted acid labile groups remaining in the first positive resist pattern are converted to carboxylic acid through elimination with the acid diffusing from the exposed area or the residual acid, elimination by heat, and further, elimination reaction of acid labile groups caused by the acid which is generated by the unreacted acid generator remaining in the first resist pattern upon exposure to high-energy radiation, that is, acid labile group-containing recurring units are converted to recurring units of carboxylic acid so that the first resist pattern is converted to be soluble in alkaline developer. Now the primary alcohol contained in the recurring units of formula (1) acts on this carboxylic acid which is alkali soluble, so that esterification reaction takes place, thereby blocking alkali solubility.

A variety of crosslinking reaction modes may be employed in order to induce crosslinking reaction within the first resist pattern to render it insoluble in organic solvent and also insoluble in alkaline developer. In the step of applying high-temperature heat and/or high-energy radiation to drive crosslinking reaction as described above, a reaction that the acid labile groups remaining in the first resist pattern are eliminated and converted to alkali-soluble carboxylic acid can proceed at the same time. In this regard, it is actually difficult to render the first resist pattern completely insoluble in alkaline developer. If the first resist pattern is not completely insoluble in alkaline developer, then the first resist pattern suffers from a problem after formation of the second resist pattern, that the first resist pattern is deformed in shape with some swell, or the pattern is partially dissolved or fully dissolved away (i.e., extinguished).

However, the base resin in the first resist composition used in the double pattern forming process is a polymer comprising recurring units of formula (1) containing primary alcohol which is capable of blocking the carboxylic acid resulting from elimination reaction of acid labile group, by esterification reaction. In this way, the first resist pattern is rendered completely insoluble in alkaline developer.

Insolubilization in organic solvent may occur within molecules and between molecules of the resin. When esterification reaction occurs between molecules of the resin, it corresponds to crosslinking reaction in the resin, indicating that the resin undergoes a noticeable molecular weight buildup and becomes insoluble in organic solvents commonly used in resist compositions.

Illustrative examples of the units of formula (1) are given below.

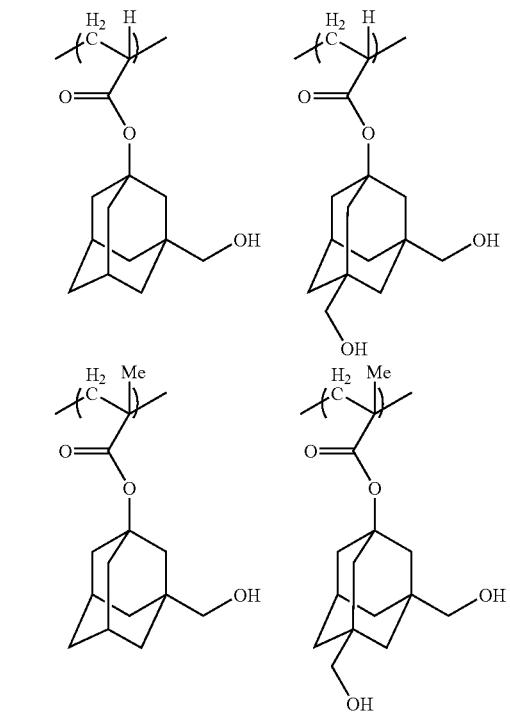

-continued

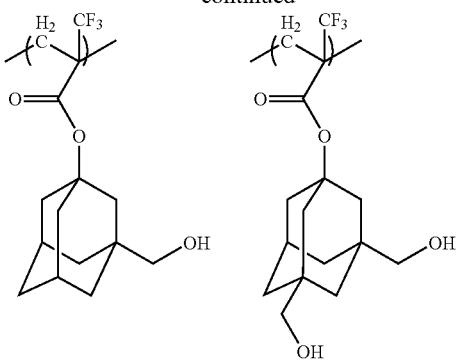

In a preferred embodiment of the resin contained in the first chemically amplified positive resist composition, the recurring units having an alkali-soluble group protected with an acid labile group which is eliminatable with acid are represented by the general formula (2), and the resin further comprises recurring units represented by the general formula (3).

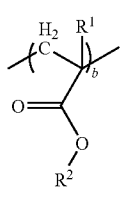 (2)

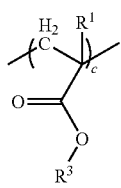 (3)

Herein $R^1$ is each independently hydrogen, methyl or trifluoromethyl, $R^2$ is an acid labile group, $R^3$ is a group of lactone structure, b and c indicative of a ratio of the respective recurring units incorporated in the resin are in the range: $0.01 \leq b < 1$, $0.01 \leq c < 1$, and $0.3 \leq a+b+c \leq 1$.

In formula (2), $R^2$ is an acid labile group. Since the first resist composition is a chemically amplified positive resist composition comprising a base resin and a photoacid generator, the acid labile group is a group to be deprotected with the acid generated by the photoacid generator. It may be any of well-known acid labile groups commonly used in prior art resist compositions, especially chemically amplified resist compositions. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

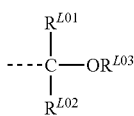 (L1)

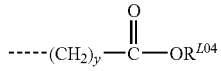 (L2)

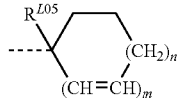 (L3)

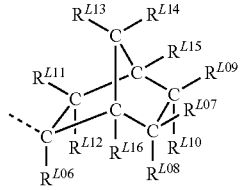 (L4)

Herein, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

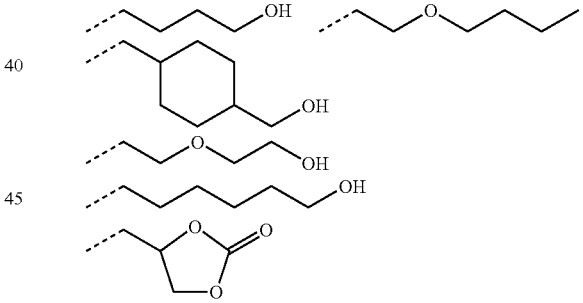

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 2-(tricyclo[5.2.1.0$^{2,6}$]decan-8-yl)propan-2-yl, 2-(tetracyclo[4.4.0.1$^{2,5}$.1$^{7,10}$]dodecan-3-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2- adamantyl, 2-ethyl-2-adamantyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is an optionally substituted, straight, branched or cyclic $C_1$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

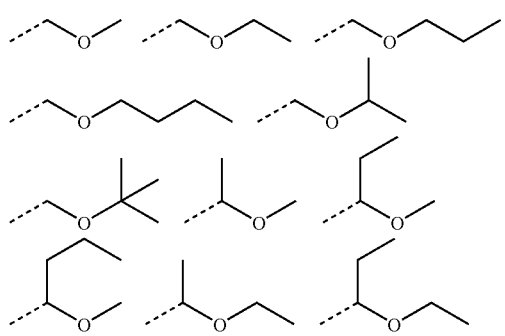

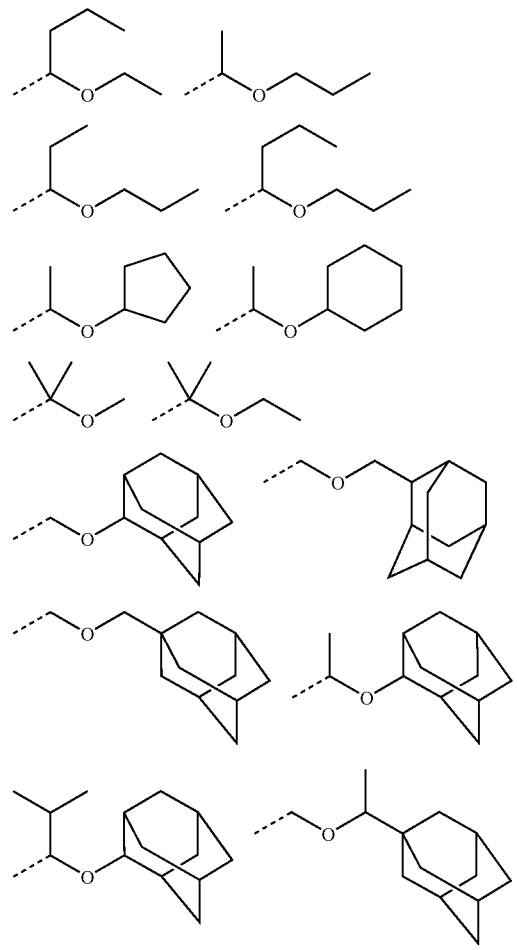

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxybutyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 1-methyl-2-cyclopentenyl, 1-ethyl-2-cyclopentenyl, 1-methyl-2-cyclohexenyl, and 1-ethyl-2-cyclohexenyl groups.

Of the acid labile groups of formula (L4), those groups of the following formulae (L4-1) to (L4-4) are preferred.

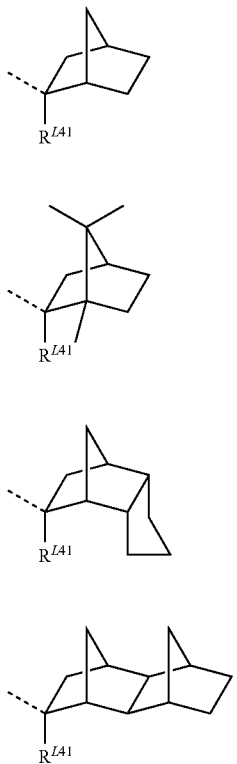

(L4-1)

(L4-2)

(L4-3)

(L4-4)

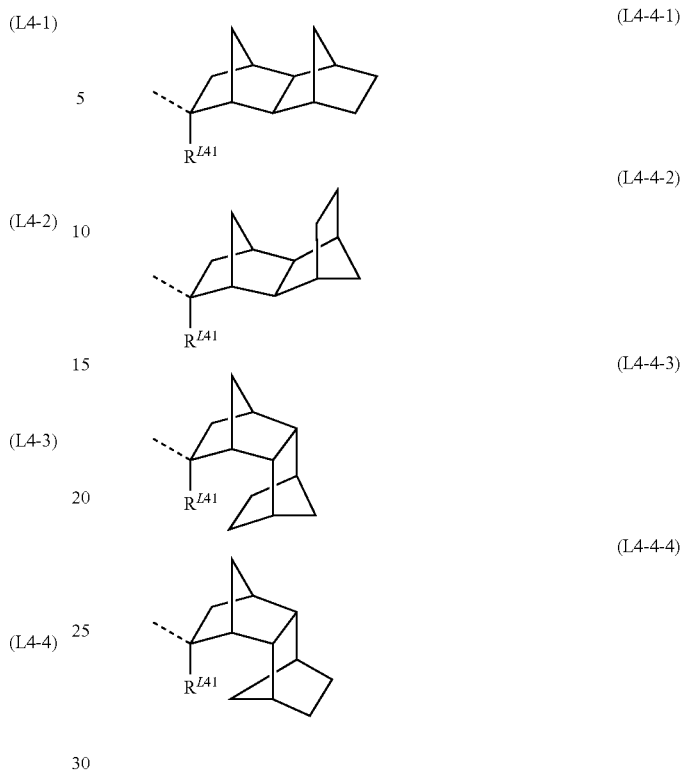

(L4-4-1)

(L4-4-2)

(L4-4-3)

(L4-4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo [2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

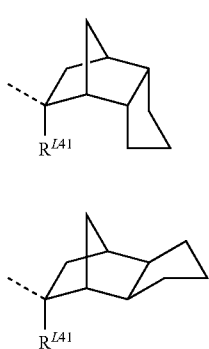

(L4-3-1)

L4-3-2)

Similarly, the general formula (L4-4) represents one or a mixture of two or more selected from groups having the following general formulas (L4-4-1) to (L4-4-4).

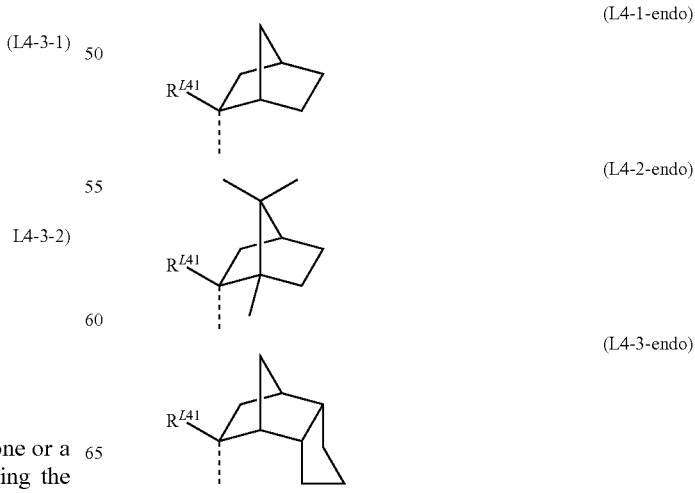

(L4-1-endo)

(L4-2-endo)

(L4-3-endo)

(L4-4-endo)

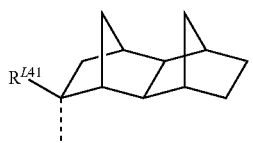

Illustrative examples of the acid labile group of formula (L4) are given below.

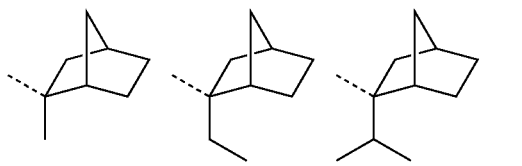

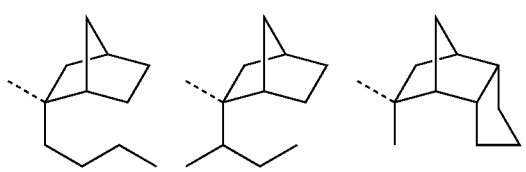

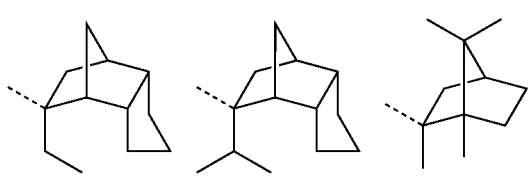

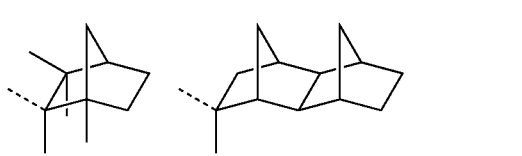

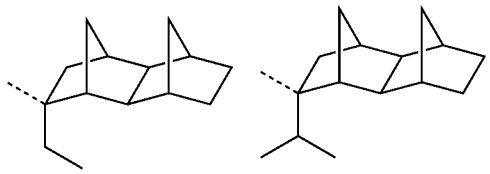

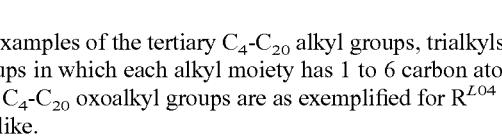

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{LO4}$ and the like.

In formula (3), $R^3$ is a group of lactone structure, preferably a group containing a 5- or 6-membered lactone ring structure, examples of which are illustrated below, but not limited thereto.

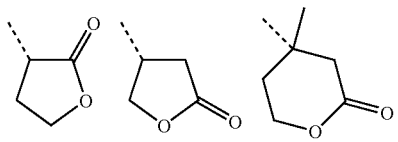

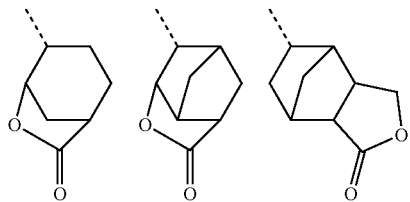

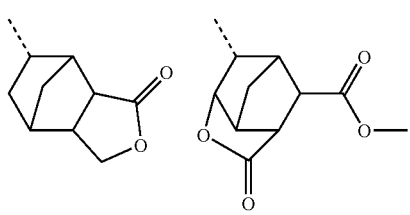

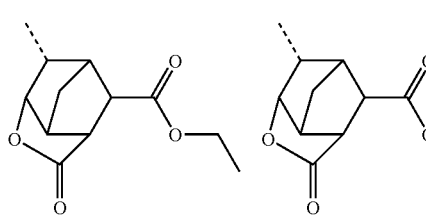

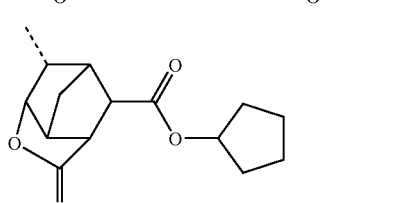

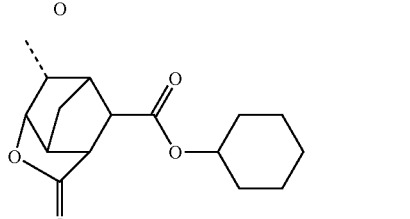

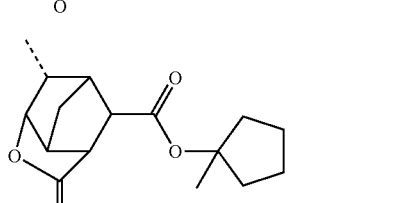

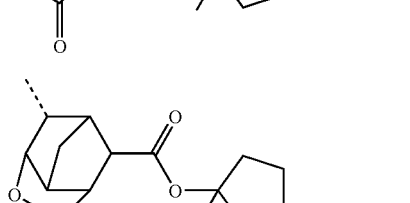

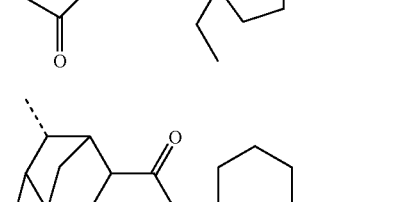

-continued

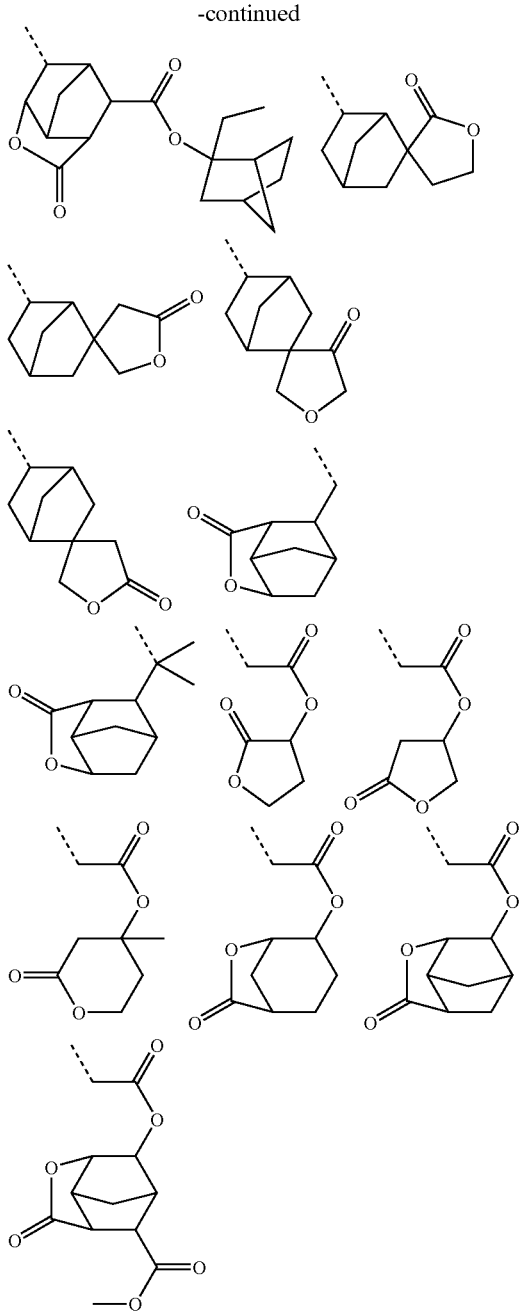

The subscripts a, b and c indicative of a ratio of the respective recurring units incorporated in the resin are numbers from 0.01 to less than 1, and $0.3 \leq a+b+c \leq 1$. The preferred range of each incorporation ratio is given below.

| Preferred range | More preferred range |
|---|---|
| $0.01 \leq a \leq 0.5$ | $0.01 \leq a \leq 0.4$ |
| $0.05 \leq b \leq 0.6$ | $0.1 \leq b \leq 0.5$ |
| $0.01 \leq c \leq 0.7$ | $0.05 \leq c \leq 0.6$ |

Notably, the meaning of $0.3 \leq a+b+c \leq 1$ is that in a polymer comprising recurring units (a), (b) and (c), the sum of recurring units (a), (b) and (c) is 30 to 100 mol % based on the total amount of entire recurring units.

While the polymer comprises recurring units of formula (1) at a ratio "a" and optionally recurring units at ratios "b" and "c", it may further have additional recurring units incorporated therein.

In a preferred embodiment, the resin in the first chemically amplified positive resist composition may further comprise recurring units having a 7-oxanorbornane ring structure represented by the general formula (4), (5) or (6). These recurring units are incorporated in the resin for the purpose of making up crosslinking reaction for achieving insolubilization in both organic solvent and alkaline developer.

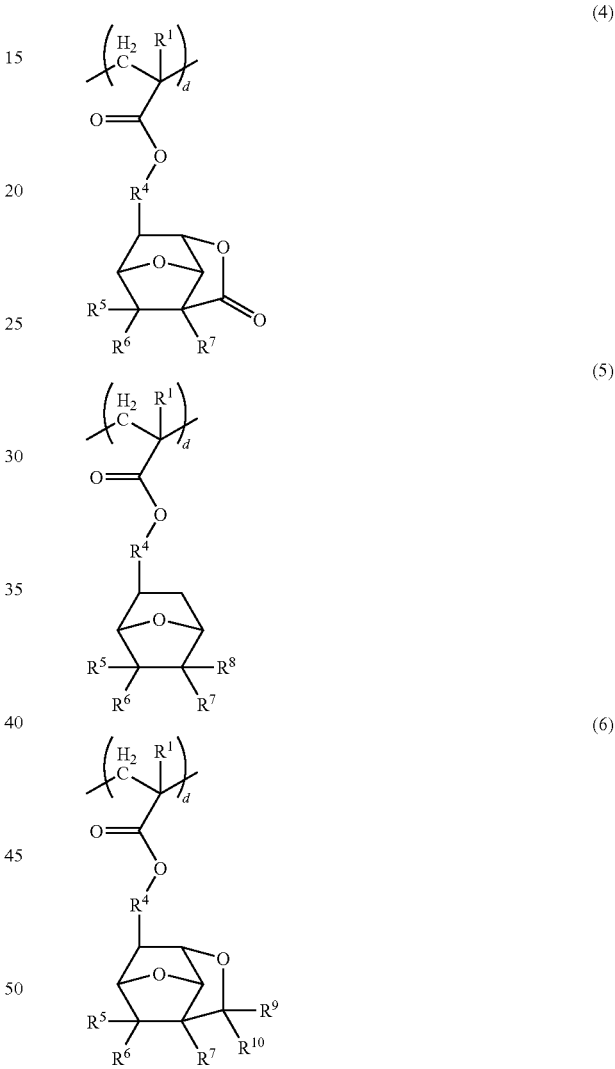

Herein $R^1$ is each independently hydrogen, methyl or trifluoromethyl. $R^4$ is a single bond, or a straight, branched or cyclic $C_1$-$C_6$ alkylene group which may have an ether or ester group and which has a primary or secondary carbon atom through which it is linked to the ester moiety in the formula. $R^5$, $R^6$, $R^7$, and $R^8$ are each independently hydrogen or a straight, branched or cyclic $C_1$-$C_6$ alkyl group. $R^9$ and $R^{10}$ are each independently hydrogen, a straight, branched or cyclic $C_1$-$C_6$ alkyl group or —$CO_2R^{11}$, or may bond together to form a cyclic alkyl group with the carbon atom to which they are attached, wherein $R^{11}$ is hydrogen or a straight, branched or cyclic $C_1$-$C_6$ alkyl group. The subscript d is a number in the range: $0 \leq d \leq 0.5$ and $0.3 \leq a+b+c+d \leq 1$.

Examples of the $C_1$-$C_6$ alkylene group include methylene, ethylene, n-propylene, isopropylene, n-butylene, isobutylene, sec-butylene, n-pentylene, isopentylene, cyclopentylene, n-hexylene, and cyclohexylene.

Examples of the $C_1$-$C_6$ alkyl group include methyl, ethyl, n-propyl, isopropyl, n-butyl, isobutyl, sec-butyl, n-pentyl, isopentyl, cyclopentyl, n-hexyl, and cyclohexyl.

Examples of the recurring units having a 7-oxanorbornane ring structure represented by formulae (4), (5) and (6) are shown below, but not limited thereto.

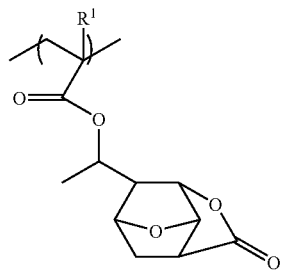
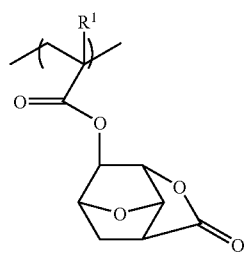
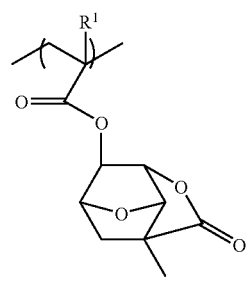
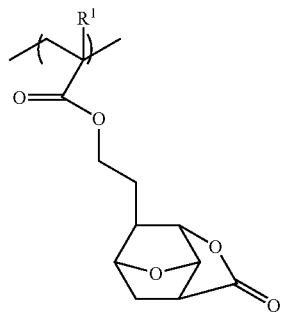
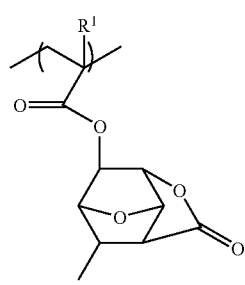
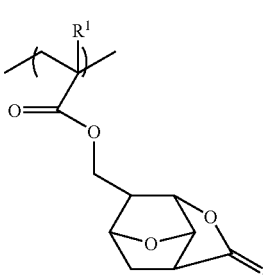
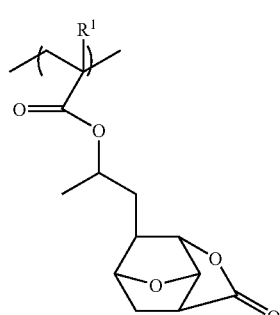
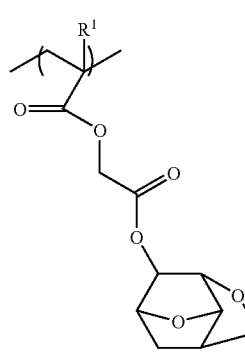
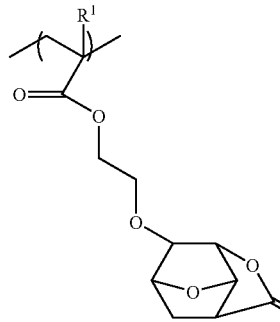
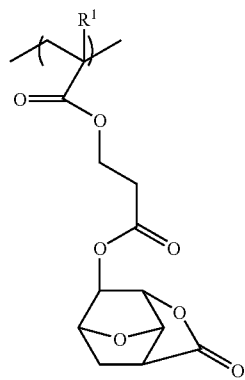
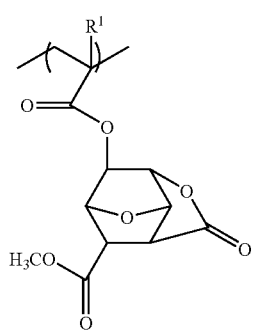

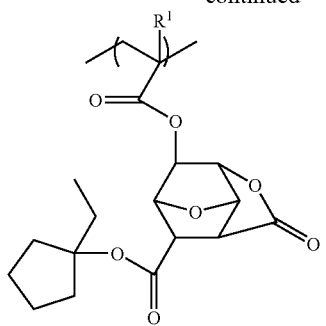
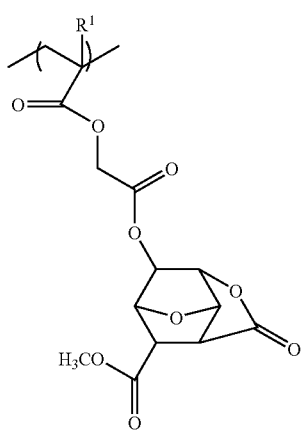
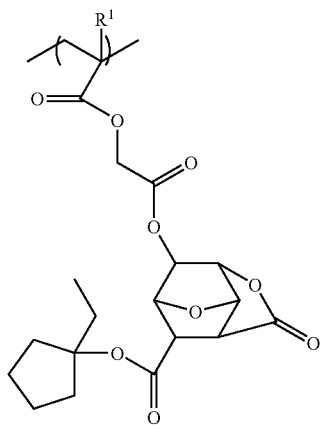
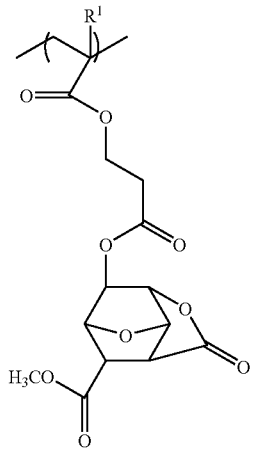
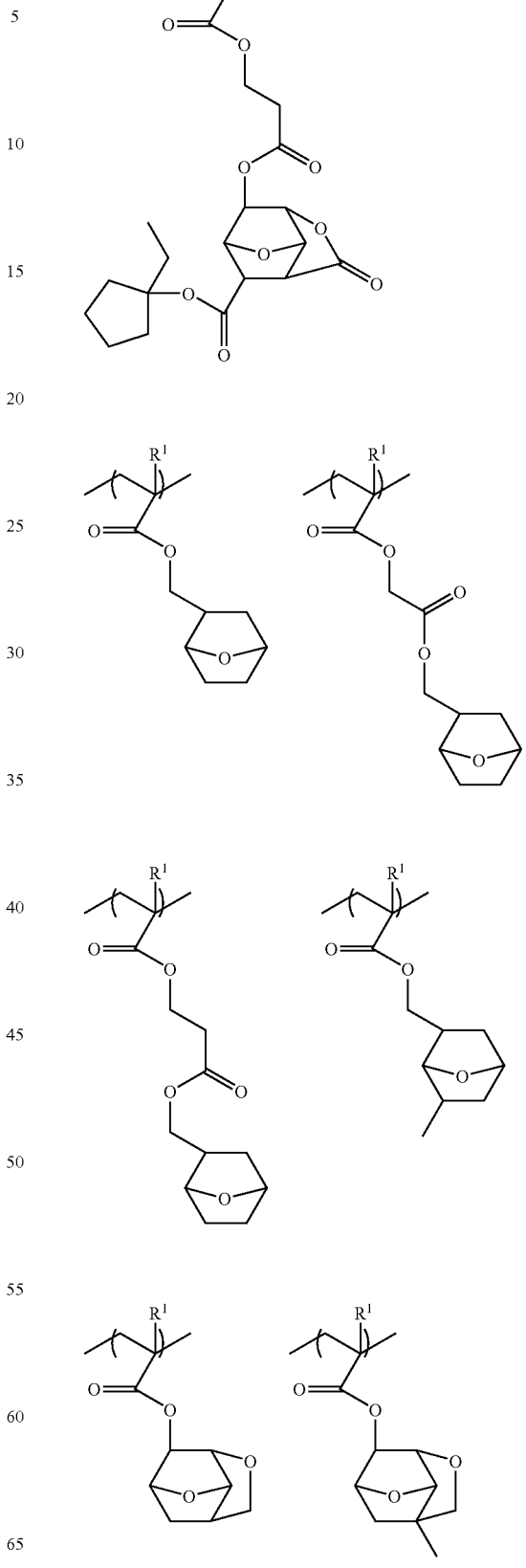

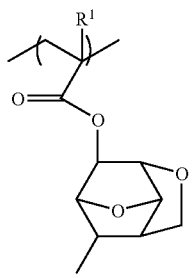 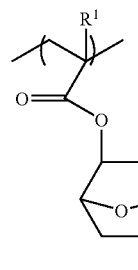 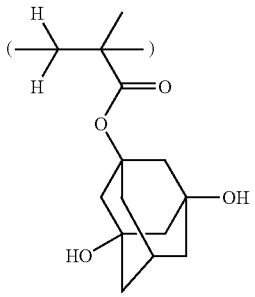 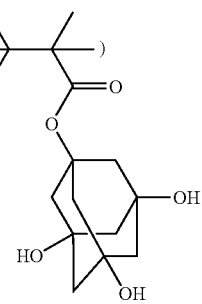
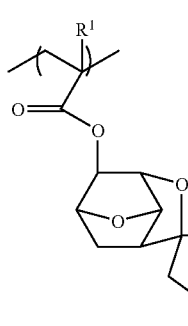 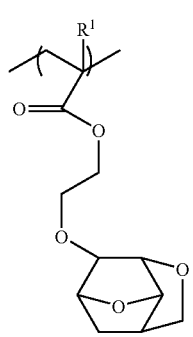
Herein R¹ is each independently hydrogen, methyl or trifluoromethyl.
In the polymer comprising recurring units of formula (1), other recurring units as shown below may be incorporated in a proportion of 0 to 50 mol % based on the entire recurring units, in addition to the recurring units incorporated at ratios a, b, c and d.
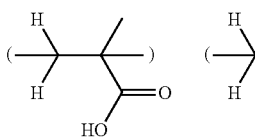 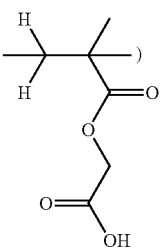
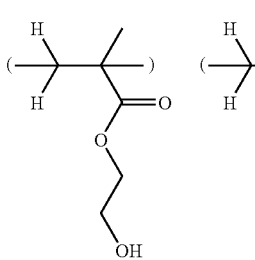 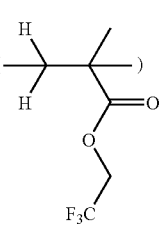
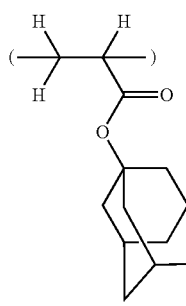 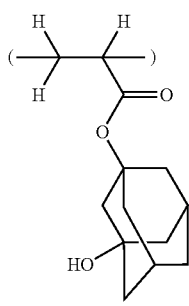
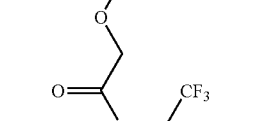 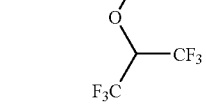
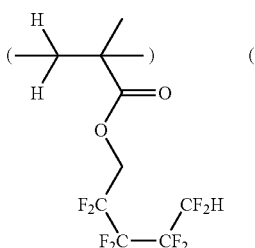 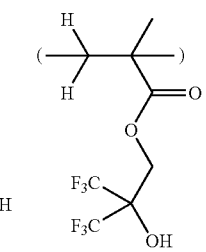
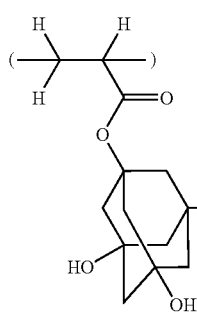 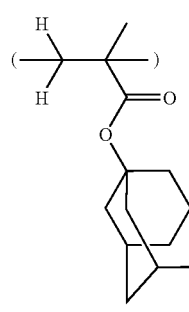
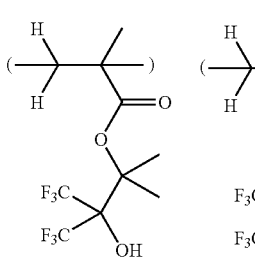 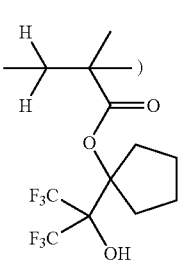

-continued
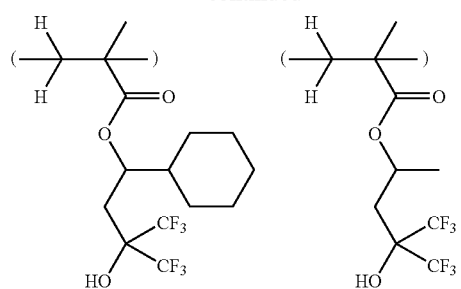
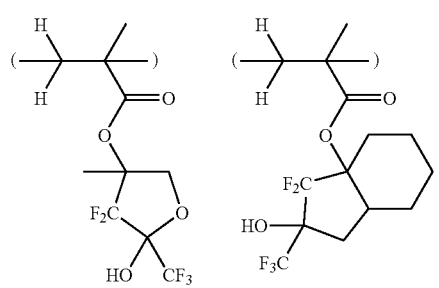
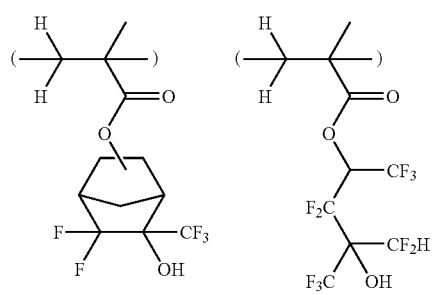
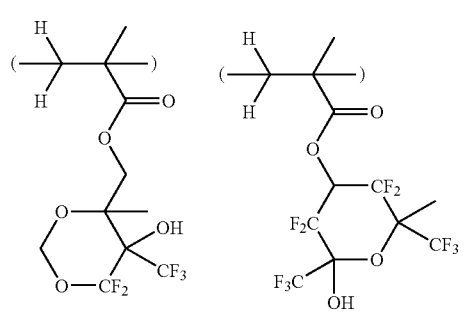
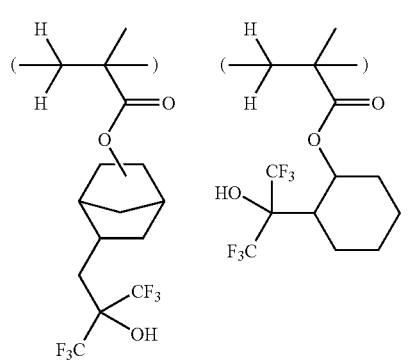
-continued
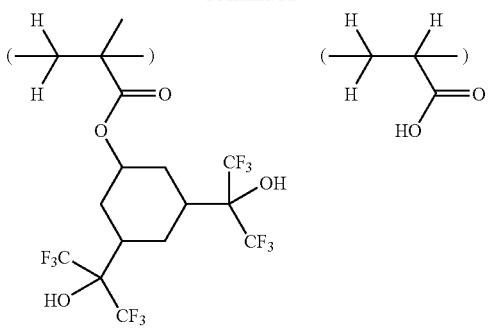
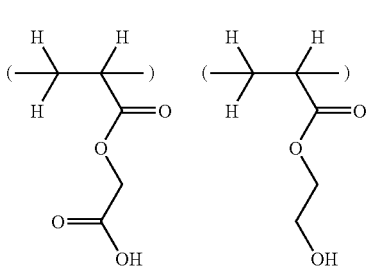
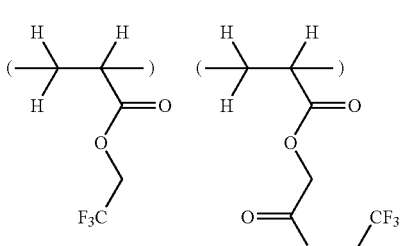
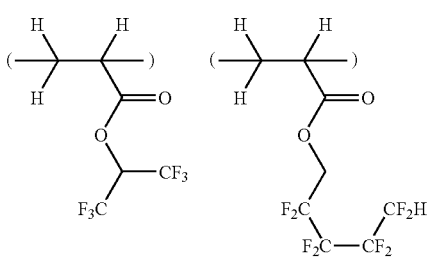
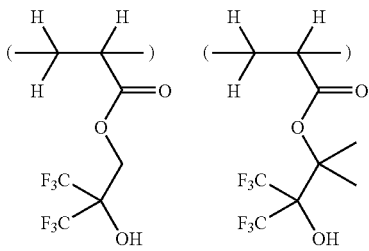
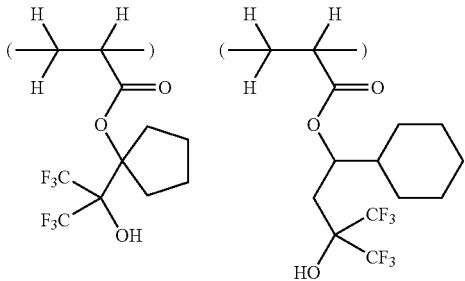

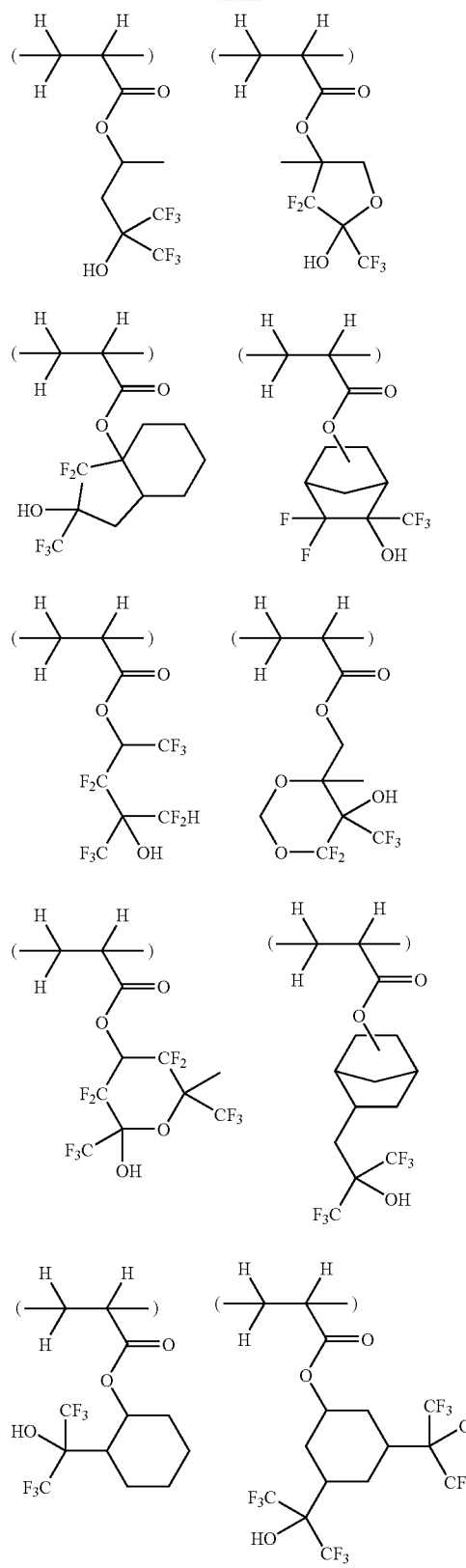
Illustrative, non-limiting examples of the resin which can be used in the first chemically amplified positive resist composition are given below.

35
-continued
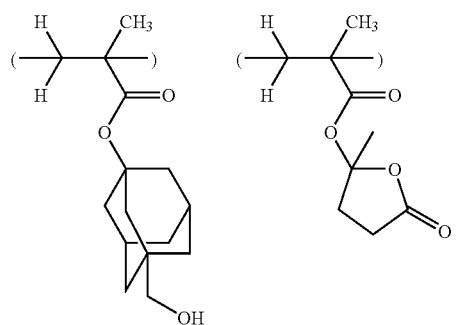
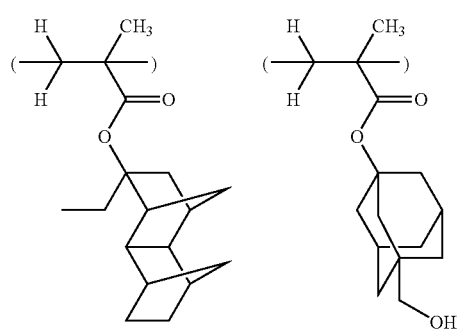
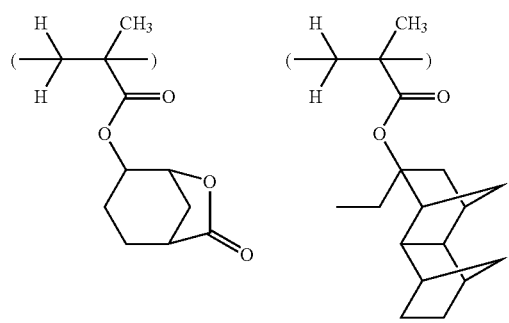
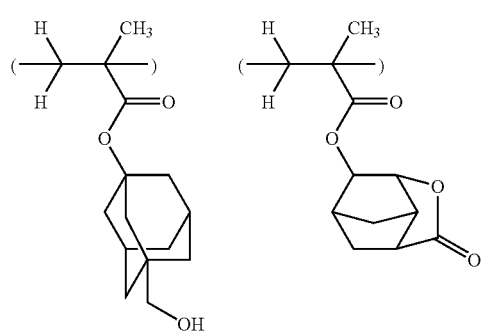
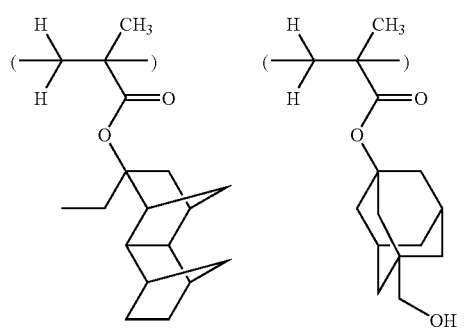
36
-continued
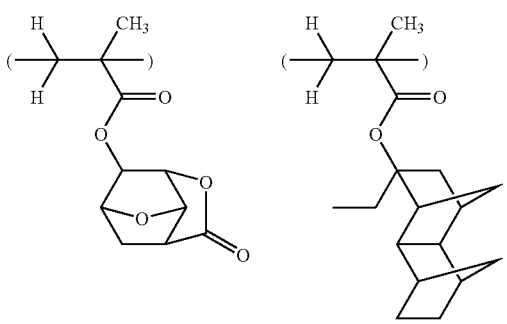
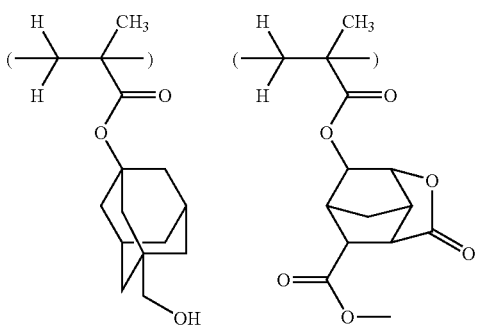
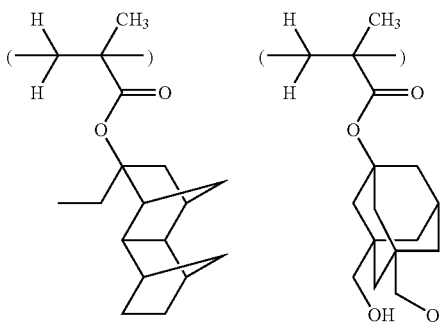
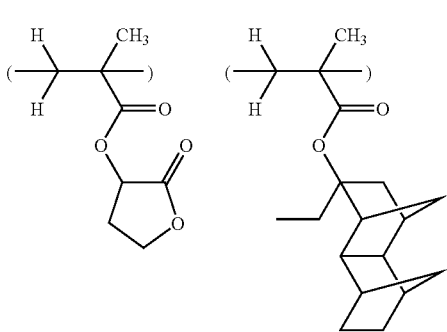
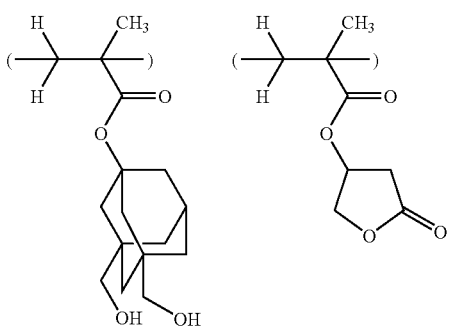

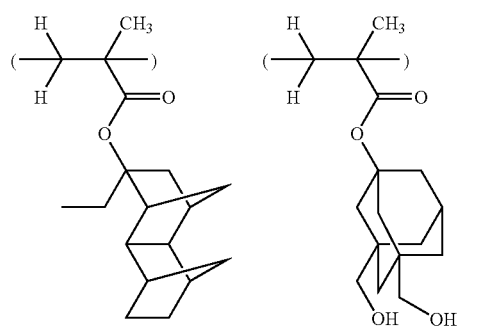
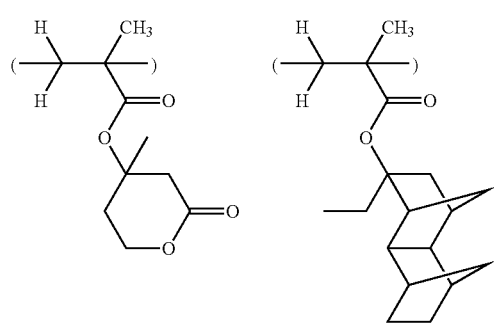
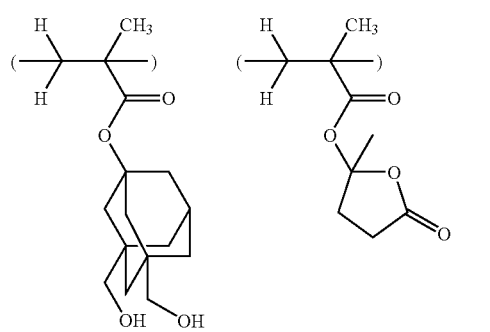
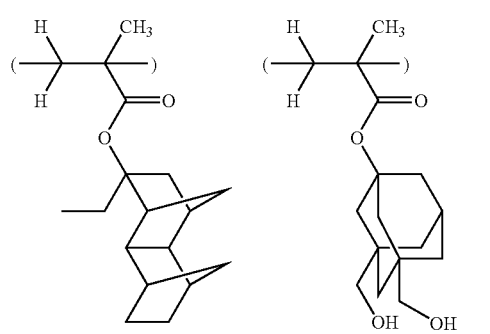
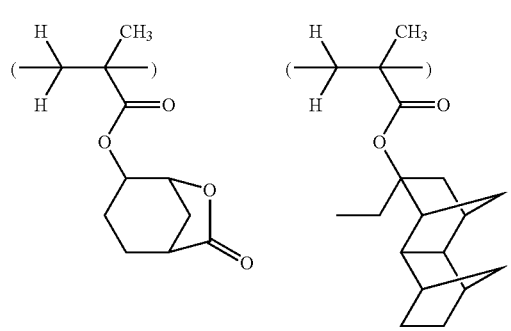
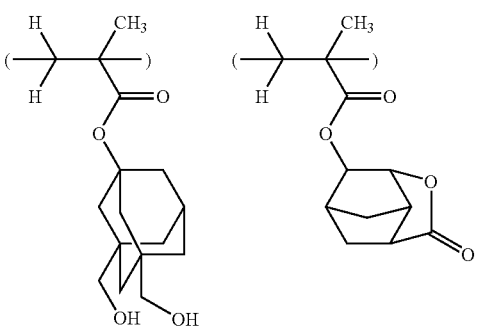
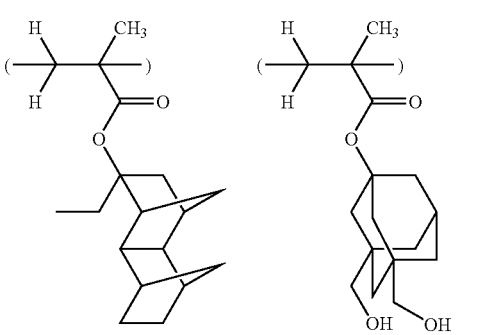
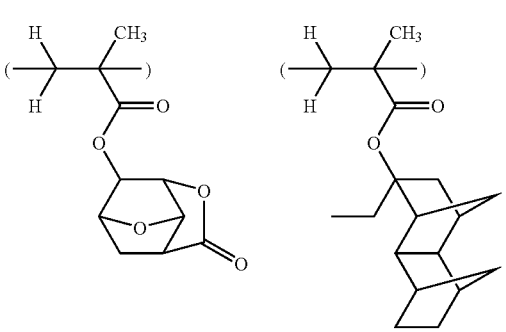
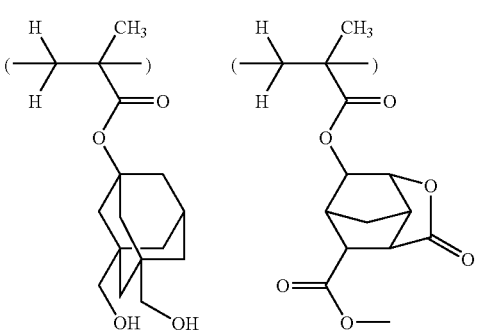
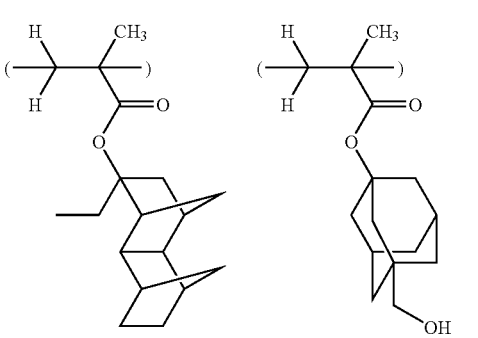

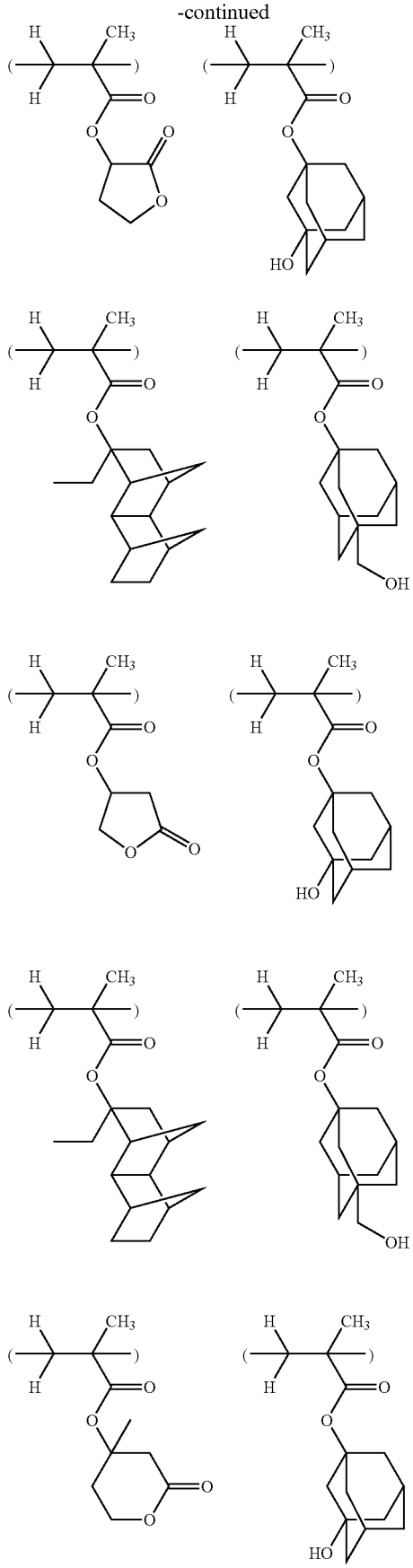

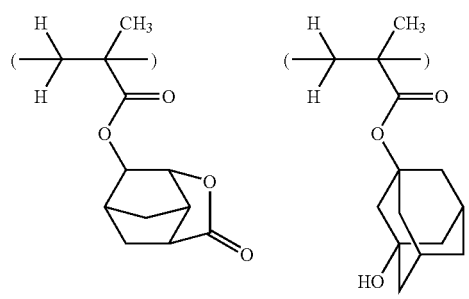
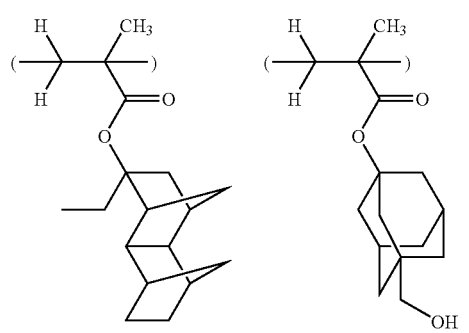
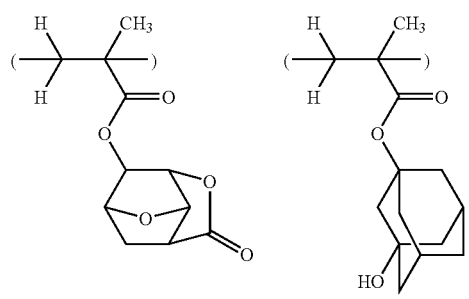
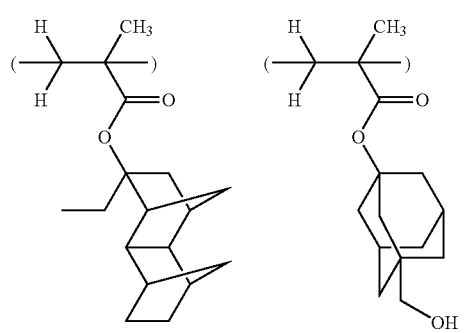
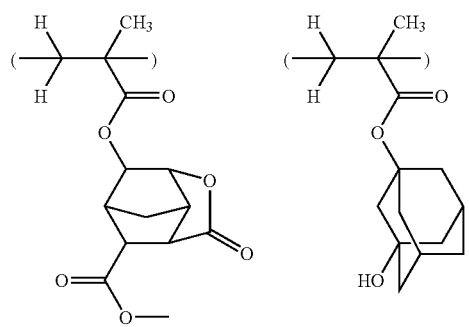
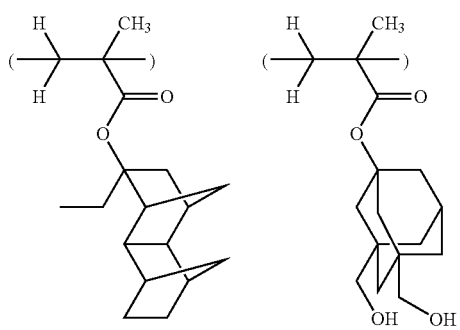
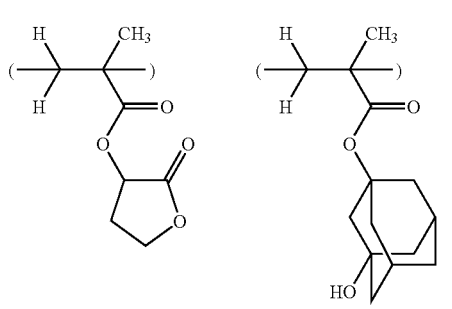
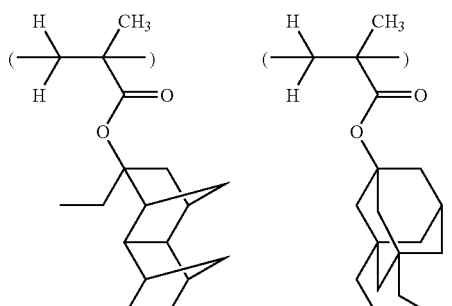
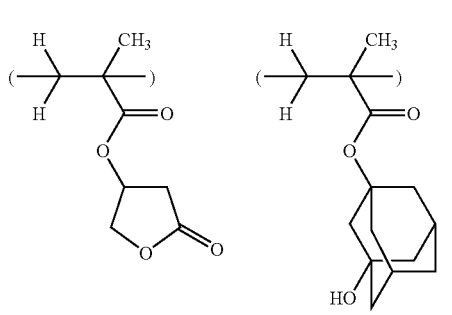
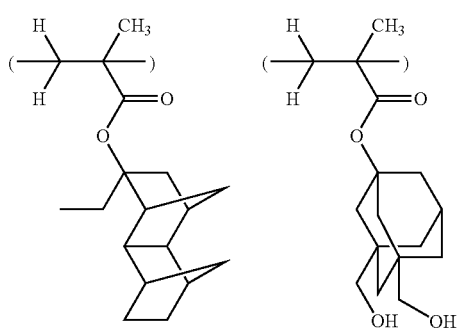

-continued
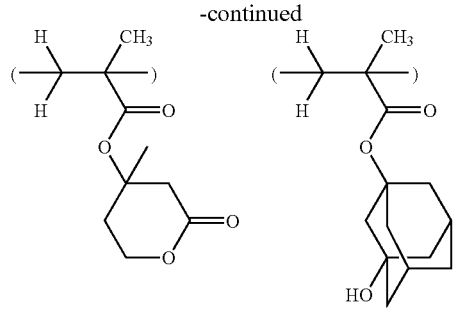
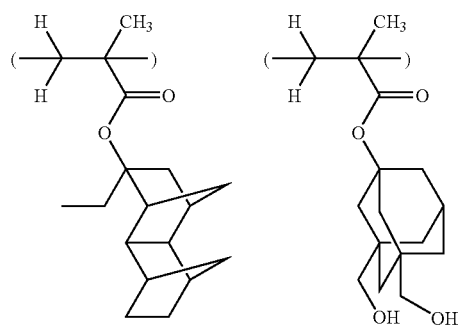
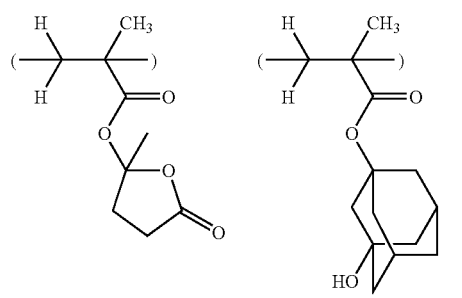
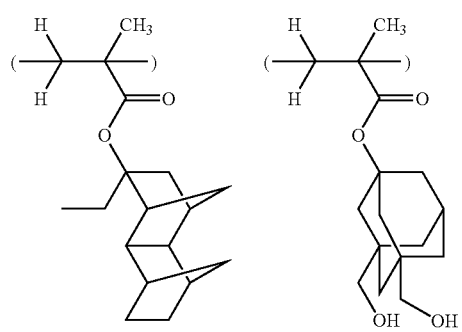
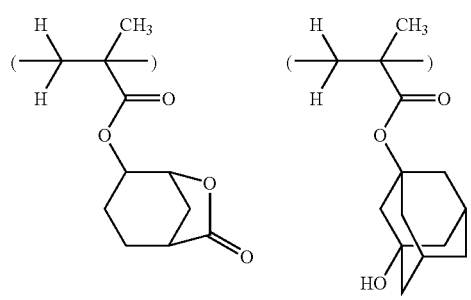
-continued
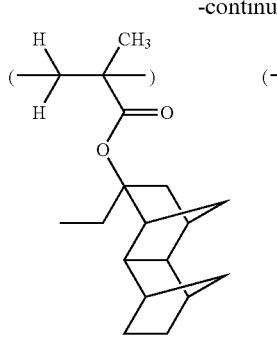
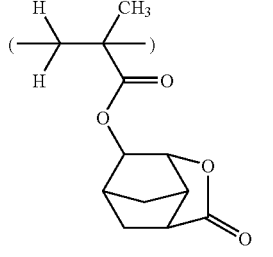
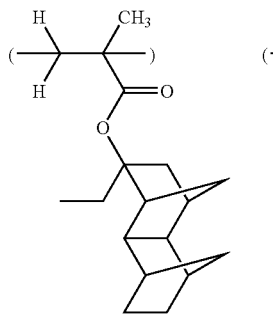
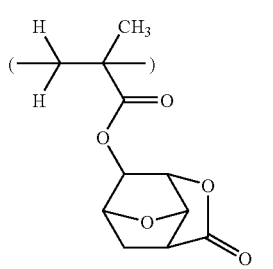
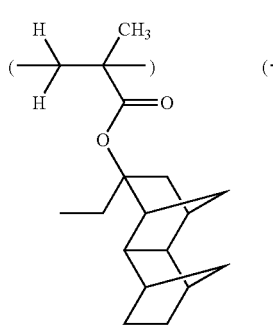

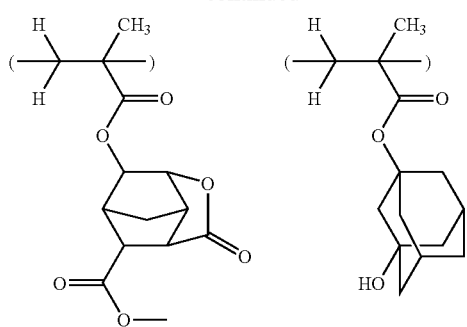
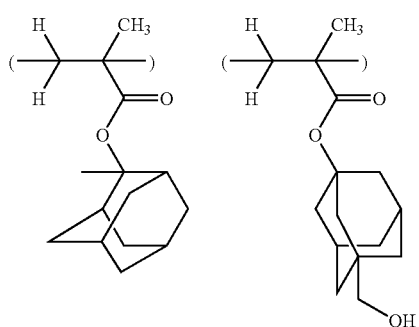
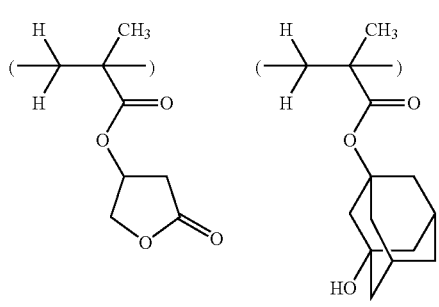
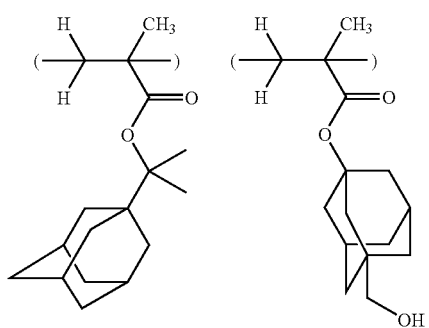
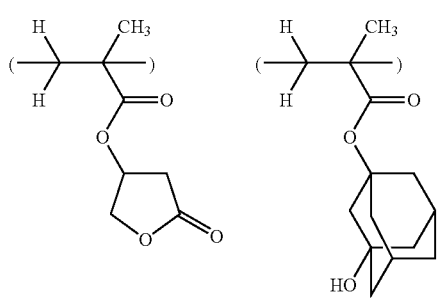
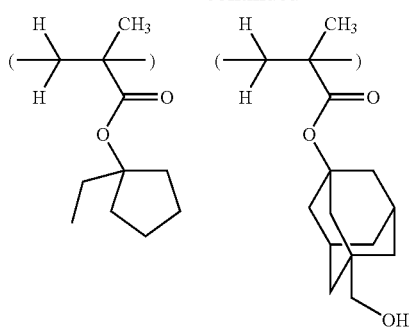
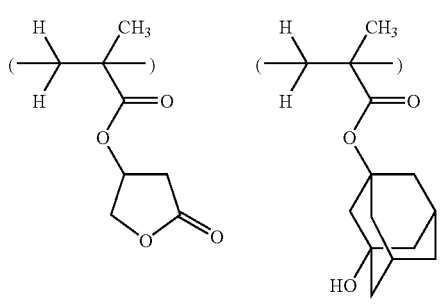
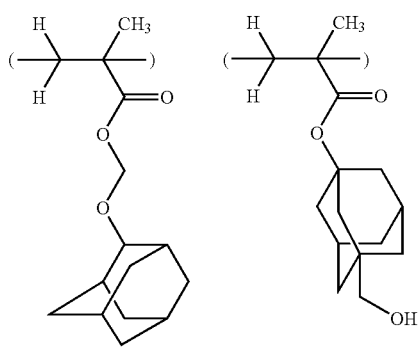
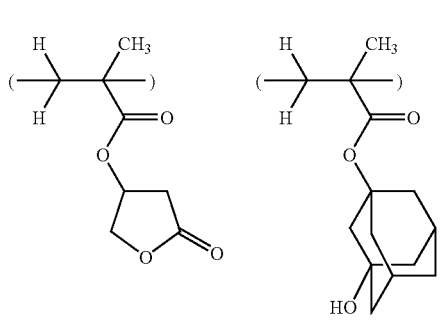
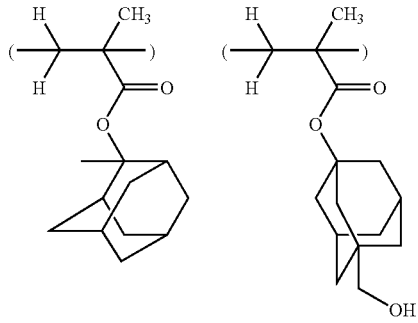

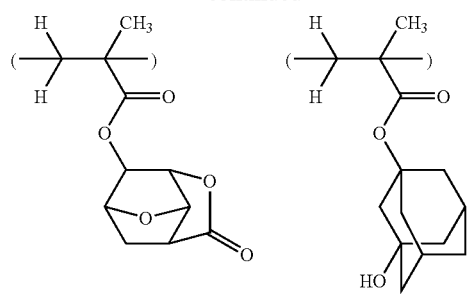
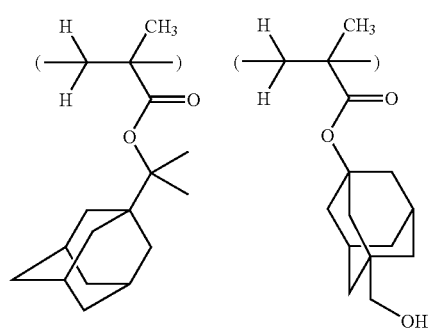
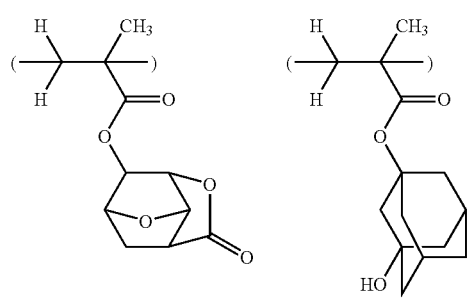
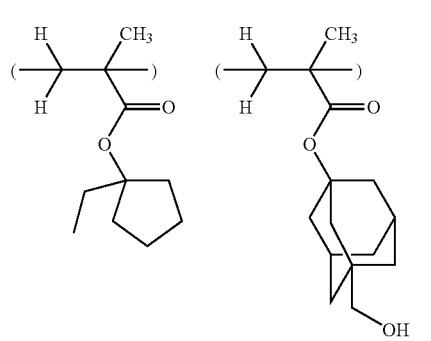
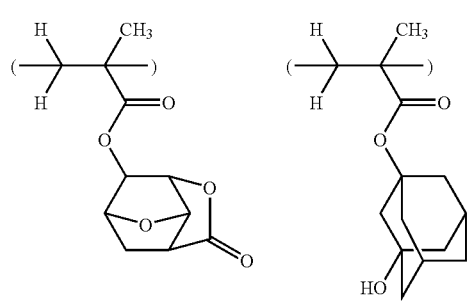
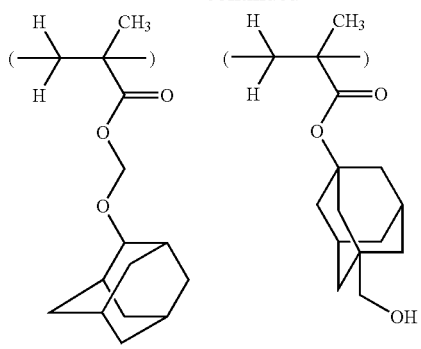
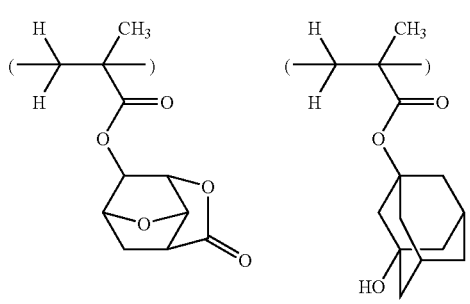
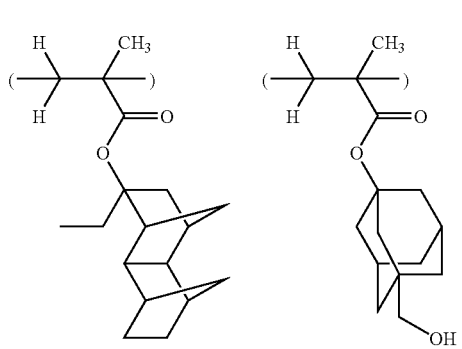
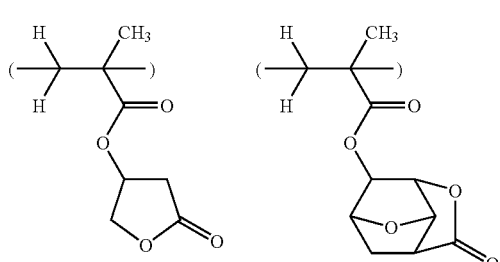
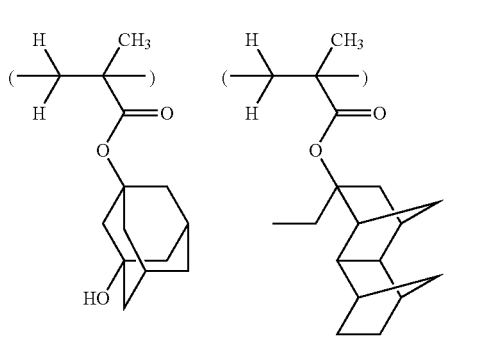

-continued
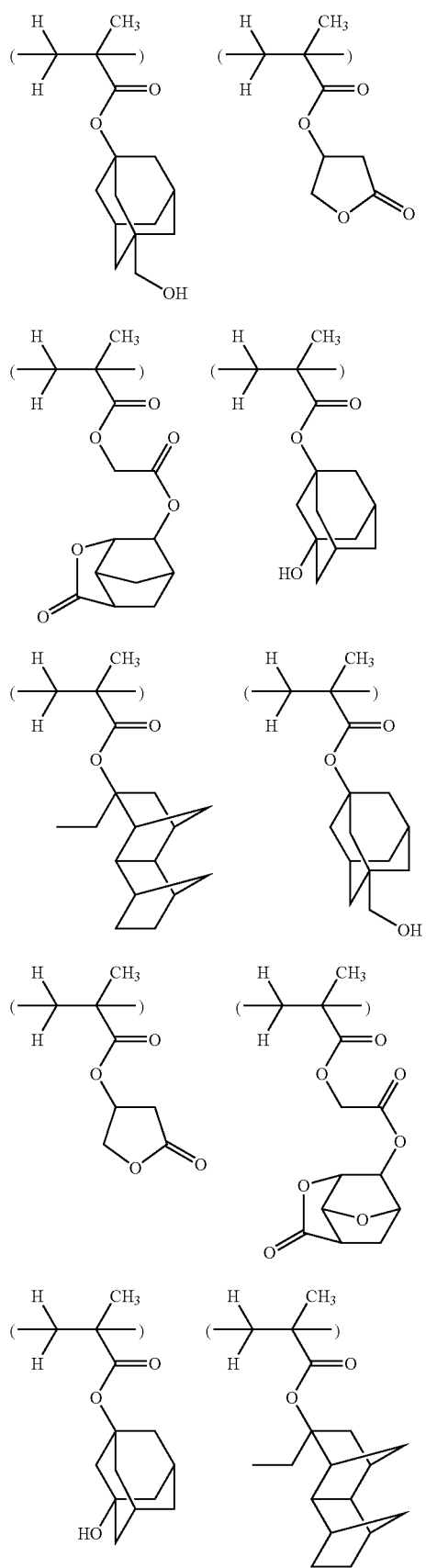
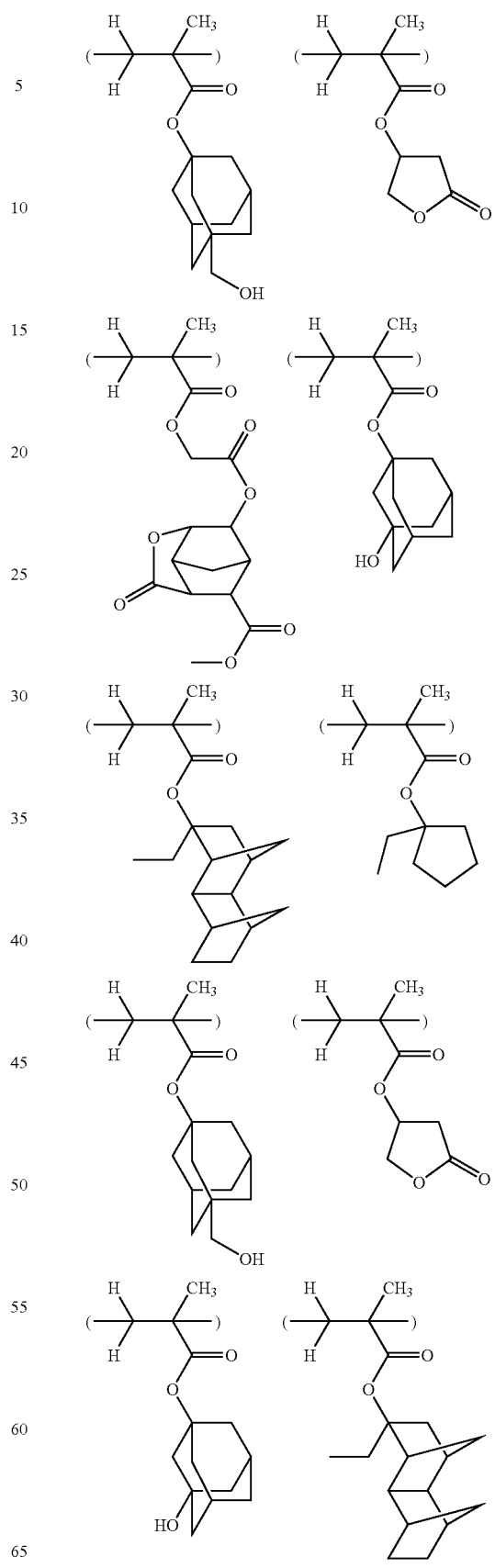

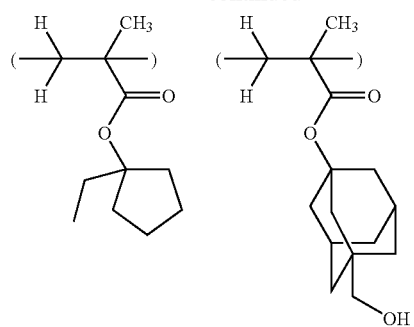
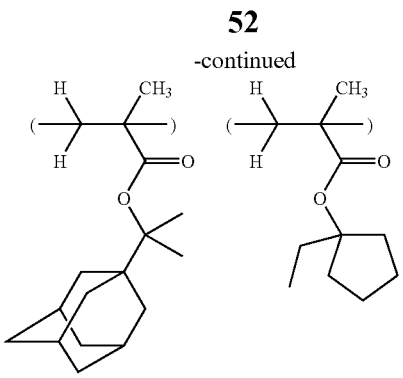
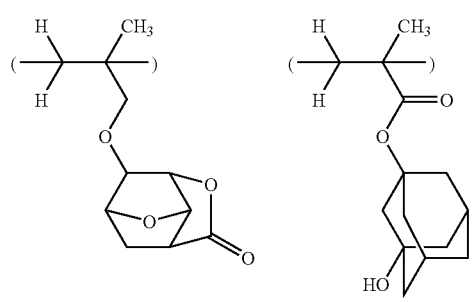
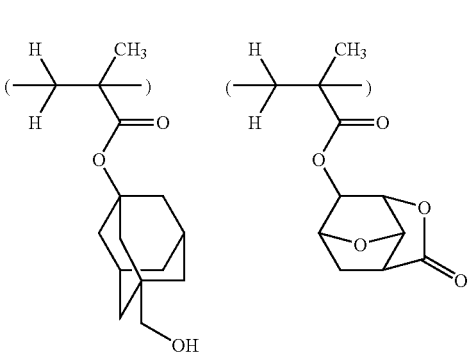
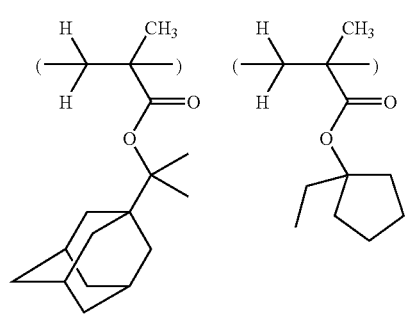
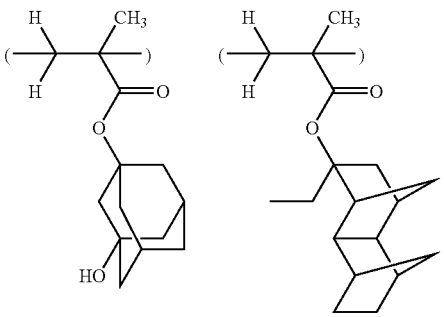
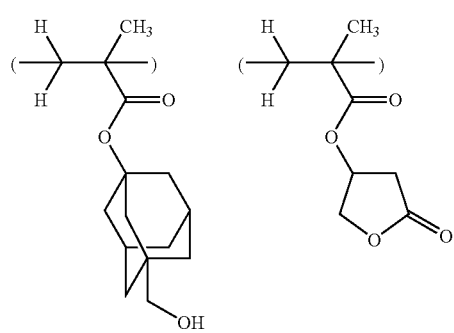
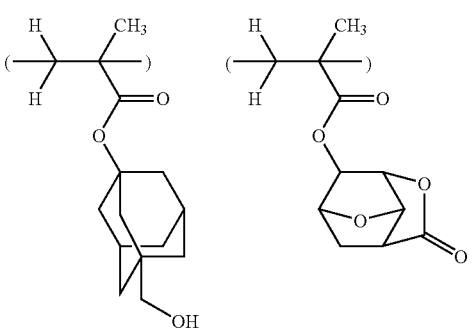
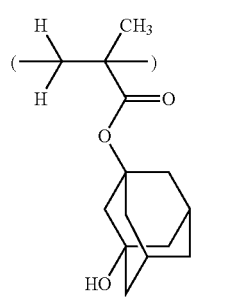
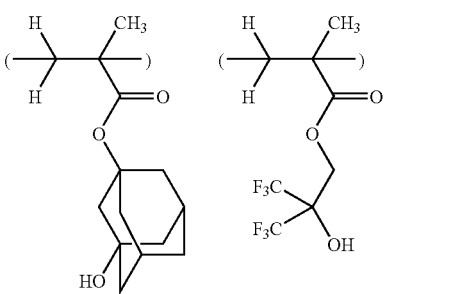

-continued

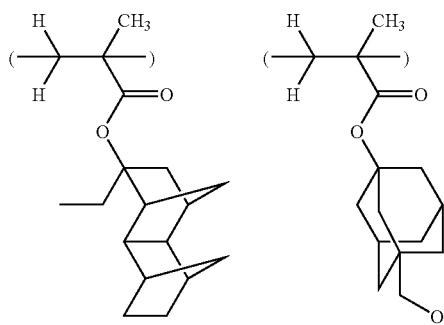
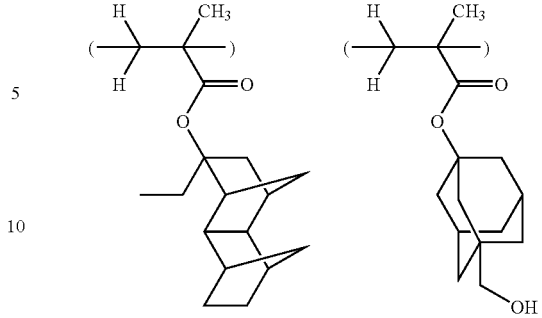
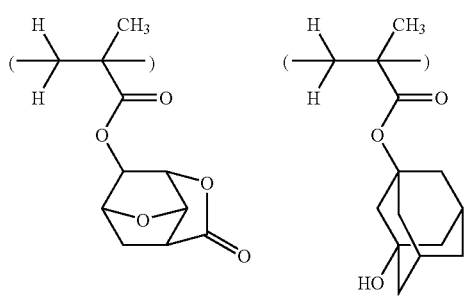
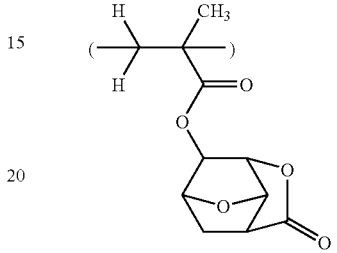
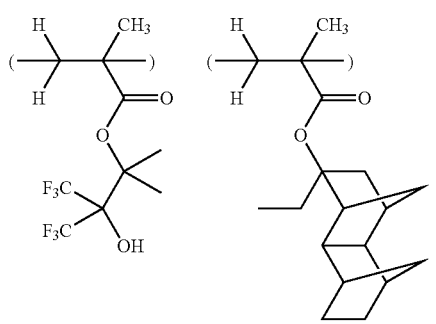
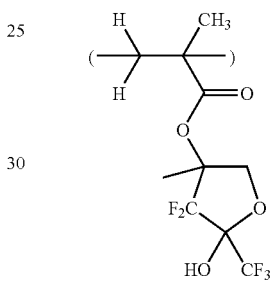
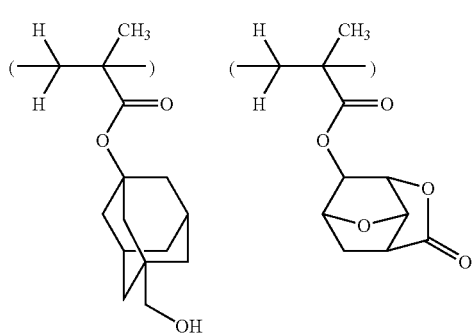
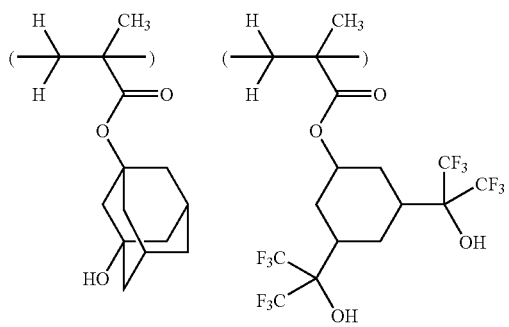

The polymer as the base resin should preferably have a weight average molecular weight (Mw) in the range of 1,000 to 500,000, and more preferably 2,000 to 30,000, as measured by gel permeation chromatography (GPC) using polystyrene standards.

The polymer as the base resin may be obtained through copolymerization of (meth)acrylate derivative monomers corresponding to the respective recurring units by any well-known technique such as radical polymerization. It is noted that the polymers used in Examples to be described later were synthesized from preselected (meth)acrylate derivative monomers by a standard radical polymerization technique.

First Resist Composition

In addition to the polymer or base resin described above, the chemically amplified positive resist composition used in the pattern forming process of the invention may further comprise an organic solvent, a compound capable of generating an acid in response to high-energy radiation (known as "acid generator"), and optionally, a dissolution inhibitor, a basic compound, a surfactant, and other components.

Solvent

The organic solvent used herein may be any organic solvent in which the base resin, acid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, diethylene glycol dimethyl ether, 1-ethoxy-2-propanol and PGMEA, and mixtures thereof are preferred because the acid generator is most soluble therein.

The organic solvent is preferably used in an amount of 200 to 3,000 parts by weight, more preferably 400 to 2,000 parts by weight per 100 parts by weight of the base resin.

Acid Generator

The acid generators used herein include the following:
(i) onium salts of the formula (P1a-1), (P1a-2), (P1a-3) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.
(i) Onium Salts of Formula (P1a-1), (P1a-2) and (P1a-3):

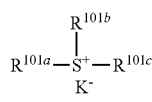
(P1a-1)

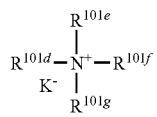
(P1a-2)

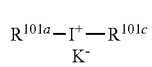
(P1a-3)

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all hydrogen atoms may be replaced by alkoxy groups. Also, $R^{101b}$ and $R^{101c}$, taken together, may form a ring with the sulfur or iodine atom to which they are attached. $R^{101b}$ and $R^{101c}$ each are alkylene groups of 1 to 6 carbon atoms when they form a ring. $K^-$ is a sulfonate in which at least one alpha-position is fluorinated, or a perfluoroalkylimidate or perfluoroalkylmethidate. $R^{101d}$, $R^{101e}$, $R^{101f}$, and $R^{101g}$ stand for hydrogen atoms, straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all hydrogen atoms may be replaced by alkoxy groups. A pair of $R^{101d}$ and $R^{101e}$ or a combination of $R^{101d}$, $R^{101e}$ and $R^{101f}$ may form a ring with the nitrogen atom to which they are attached, and $R^{101d}$ and $R^{101e}$ or $R^{101d}$, $R^{101e}$ and $R^{101f}$, taken together, denote an alkylene group of 3 to 10 carbon atoms or a hetero-aromatic ring having the nitrogen atom (in the formula) incorporated therein, when they form a ring.

Of the onium salts having formulae (P1a-1), (P1a-2) and (P1a-3), those of formula (P1a-1) function as a photoacid generator, those of formula (P1a-2) function as a thermal acid generator, and those of formula (P1a-3) have both the functions of a photoacid generator and a thermal acid generator. In a system having (P1a-1) combined with (P1a-2), generator (P1-a) generates an acid upon exposure, with which pattern formation is performed, and generator (P1a-2) generates an acid when heated at high temperature after development, with which crosslinking is efficiently performed.

Examples of $K^-$ include perfluoroalkanesulfonates such as triflate and nonaflate; imidates such as bis(trifluoromethylsulfonyl)imide, bis(perfluoroethylsulfonyl)imide, and bis(perfluorobutylsulfonyl)imide; methidates such as tris(trifluoromethylsulfonyl)methide and tris(perfluoroethylsulfonyl)methide; sulfonates having fluorine substituted at α-position as represented by of the general formula (K-1) and sulfonates having fluorine substituted at α-position as represented by of the general formula (K-2).

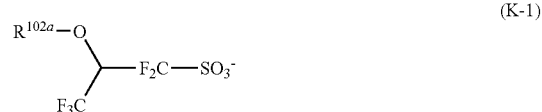
(K-1)

(K-2)

In formula (K-1), $R^{102a}$ is hydrogen, or a straight, branched or cyclic $C_1$-$C_{20}$ alkyl or acyl group, $C_2$-$C_{20}$ alkenyl group, or $C_6$-$C_{20}$ aryl or aryloxy group, which may have an ether group, ester group, carbonyl group or lactone ring, or in which some or all hydrogen atoms may be substituted by fluorine atoms.

In formula (K-2), $R^{102b}$ is hydrogen, or a straight, branched or cyclic $C_1$-$C_{20}$ alkyl group, $C_2$-$C_{20}$ alkenyl group, or $C_6$-$C_{20}$ aryl group.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary oxoalkenyl groups include 2-oxo-4-cyclohexenyl and 2-oxo-4-propenyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, 1,2,3,4,5-pentafluorobenzenesulfonate; and alkylsulfonate ions such as mesylate and butanesulfonate.

(P1b)

Herein, $R^{102a}$ and $R^{102b}$ independently represent straight, branched or cyclic $C_1$-$C_8$ alkyl groups. $R^{103}$ represents a straight, branched or cyclic $C_1$-$C_{10}$ alkylene group. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane Derivatives of Formula (P2)

(P2)

Herein, $R^{105}$ and $R^{106}$ independently represent straight, branched or cyclic $C_1$-$C_{12}$ alkyl or haloalkyl groups, $C_6$-$C_{20}$ aryl or haloaryl groups, or $C_7$-$C_{12}$ aralkyl groups.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary haloalkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary haloaryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

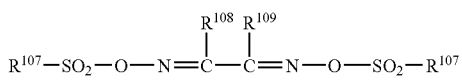
(P3)

Herein, $R^{107}$, $R^{108}$, and $R^{109}$ independently represent straight, branched or cyclic $C_1$-$C_{12}$ alkyl or haloalkyl groups, $C_6$-$C_{20}$ aryl or haloaryl groups, or $C_7$-$C_{12}$ aralkyl groups.

Also, $R^{108}$ and $R^{109}$, taken together, may form a cyclic structure. $R^{108}$ and $R^{109}$ each are a straight or branched alkylene group of 1 to 6 carbon atoms when they form a cyclic structure.

Illustrative examples of the alkyl, haloalkyl, aryl, haloaryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

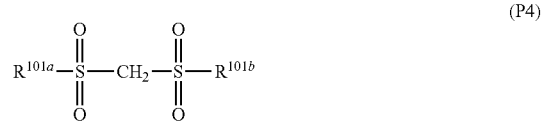
(P4)

Herein, $R^{101a}$ and $R^{101b}$ are as defined above.

(v) Sulfonic Acid Esters of N-hydroxyimide Compounds of Formula (P5)

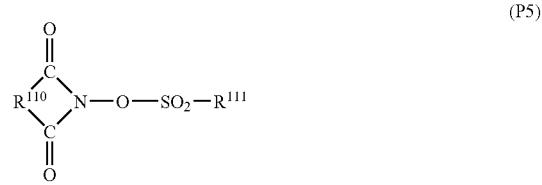
(P5)

Herein, $R^{110}$ is a $C_6$-$C_{10}$ arylene group, $C_1$-$C_6$ alkylene group, or $C_2$-$C_6$ alkenylene group wherein some or all hydrogen atoms may be replaced by straight or branched $C_1$-$C_4$ alkyl or alkoxy groups, nitro, acetyl, or phenyl groups. $R^{111}$ is a straight, branched or cyclic $C_1$-$C_8$ alkyl group, alkenyl, alkoxyalkyl, phenyl or naphthyl group wherein some or all hydrogen atoms may be replaced by $C_1$-$C_4$ alkyl or alkoxy groups, phenyl groups (which may have substituted thereon a $C_1$-$C_4$ alkyl or alkoxy, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the $C_1$-$C_4$ alkyl groups include methyl, ethyl, propyl, isopropyl, n-butyl, isobutyl and tert-butyl; and the $C_1$-$C_4$ alkoxy groups include methoxy, ethoxy, propoxy, isopropoxy, n-butoxy, isobutoxy, and tert-butoxy. The phenyl groups which may have substituted thereon a $C_1$-$C_4$ alkyl or alkoxy, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the acid generator include:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as
diphenyl disulfone deratives and
dicyclohexyl disulfone derivatives;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate, N-hydroxy-5-norbornene-2,3-dicarboxyimide methanesulfonate,
N-hydroxy-5-norbornene-2,3-dicarboxyimide trifluoromethanesulfonate, and
N-hydroxy-5-norbornene-2,3-dicarboxyimide p-toluenesulfonate.

Preferred among these acid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocylohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

Also useful are acid generators of the oxime type described in WO 2004/074242 A2.

These acid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The acid generator is preferably added in an amount of 0.1 to 50 parts, more preferably 0.5 to 20 parts, and even more preferably 1 to 10 parts by weight, per 100 parts by weight of the base resin. Less than 0.1 phr of the acid generator may generate a less amount of acid upon exposure, sometimes leading to a poor sensitivity and resolution whereas more than 50 phr of the acid generator may adversely affect the transmittance and resolution of resist. While crosslinking reaction to render the first resist pattern insoluble in both organic solvent and alkaline developer is effected by high-temperature heating, the acid generator added to the first resist composition can act as a plasticizer in this step to allow for a thermal flow in the first resist pattern. This imposes a certain limit on the amount of the acid generator added. In this sense, the upper limit of the addition amount is preferably up to 10 parts by weight of the acid generator per 100 parts by weight of the base resin.

Where acid generators (P1a-1) and (P1a-2) are used in combination, they are mixed such that the mixture consists of 1 pbw of (P1a-1) and 0.001 to 1 pbw of (P1a-2) because generator (P1a-2) functions only as a thermal acid generator. Differently stated, the amount of thermal acid generator (P1a-2) added is preferably limited to such a level as to have no impact on the lithography of patterning the first resist film, no impact on the thermal properties of the first resist film, and no impact on the second resist film, and specifically to the range of 0.01 to 1 part by weight per 100 parts by weight of the base resin.

Dissolution Inhibitor

To the positive resist composition, especially chemically amplified positive resist composition, a dissolution inhibitor or regulator may be added. The dissolution inhibitor is a compound having on the molecule at least two phenolic hydroxyl groups, in which an average of from 0 to 100 mol % of all the hydrogen atoms on the phenolic hydroxyl groups are replaced by acid labile groups or a compound having on the molecule at least one carboxyl group, in which an average of 50 to 100 mol % of all the hydrogen atoms on the carboxyl groups are replaced by acid labile groups, both the compounds having a weight average molecular weight within a range of 100 to 1,000, and preferably 150 to 800.

The degree of substitution of the hydrogen atoms on the phenolic hydroxyl groups by acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups by acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

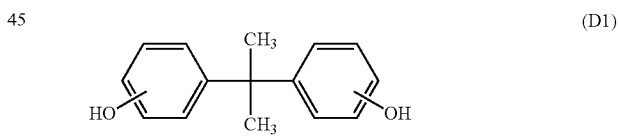

(D1)

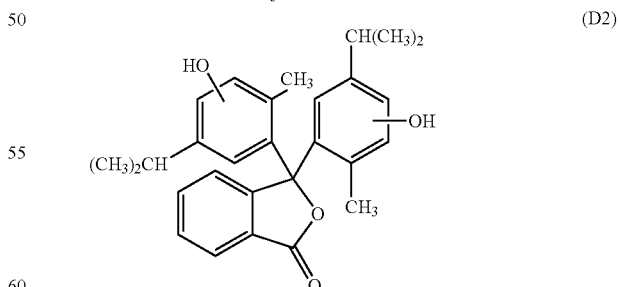

(D2)

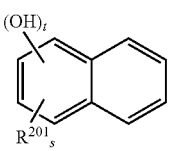
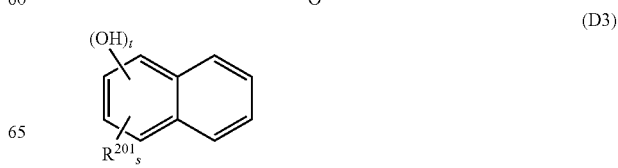

(D3)

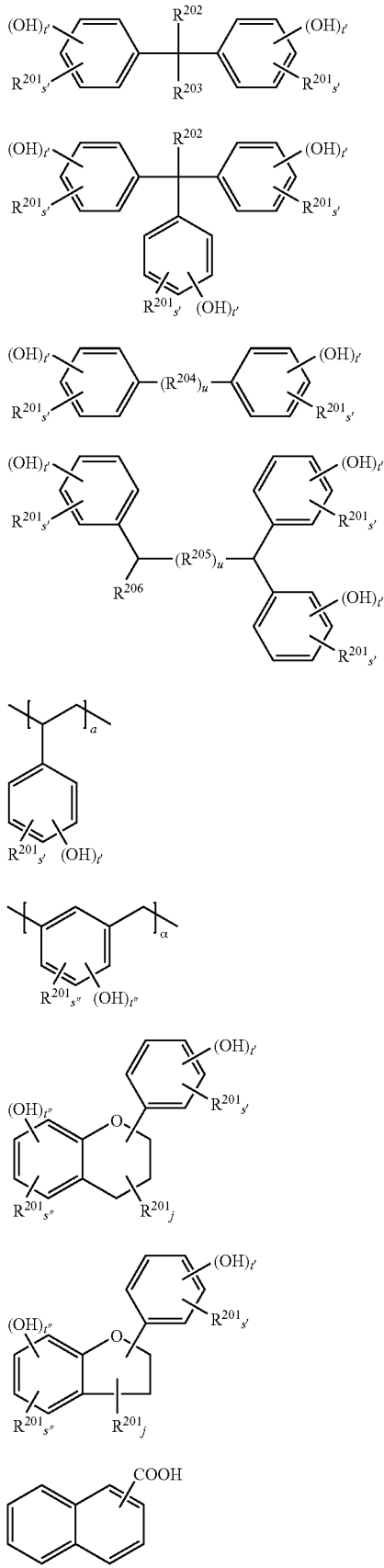
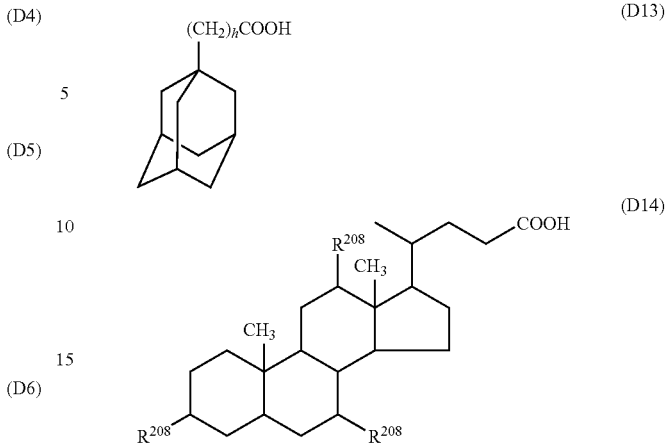

In these formulas, $R^{201}$ and $R^{202}$ are each hydrogen or a straight or branched $C_1$-$C_8$ alkyl or alkenyl; $R^{203}$ is hydrogen, a straight or branched $C_1$-$C_8$ alkyl or alkenyl, or —$(R^{207})_h$—COOH; $R^{204}$ is —$(CH_2)_i$— (where i=2 to 10), a $C_6$-$C_{10}$ arylene, carbonyl, sulfonyl, an oxygen atom, or a sulfur atom; $R^{205}$ is a $C_1$-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a hydroxyl-substituted phenyl or naphthyl; $R^{207}$ is a straight or branched $C_1$-$C_{10}$ alkylene; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl structure has at least one hydroxyl group; and α is a number such that the compounds of formula (D8) or (D9) have a molecular weight of from 100 to 1,000.

The dissolution inhibitor may be formulated in an amount of 0 to 50 parts, preferably 5 to 50 parts, and more preferably 5 to 30 parts by weight, per 100 parts by weight of the base resin, and may be used singly or as a mixture of two or more thereof. Outside the range, a less amount of the dissolution inhibitor may fail to improve resolution whereas a larger amount may lead to slimming of the patterned film and a decline in resolution. It is noted that since the dissolution inhibitor can also act as a plasticizer, the amount of dissolution inhibitor added should be limited so that a thermal flow may not occur in the first resist pattern during the step of heating the first resist pattern to render it insoluble, and preferably be 5 to 30 phr.

Basic Compound

A basic compound may be compounded in the chemically amplified positive resist composition. The basic compound used herein is preferably a compound capable of suppressing the rate of diffusion when the acid generated by the acid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, nitrogen-containing alcoholic compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and nitrogen-containing alcoholic compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

One or more basic compounds of the following general formula (B)-1 may also be added.

$$N(X)_n(Y)_{3-n} \quad \text{(B)-1}$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X)-1 to (X)-3, and two or three X's may bond together to form a ring with the nitrogen atom to which they are attached.

$$-[R^{300}-O-R^{301}] \quad \text{(X)-1}$$

$$-[R^{302}-O-R^{303}-\overset{\overset{\displaystyle O}{\|}}{C}-R^{304}] \quad \text{(X)-2}$$

$$-[R^{305}-\overset{\overset{\displaystyle O}{\|}}{C}-O-R^{306}] \quad \text{(X)-3}$$

In the formulas, $R^{300}$, $R^{302}$ and $R^{305}$ are independently straight or branched $C_1$-$C_4$ alkylene groups; $R^{301}$ and $R^{304}$ are independently hydrogen, straight, branched or cyclic $C_1$-$C_{20}$ alkyl groups which may contain one or more hydroxyl, ether, ester group or lactone ring; $R^{303}$ is a single bond or a straight or branched $C_1$-$C_4$ alkylene group; and $R^{306}$ is a straight, branched or cyclic $C_1$-$C_{20}$ alkyl group which may contain one or more hydroxyl, ether, ester group or lactone ring.

Illustrative examples of the compounds of formula (B)-1 include tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4, 1-aza-15-crown-5, 1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Also useful are basic compounds having cyclic structure, represented by the following general formula (B)-2.

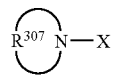

(B)-2

Herein X is as defined above, and $R^{307}$ is a straight or branched $C_2$-$C_{20}$ alkylene group which may contain one or more carbonyl, ether, ester or sulfide groups.

Illustrative examples of the compounds having formula (B)-2 include 1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate,
2-morpholinoethyl acetate, 2-(1-pyrrolidinyl)ethyl formate,
2-piperidinoethyl propionate,
2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate,
methyl morpholinoacetate, methyl thiomorpholinoacetate,
ethyl 1-pyrrolidinylacetate, and
2-methoxyethyl morpholinoacetate.

Also, basic compounds having cyano group, represented by the following general formulae (B)-3 to (B)-6 are useful.

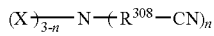  (B)-3

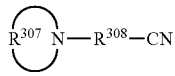  (B)-4

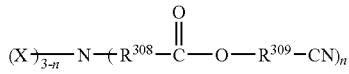  (B)-5

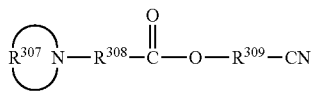  (B)-6

Herein, X, $R^{307}$ and n are as defined above, and $R^{308}$ and $R^{309}$ are each independently a straight or branched $C_1$-$C_4$ alkylene group.

Illustrative examples of the basic compounds having cyano group include 3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiononitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiononitrile,
N-(2-cyanoethyl)-N-tetrahydrofurfuryl-3-aminopropiononitrile,
N,N-bis(2-cyanoethyl)-3-aminopropiononitrile,
diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

The basic compound is preferably formulated in an amount of 0.001 to 2 parts, and especially 0.01 to 1 part by weight, per 100 parts by weight of the base resin. Less than 0.001 phr of the basic compound achieves no or little addition effect whereas more than 2 phr would result in too low a sensitivity.

Other Components

Also, a polymer comprising recurring units having amino and fluoroalkyl groups may be added. This polymer orients or segregates at the resist surface after coating, preventing the resist pattern from slimming during development and improving rectangularity. Polymers of the following formula are useful.

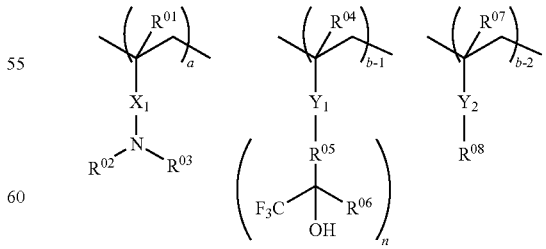

Herein $R^{01}$, $R^{04}$, and $R^{07}$ are each independently hydrogen or methyl. $X_1$, $Y_1$ and $Y_2$ are each independently a single bond, —O—$R^{09}$—, —C(=O)—O—$R^{09}$—, —C(=O)—NH—$R^{09}$—, a straight or branched $C_1$-$C_4$ alkylene, or phenylene group, wherein $R^{09}$ is a straight, branched or cyclic $C_1$-$C_{10}$ alkylene group which may contain an ester (—COO—) or ether (—O—) group. The subscript n is 1 or 2. In case of n=1, $Y_1$ is a single bond, —O—$R^{09}$—, —C(=O)—O—$R^{09}$—, —C(=O)—NH—$R^{09}$—, a straight or branched $C_1$-$C_4$ alkylene, or phenylene group, wherein $R^{09}$ is as defined above. In case of n=2, $Y_1$ is —O—$R^{101}$=, —C(=O)—O—$R^{101}$=, —C(=O)—NH—$R^{101}$=, a straight or branched $C_1$-$C_4$ alkylene group with one hydrogen atom eliminated, or a phenylene group with one hydrogen atom eliminated, wherein $R^{101}$ is a straight, branched or cyclic $C_1$-$C_{10}$ alkylene group with one hydrogen atom eliminated which may contain an ester or ether group. $R^{02}$ and $R^{03}$ are each independently hydrogen, a straight, branched or cyclic $C_1$-$C_{20}$ alkyl or $C_2$-$C_{20}$ alkenyl group which may contain a hydroxy, ether, ester, cyano, amino group, double bond or halogen atom, or a $C_6$-$C_{10}$ aryl group, or $R^{02}$ and $R^{03}$ may bond together to form a ring of 3 to 20 carbon atoms with the nitrogen atom to which they are attached. $R^{05}$ is a straight, branched or cyclic $C_1$-$C_{12}$ alkylene group. $R^{06}$ is hydrogen, fluorine, methyl, trifluoromethyl or difluoromethyl, or $R^{06}$ and $R^{05}$ may bond together to form an alicyclic ring of 2 to 12 carbon atoms with the carbon atom to which they are attached, which ring may contain an ether group, fluoroalkylene group or trifluoromethyl group. $R^{08}$ is a straight, branched or cyclic $C_1$-$C_{20}$ alkyl group which has at least one fluorine atom substituted thereon and which may contain an ether, ester or sulfonamide group. The subscripts a, b-1, and b-2 are numbers in the range: $0<a<1.0$, $0\leq(b-1)<1.0$, $0\leq(b-2)<1.0$, $0<(b-1)+(b-2)<1.0$, and $0.5\leq a+(b-1)+(b-2)\leq 1.0$.

In the positive resist composition, a compound having a group ≡C—COOH in the molecule may be blended. Exemplary, non-limiting compounds having a carboxyl group include one or more compounds selected from Groups I and II below. Including this compound improves the post-exposure delay (PED) stability of the resist and ameliorates edge roughness on nitride film substrates.

Group I:

Compounds of general formulas (A1) to (A10) below in which some or all of the hydrogen atoms on the phenolic hydroxyl groups have been replaced by —$R^{401}$—COOH (wherein $R^{401}$ is a straight or branched $C_1$-$C_{10}$ alkylene), and in which the molar ratio C/(C+D) of phenolic hydroxyl groups (C) to ≡C—COOH groups (D) in the molecule is from 0.1 to 1.0.

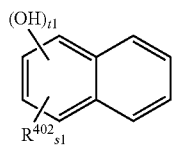

(A1)

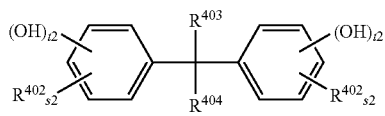

(A2)

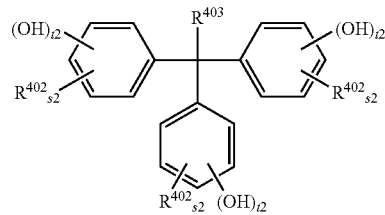

(A3)

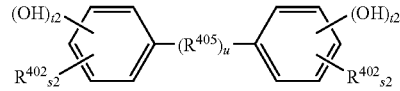

(A4)

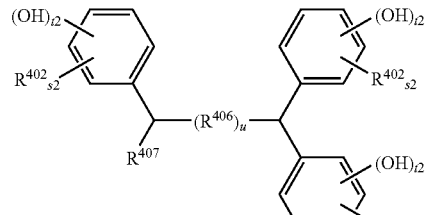

(A5)

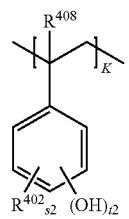

(A6)

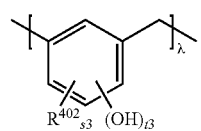

(A7)

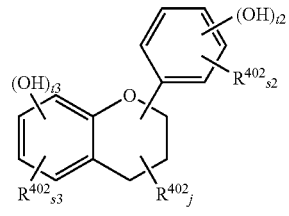

(A8)

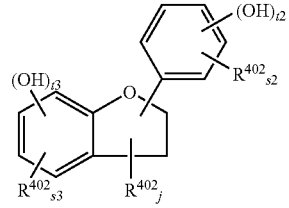

(A9)

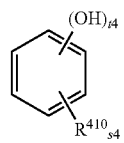

(A10)

In these formulas, $R^{408}$ is hydrogen or methyl; $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —($R^{409}$)$_h$—COOR' group (R' being hydrogen or —$R^{409}$—COOH); $R^{405}$ is —(CH$_2$)$_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a lo hydroxyl-substituted phenyl or naphthyl; $R^{409}$ is a straight or branched $C_1$-$C_{10}$ alkyl or alkenyl or a —$R^{411}$— COOH group; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; h is an integer of 1 to 4, j is an integer from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is an integer of 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

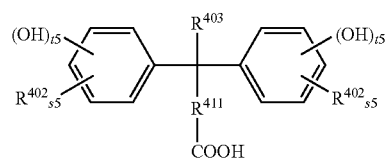
(A11)

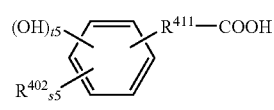
(A12)

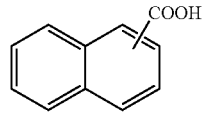
(A13)

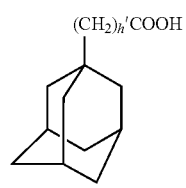
(A14)

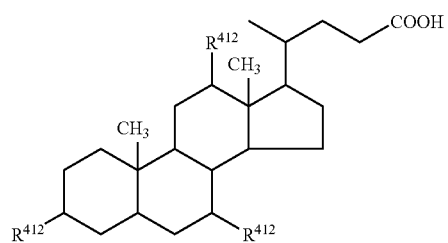
(A15)

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is 0 or 1.

Illustrative, non-limiting examples of the compound having a carboxyl group include compounds of the general formulas (AI-1) to (AI-14) and (AII-1) to (AII-10) below.

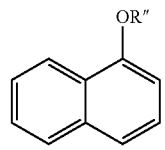
(AI-1)

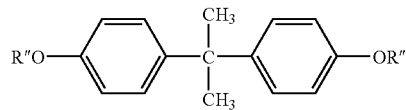
(AI-2)

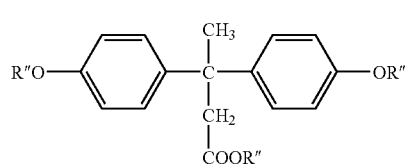
(AI-3)

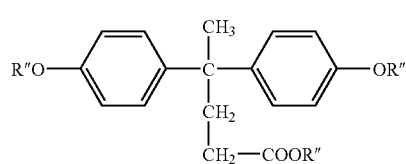
(AI-4)

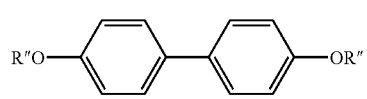
(AI-5)

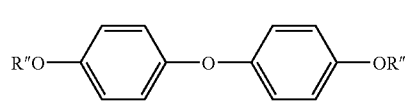
(AI-6)

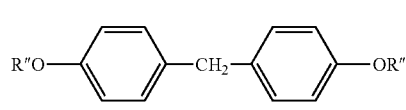
(AI-7)

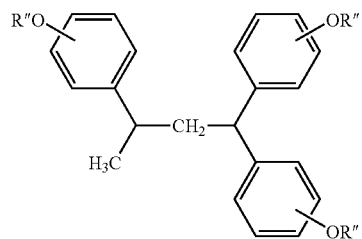
(AI-8)

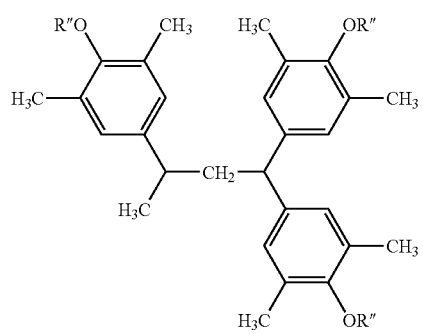
(AI-9)

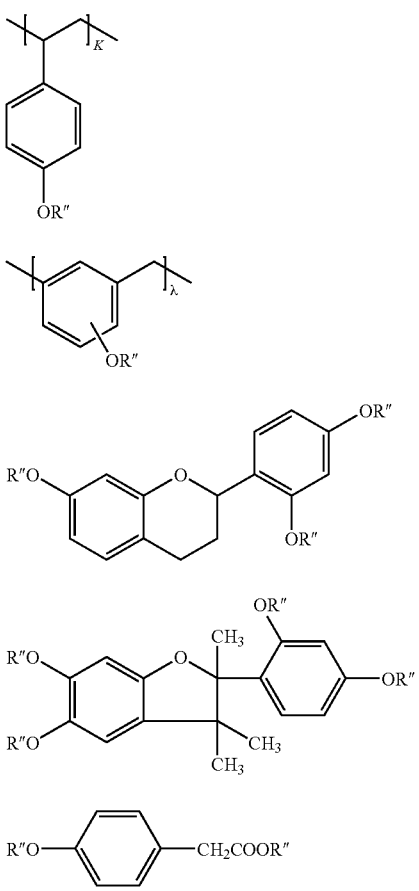

In the above formulas, R" is hydrogen or a —CH₂COOH group such that the —CH₂COOH group accounts for 10 to 100 mol % of R" in each compound, κ and λ are as defined above.

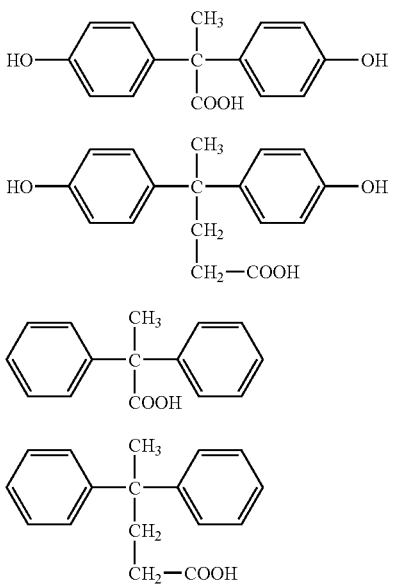

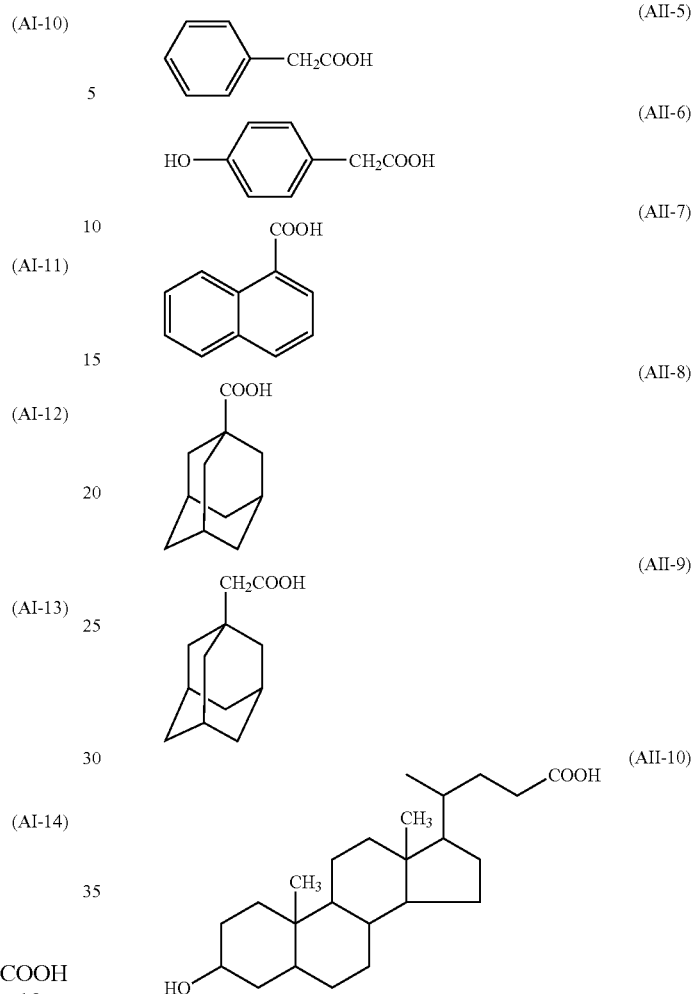

The carboxyl compound is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 phr of the carboxyl compound may reduce the resolution of the resist composition. Although the invention intends to insolubilize the first resist pattern in alkaline developer, such a larger amount of the carboxyl compound added may prevent sufficient insolubilization. It is also noted that the carboxyl compound can act as a plasticizer.

Optionally, the positive resist composition used herein may further comprise a surfactant which is commonly used for facilitating the coating operation. The surfactant may be added in conventional amounts so long as this does not compromise the objects of the invention.

Illustrative, non-limiting examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (JEMCO Inc.), Megaface F171, F172, F173, R08, R30, R90 and R94 (DIC Corp.), Fluorad FC-430, FC-431, FC-4430 and FC-4432 (Sumitomo 3M Co., Ltd.), Asahiguard AG710, Surflon S-381, S-382, S-386, SC101, SC102, SC103, SC104, SC105, SC106, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Additional useful surfactants include partially fluorinated oxetane ring-opened polymers having the structural formula (surf-1).

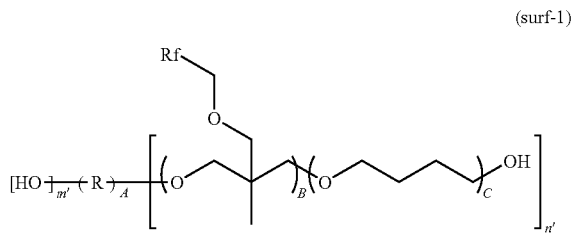

(surf-1)

It is provided herein that R, Rf, A, B, C, m', and n' are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

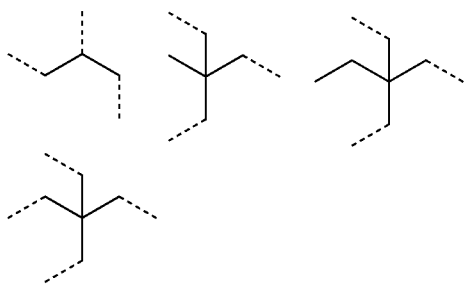

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m' is an integer of 0 to 3, n' is an integer of 1 to 4, and the sum of m' and n', which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

Of the foregoing surfactants, FC-4430, Surflon S-381, KH-20, KH-30, and oxetane ring-opened polymers of formula (surf-1) are preferred. These surfactants may be used alone or in admixture.

In the positive resist composition, the surfactant is preferably compounded in an amount of up to 2 parts, and especially up to 1 part by weight, per 100 parts by weight of the base resin. The amount of the surfactant, if added, is preferably at least 0.01 phr.

Second Resist Composition

Now the second resist composition is described which is used to form a second resist film in the double pattern forming process of the invention. The second resist composition may be either positive or negative.

One embodiment wherein the second resist composition is positive has the advantage that it may be the same as the first resist composition. Where the first and second resist compositions are identical, both the steps of coating first and second resist compositions may use a common nozzle for injecting the resist material. The second resist composition which is the same as the first resist composition need not be described further.

In one embodiment wherein the second resist composition is positive, it may be different from the first resist composition. In this embodiment, any well-known positive resist compositions may be used. While the pattern forming process of the invention is characterized in that development of the first resist pattern is followed by crosslinking reaction to render the first resist pattern insoluble in an organic solvent used in the second resist composition and insoluble in an alkaline developer therefor, development of the second resist pattern need not be followed by crosslinking reaction. Accordingly, the structural units of formula (1) are not essential for the resist composition for forming the second resist pattern, and any well-known chemically amplified positive resist compositions may be used.

In another embodiment, the second resist composition is negative. Suitable second negative resist compositions which can be used herein include those compositions well known from the following patents.

Document 1: WO 2004-074936
Document 2: JP-A 2006-215067
Document 3: JP-A 2006-301289
Document 4: JP-A 2006-317803
Document 5: JP-A 2006-350198
Document 6: JP-A 2004-004794
Document 7: JP-A 2004-252146
Document 8: JP-A 2004-294638
Document 9: JP-A 2004-318080
Document 10: JP-A 2004-341432
Document 11: JP-A 2005-003862
Document 12: JP-A 2005-003863
Document 13: JP-A 2005-336452
Document 14: JP-A 2006-145788
Document 15: JP-A 2006-163066
Document 16: JP-A 2006-195050
Document 17: JP-A 2006-145775

Process

Now the double patterning process of the invention is illustrated. The first positive resist material is coated on a substrate to form a first resist film thereon. As shown in FIG. 1(A), a first resist film 30 of a positive resist material is formed on a processable substrate 20 disposed on a substrate 10 directly or via an intermediate intervening layer (not shown). The first resist film preferably has a thickness of 10 to 1,000 nm and more preferably 20 to 500 nm. Prior to exposure, the resist film is heated or prebaked, preferably at a temperature of 60 to 180° C., especially 70 to 150° C., even more preferably 80 to 120° C. for a time of 10 to 300 seconds, especially 15 to 200 seconds, even more preferably 30 to 120 seconds.

The substrate 10 used herein is generally a silicon substrate. The processable substrate 20 used herein includes $SiO_2$, SiN, SiON, SiOC, p-Si, α-Si, TiN, WSi, BPSG, SOG, Cr, CrO, CrON, MoSi, low dielectric constant film, and etch stopper film. The intermediate intervening layer includes hard masks of $SiO_2$, SiN, SiON or p-Si, an undercoat in the form of carbon film, a silicon-containing intermediate film, and an organic antireflective coating.

Where the double pattern is used as a bilayer resist, the organic film-forming material of which the lower layer of the double pattern formed on the processable substrate is made may be selected from many well-known materials. The organic film is briefly described. Basically, aromatic resins are preferred. More preferred are those resins which are crosslinked upon film formation so that intermixing may not occur when the resist material is subsequently coated to form a film thereon.

Suitable aromatic resins include novolac resins and polyhydroxystyrene resins, and those resins having a fluorene or indene framework may be advantageously used in order to enhance the etch resistance of this organic film during etching of the substrate after pattern transfer to this organic film. Also an ARC may be formed on the organic film and a resist film according to the invention be formed thereon. The organic film having an antireflection function is preferred because the process becomes more simple. For such an antireflection function, it is preferred to use a resin having an anthracene or naphthalene framework or a benzene framework with conjugated unsaturated bond.

Crosslinks may be formed using thermosetting resins or a crosslinking technique employed in negative resist materials. One common method uses a composition in solution form comprising a resin having functional groups such as phenol, alkoxyphenyl, alcohol or carboxylic acid, a substance capable of generating an acid through thermal decomposition, and a crosslinker (e.g., hexaalkoxymethylmelamine) capable of forming crosslinks with the functional groups in the presence of an acid catalyst. The composition is coated onto a processable substrate and heated to generate the acid whereby crosslinks are formed.

After the first positive resist material is coated and prebaked to form the first resist film on the substrate, the first resist film is exposed. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses pure water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, pure water rinsing (or post-soaking) may be carried out after exposure for removing water droplets left on the resist film, or a protective film may be applied onto the resist film after pre-baking for preventing any leach-out from the resist film and improving water slip on the film surface. The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the photoresist film, pure water rinsing (or post-soaking) may be carried out for extracting the acid generator and the like from the film surface or washing away particles, or after exposure, rinsing (or post-soaking) may be carried out for removing water droplets left on the resist film.

Exposure is preferably carried out so as to provide an exposure dose of about 1 to 200 $mJ/cm^2$, more preferably about 10 to 100 $mJ/cm^2$, and even more preferably 10 to 50 $mJ/cm^2$. This is followed by baking on a hot plate at 60 to 150° C. for 30 seconds to 5 minutes, preferably at 80 to 120° C. for 30 seconds to 3 minutes (post-exposure baking=PEB).

Thereafter the first resist film is developed with a developer in the form of an aqueous alkaline solution, for example, an aqueous solution of 0.1 to 5 wt %, preferably 2 to 3 wt % tetramethylammonium hydroxide (TMAH) for 0.1 to 3 minutes, preferably 0.5 to 2 minutes by conventional techniques such as dip, puddle and spray techniques. In this way, a desired resist pattern 30a is formed on the substrate as shown in FIG. 1(B).

After the first resist film is processed into the line-and-space pattern 30a by the above patterning process, a line pattern of a second resist film is formed in the space between lines of the first pattern. By increasing the exposure dose of high-energy radiation applied in forming pattern 30a of the first resist film, the lines of the first resist pattern 30a may be finished thin. Namely, the spaces of the first resist pattern become wider, which is advantageous in forming lines of the second resist pattern. FIG. 1(B-1) shows an exemplary pattern having a line size reduced by over-exposure of the first resist film. For example, lines and spaces of the first resist pattern are formed at a width ratio of 1:3, and then lines of the second resist pattern (or second resist line pattern) are formed at the center of the spaces (or first resist line pattern) to a size equal to width ratio 1. This combination of first and second resist line patterns gives a 1:1 line-and-space pattern. There is obtained a fine size repeat pattern which cannot be formed by single pattern formation. See FIGS. 2(E-2) and 2(E-4).

Next, the first resist pattern is heated at a high temperature sufficient to render the first resist pattern insoluble in an organic solvent used in the second resist composition and also insoluble in an alkaline developer used in forming the second resist pattern. The temperature that promotes crosslinking reaction for insolubilization is preferably high and more preferably higher than the temperatures in the steps of prebaking the first resist coating and post-exposure baking, as mentioned above. The optimum temperature is at least 150° C., and more preferably 180 to 220° C. In general, a photoacid generator and basic compound in the resist material serve as a plasticizer to lower the Tg of the resist pattern so that thermal flow may start at a lower temperature. Since the photoacid generator and basic compound are components commonly compounded in the resist composition, the resist base resin must be designed to have an elevated Tg, in consideration of the plasticizing effect of these components. Accordingly, the resist base resin should have an optimum Tg of at least 150° C., and more preferably at least 180° C. If the temperature at which the first resist pattern is heated for inducing crosslinking reaction is higher than 220° C., the first resist pattern experiences noticeable thermal shrinkage or thermal damage. If the heating step for inducing crosslinking reaction is lower than 150° C., crosslinking reaction takes place to a less extent.

In the step of heating the first resist pattern to render it insoluble in both organic solvent and alkaline developer, it is important to generate an acid positively in the first resist pattern so that the acid may promote crosslinking reaction as a catalyst.

One suitable means for positively generating acid in the first resist pattern is flood exposure of the wafer (pattern) as developed for decomposing the photoacid generator. The flood exposure uses an exposure wavelength of 180 to 400 nm and an exposure dose of 10 mJ/cm$^2$ to 1 J/cm$^2$. Radiation with a wavelength of less than 180 nm, specifically irradiation of excimer lasers of 172 nm, 146 nm and 122 nm or excimer lamps is undesirable because not only the generation of acid from photoacid generator, but also photo-induced crosslinking reaction are accelerated, leading to a decrease of alkaline dissolution rate due to excessive crosslinking. For the flood exposure, use is preferably made of an ArF excimer laser with a wavelength of 193 nm, a KrCl excimer lamp of 222 nm, a KrF excimer laser of 248 nm, a low-pressure mercury lamp centering at 254 nm, a XeCl excimer lamp of 308 nm, and i-line of 365 nm.

However, it is desired to avoid incorporating a flood exposure tool in the semiconductor device production line because the tool itself is expensive and because of the disadvantage that the throughput of the production line is reduced due to an increased number of steps.

Another suitable means for positively generating acid in the first resist pattern is to add a thermal acid generator to the first resist material.

For example, in an embodiment wherein a thermal acid generator in the form of an ammonium salt is added to the positive resist material, an acid can be generated by heating. In this case, acid generation and crosslinking reaction take place simultaneously. Preferred heating conditions include a temperature of 180 to 220° C. and a time of 10 to 300 seconds, especially 30 to 60 seconds. As a result, a crosslinked resist pattern which is insoluble in the second resist solvent and in the alkaline developer is yielded.

Suitable ammonium salts serving as the thermal acid generator include compounds of the formula (P1a-2) below. The addition of a thermal acid generator to the first resist material is advantageous in that it promotes crosslinking reaction to endow the first resist pattern with resistance to the organic solvent used in coating of a second resist material and to render it insoluble in the alkaline developer used in forming the second resist pattern. However, excess addition of a thermal acid generator gives rise to some problems. The thermal acid generator may be added in such amounts as to provide no impact on the lithography of patterning the first resist film, no impact on the thermal properties of the first resist pattern, and no impact on the second resist film. Specifically, the thermal acid generator may be added in an amount of up to 10%, preferably up to 5%, and more preferably 0.01 to 3% by weight based on the weight of the base resin in the first resist material.

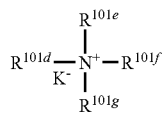

(P1a-2)

Herein K$^-$ is a sulfonate having at least one fluorine substituted at α-position, or perfluoroalkylimidate or perfluoroalkylmethidate. $R^{101d}$, $R^{101e}$, $R^{101f}$, and $R^{101g}$ are each independently hydrogen, a straight, branched or cyclic $C_1$-$C_{12}$ alkyl, alkenyl, oxoalkyl or oxoalkenyl group, a $C_6$-$C_{20}$ aryl group, or a $C_7$-$C_{12}$ aralkyl or aryloxoalkyl group, in which some or all hydrogen atoms may be substituted by alkoxy groups. Alternatively, $R^{101d}$ and $R^{101e}$, or $R^{101d}$, $R^{101e}$ and $R^{101f}$ may bond together to form a ring with the nitrogen atom to which they are attached, and $R^{101e}$ and $R^{101f}$ or $R^{101d}$, $R^{101e}$ and $R^{101f}$, taken together, denote a $C_3$-$C_{10}$ alkylene group or a hetero-aromatic ring having incorporated therein the nitrogen atom when they form a ring.

Examples of K$^-$ include perfluoroalkanesulfonates such as triflate and nonaflate, imidates such as bis(trifluoromethylsulfonyl)imide, bis(perfluoroethylsulfonyl)imide, and bis(perfluorobutylsulfonyl)imide, methidates such as tris(trifluoromethylsulfonyl)methide and tris(perfluoroethylsulfonyl)methide, and sulfonates having fluorine substituted at α-position, represented by the formula (K-1), and sulfonates having fluorine substituted at α-position, represented by the formula (K-2).

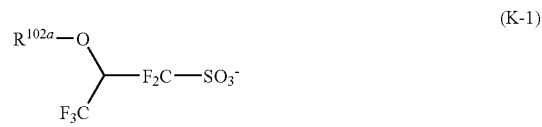

(K-1)

(K-2)

In formula (K-1), $R^{102a}$ is hydrogen, a straight, branched or cyclic $C_1$-$C_{20}$ alkyl or acyl group, $C_2$-$C_{20}$ alkenyl group or $C_6$-$C_{20}$ aryl or aryloxy group, which may have an ether, ester, carbonyl group or lactone ring and in which some or all hydrogen atoms may be substituted by fluorine atoms. In formula (K-2), $R^{102b}$ is hydrogen, a straight, branched or cyclic $C_1$-$C_{20}$ alkyl group, $C_2$-$C_{20}$ alkenyl group or $C_6$-$C_{20}$ aryl group.

Apart from the embodiment of performing flood exposure and the embodiment of adding a thermal acid generator to positively generate an acid in the first resist pattern, there is a possibility that a minor amount of residual acid which has diffused from the exposed area and remains in the first resist pattern helps crosslinking reaction take place so that the pattern is endowed with solvent resistance. However, since the same acid serves to eliminate the acid labile groups in the first resist pattern during the heating step, the first resist pattern inevitably becomes soluble in alkaline developer. It is thus necessary for crosslinking reaction to run to a sufficient extent to avoid alkaline developer solubility, and means for positively generating acid must be taken.

FIG. 1(C) illustrates the first resist pattern 30b which is crosslinked after the heating step.

As a result of crosslinking reaction proceeding during the heating step, the first resist pattern is now rendered insoluble in an organic solvent used in the second resist material, which allows the second resist material to be coated onto the first resist material (FIG. 2(D)). Absent crosslinking reaction as in the present process, the first resist pattern is dissolved in the solvent of the second resist material and not retained, because the first and second resist materials use organic solvents having the same or similar dissolution properties.

As described above, when lines and spaces of the first resist pattern are formed at a width ratio of 1:3, and then the second resist film is exposed to a line pattern whose lines are formed at the center of the spaces of the first resist pattern (or first resist line pattern) to a size equal to width ratio 1, a double pattern of repeating 1:1 fine lines and spaces is formed as a combination of first and second resist line patterns. In one example where the second resist material is positive, in order that lines of the second resist pattern be disposed at the center of the first resist pattern, exposure may be effected while shielding radiation at the center of the first resist line pattern as shown in FIG. 2(E-1). In another example where the second resist material is negative, exposure may be effected at the center of the first resist line pattern as shown in FIG. 2(E-3) whereby a line pattern is formed. By forming lines of the second resist between lines of the first resist in this way, there are obtained fine size repeat lines and spaces which cannot be formed by single exposure/patterning. FIG. 2(E-2) shows the pattern of the second resist film which is positive, and FIG. 2(E-4) shows the pattern of the second resist film which is negative.

A still further example of double pattern formation is described below. After a first resist pattern of lines and spaces is formed from the first resist material, a heating step is carried out to induce crosslinking reaction to render the first resist pattern insoluble in organic solvent and insoluble in alkaline developer. Then the second resist material is coated to form a second resist film which is exposed and patterned. At this point, the second resist film is exposed to a pattern of lines and spaces that extends perpendicular to the first resist pattern of lines and spaces as shown in FIG. 3(E-5). After development of the second resist film, there is formed a pattern whose spaces look like contact holes because the lines and spaces of the first resist pattern are perpendicular to those of the second resist pattern. There is obtainable a pattern of fine contact holes, which cannot be formed by single exposure/patterning. FIG. 3(E-6) shows such a pattern where the second resist film is positive.

Furthermore, as seen from FIGS. 2(E-2), 2(E-4) and 3(E-6), using the resulting double pattern as a mask, the intermediate intervening layer of hard mask or the like (if any) may be etched, and the processable substrate 20 further etched. For etching of the intermediate intervening layer of hard mask or the like, dry etching with fluorocarbon or halogen gases may be used. For etching of the processable substrate, the etching gas and conditions may be properly chosen so as to establish an etching selectivity relative to the hard mask, and specifically, dry etching with fluorocarbon, halogen, oxygen, hydrogen or similar gases may be used. Thereafter, the crosslinked resist film and second resist film are removed. Removal of these films may be carried out after etching of the intermediate intervening layer of hard mask or the like. It is noted that removal of the crosslinked resist film may be achieved by dry etching with oxygen or radicals and removal of the second resist film may be achieved as previously described, or using strippers such as amines, sulfuric acid/aqueous hydrogen peroxide or organic solvents.

EXAMPLE

Examples of the invention are given below by way of illustration and not by way of limitation. The abbreviations used herein are GPC for gel permeation chromatography, Mw for weight average molecular weight, Mn for number average molecular weight, Mw/Mn for molecular weight distribution or polydispersity index, NMR for nuclear magnetic resonance, PAG for photoacid generator, TAG for thermal acid generator, PGMEA for propylene glycol monomethyl ether acetate, Me for methyl, and Et for ethyl. For all polymers, Mw and Mn are determined by GPC versus polystyrene standards.

Synthesis Example 1

Polymers for use in first and second resist compositions were prepared by combining various monomers, effecting copolymerization reaction in tetrahydrofuran solvent, crystallization in methanol, repeated hexane washing, isolation, and drying. The resulting polymers (Resist Polymers 1 to 10 and Comparative Resist Polymers 11 to 13) had the composition shown below. Notably, a phenol group on a monomer was substituted by an acetoxy group, which was converted back to a phenol group by alkaline hydrolysis after polymerization. The composition of each polymer was analyzed by $^1$H-NMR, and the Mw and Mw/Mn determined by GPC.

Resist Polymer 1
(polymer for use in first resist composition)
Mw=8,400
Mw/Mn=1.74

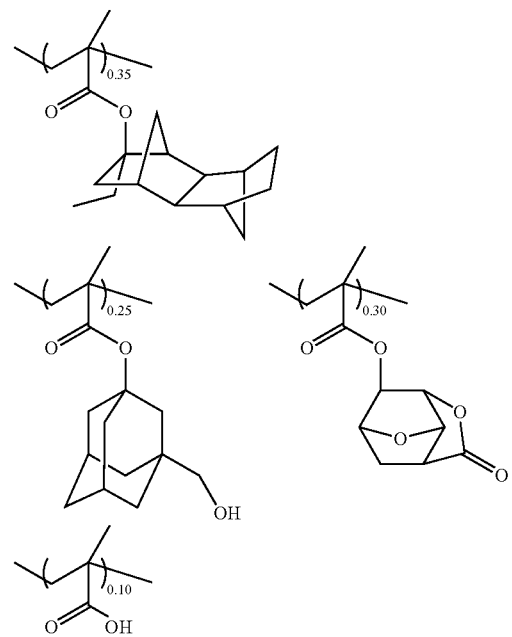

Resist Polymer 2
(polymer for use in first resist composition)
Mw=7,250
Mw/Mn=1.68

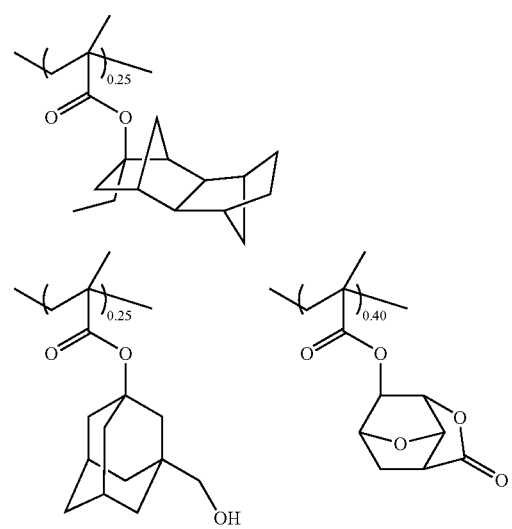

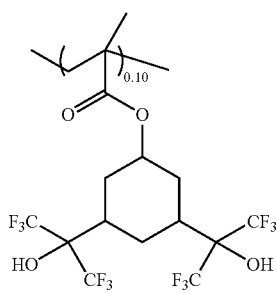
Resist Polymer 3
(polymer for use in first resist composition)
Mw=8,100
Mw/Mn=1.70
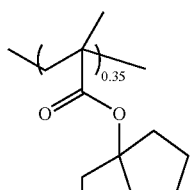
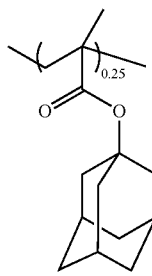
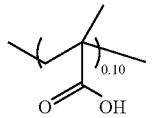
Resist Polymer 4
(polymer for use in first resist composition)
Mw=7,400
Mw/Mn=1.66
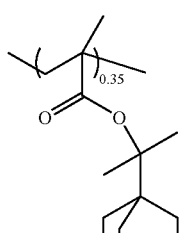
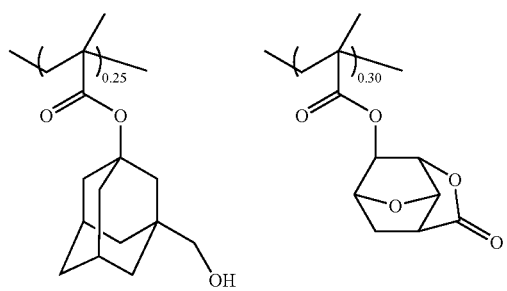
Resist Polymer 5
(polymer for use in first resist composition)
Mw=8,000
Mw/Mn=1.71
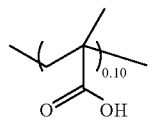
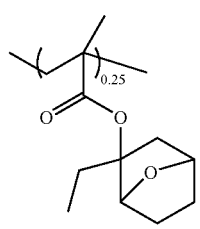
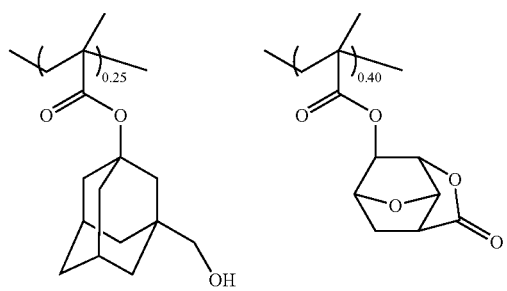
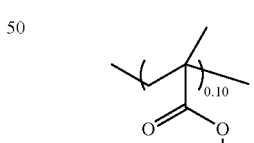
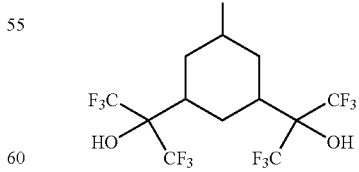
Resist Polymer 6
(polymer for use in first resist composition)
Mw=6,700
Mw/Mn=1.67

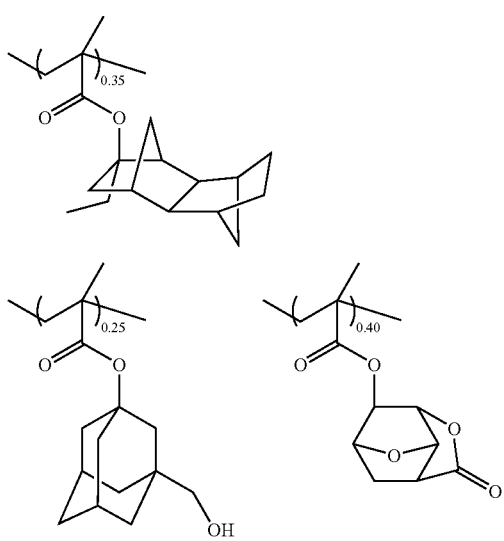
Resist Polymer 7
(polymer for use in first resist composition)
Mw=7,400
Mw/Mn=1.66
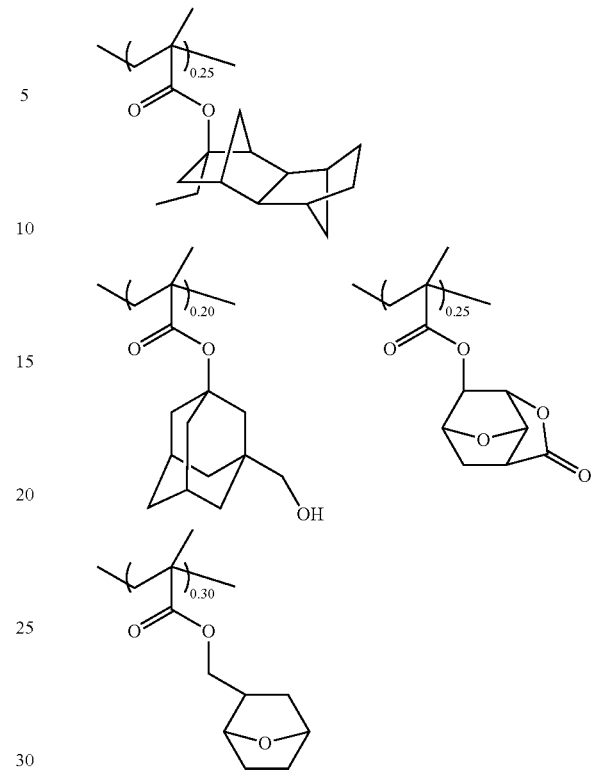
Resist Polymer 9
(polymer for use in first resist composition)
Mw=6,900
Mw/Mn=1.82
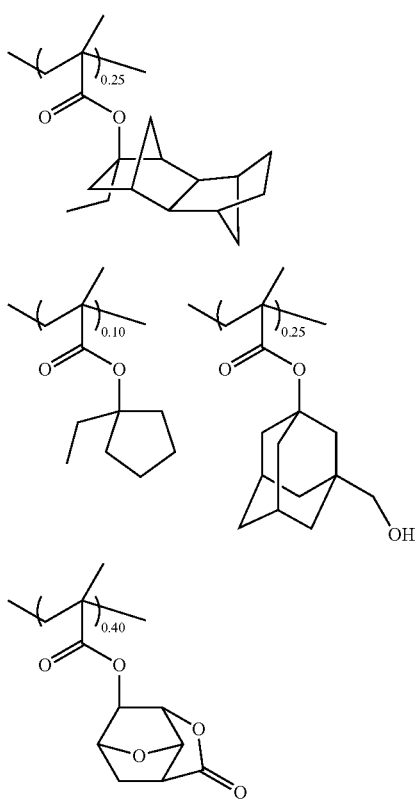
Resist Polymer 8
(polymer for use in first resist composition)
Mw=6,400
Mw/Mn=1.70
Resist Polymer 10
(polymer for use in first resist composition)
Mw=7,000
Mw/Mn=1.78

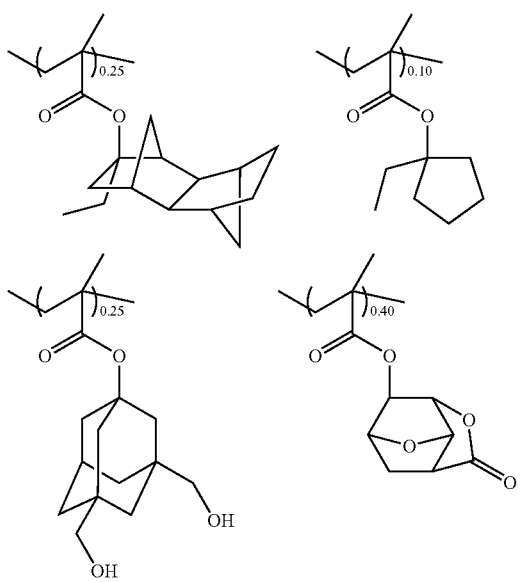

Resist Polymer 11
(comparative polymer for use in first resist composition)
Mw=7,100
Mw/Mn=1.78

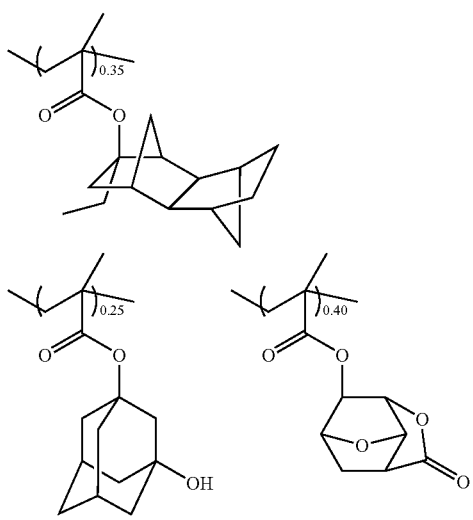

Resist Polymer 12
(comparative polymer for use in first resist composition)
Mw=6,800
Mw/Mn=1.79

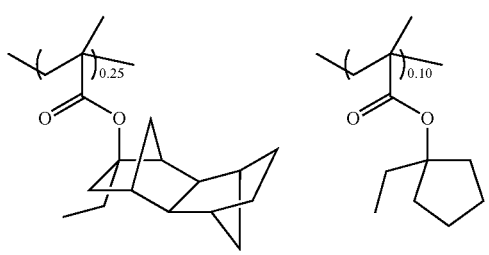

-continued

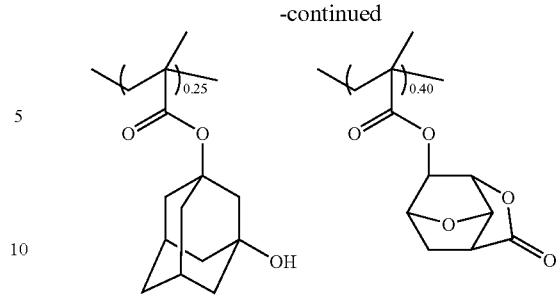

Resist Polymer 13
(comparative polymer for use in first resist composition)
Mw=6,900
Mw/Mn=1.80

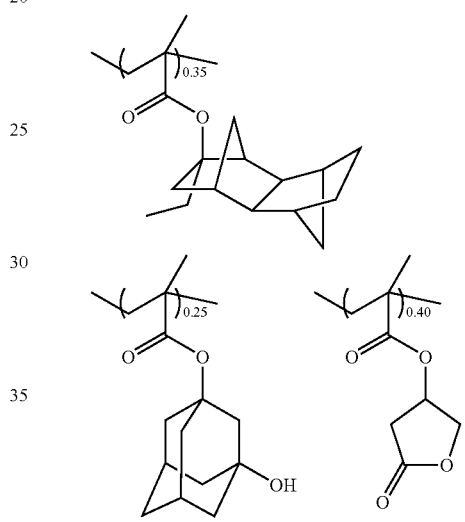

Examples 1 to 20 and Comparative Examples 1 to 6

First resist compositions were prepared by using the polymers synthesized above and adding thereto a photoacid generator, basic compound, thermal acid generator, and organic solvent as shown below. In all runs, the solvent contained 0.005 wt % of surfactant KH-20 (Asahi Glass Co., Ltd.).

Acid generator: PAG1 of the following structural formula

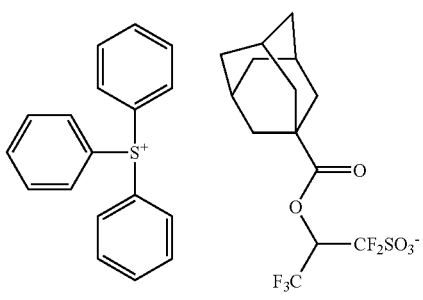

PAG 1

Basic compound: Quencher 1 of the following structural formula

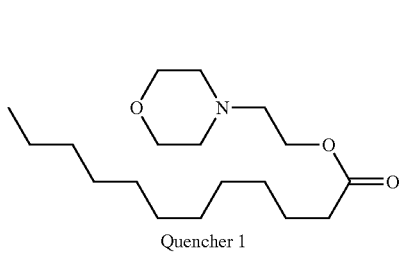

Quencher 1

Thermal acid generator:
TAG1 of the following structural formula

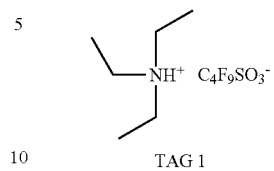

TAG 1

Organic solvent: propylene glycol monomethyl ether acetate (PGMEA)

Table 1 tabulates the formulation of first resist compositions and comparative first resist compositions.

TABLE 1

| Resist composition | Formulation No. | Polymer (pbw) | PAG (pbw) | Basic compound (pbw) | TAG (pbw) | Solvent (pbw) |
|---|---|---|---|---|---|---|
| 1st resist composition | F-001 | Resist Polymer 1 (100) | PAG1 (16) | Quencher 1 (3) | — | PGMEA (2,700) |
| 1st resist composition | F-002 | Resist Polymer 2 (100) | PAG1 (16) | Quencher 1 (3) | — | PGMEA (2,700) |
| 1st resist composition | F-003 | Resist Polymer 3 (100) | PAG1 (16) | Quencher 1 (3) | — | PGMEA (2,700) |
| 1st resist composition | F-004 | Resist Polymer 4 (100) | PAG1 (16) | Quencher 1 (3) | — | PGMEA (2,700) |
| 1st resist composition | F-005 | Resist Polymer 5 (100) | PAG1 (16) | Quencher 1 (3) | — | PGMEA (2,700) |
| 1st resist composition | F-006 | Resist Polymer 6 (100) | PAG1 (16) | Quencher 1 (3) | — | PGMEA (2,700) |
| 1st resist composition | F-007 | Resist Polymer 7 (100) | PAG1 (16) | Quencher 1 (3) | — | PGMEA (2,700) |
| 1st resist composition | F-008 | Resist Polymer 8 (100) | PAG1 (16) | Quencher 1 (3) | — | PGMEA (2,700) |
| 1st resist composition | F-009 | Resist Polymer 9 (100) | PAG1 (16) | Quencher 1 (3) | — | PGMEA (2,700) |
| 1st resist composition | F-010 | Resist Polymer 10 (100) | PAG1 (16) | Quencher 1 (3) | — | PGMEA (2,700) |
| Comparative 1st resist composition | F-011 | Resist Polymer 11 (100) | PAG1 (16) | Quencher 1 (3) | — | PGMEA (2,700) |
| Comparative 1st resist composition | F-012 | Resist Polymer 12 (100) | PAG1 (16) | Quencher 1 (3) | — | PGMEA (2,700) |
| Comparative 1st resist composition | F-013 | Resist Polymer 13 (100) | PAG1 (16) | Quencher 1 (3) | — | PGMEA (2,700) |
| 1st resist composition | F-014 | Resist Polymer 1 (100) | PAG1 (12) | Quencher 1 (3) | TAG1 (4) | PGMEA (2,700) |
| 1st resist composition | F-015 | Resist Polymer 2 (100) | PAG1 (12) | Quencher 1 (3) | TAG1 (4) | PGMEA (2,700) |
| 1st resist composition | F-016 | Resist Polymer 3 (100) | PAG1 (12) | Quencher 1 (3) | TAG1 (4) | PGMEA (2,700) |
| 1st resist composition | F-017 | Resist Polymer 4 (100) | PAG1 (12) | Quencher 1 (3) | TAG1 (4) | PGMEA (2,700) |
| 1st resist composition | F-018 | Resist Polymer 5 (100) | PAG1 (12) | Quencher 1 (3) | TAG1 (4) | PGMEA (2.700) |
| 1st resist composition | F-019 | Resist Polymer 6 (100) | PAG1 (12) | Quencher 1 (3) | TAG1 (4) | PGMEA (2.700) |
| 1st resist composition | F-020 | Resist Polymer 7 (100) | PAG1 (12) | Quencher 1 (3) | TAG1 (4) | PGMEA (2,700) |
| 1st resist composition | F-021 | Resist Polymer 8 (100) | PAG1 (12) | Quencher 1 (3) | TAG1 (4) | PGMEA (2,700) |
| 1st resist composition | F-022 | Resist Polymer 9 (100) | PAG1 (12) | Quencher 1 (3) | TAG1 (4) | PGMEA (2,700) |
| 1st resist composition | F-023 | Resist Polymer 10 (100) | PAG1 (12) | Quencher 1 (3) | TAG1 (4) | PGMEA (2,700) |
| Comparative 1st resist composition | F-024 | Resist Polymer 11 (100) | PAG1 (12) | Quencher 1 (3) | TAG1 (4) | PGMEA (2,700) |
| Comparative 1st resist composition | F-025 | Resist Polymer 12 (100) | PAG1 (12) | Quencher 1 (3) | TAG1 (4) | PGMEA (2,700) |
| Comparative 1st resist composition | F-026 | Resist Polymer 13 (100) | PAG1 (12) | Quencher 1 (3) | TAG1 (4) | PGMEA (2,700) |

Table 2 tabulates the patterning data of first resist compositions of Examples 1 to 20 and Comparative Examples 1 to 6.

The resist compositions prepared according to the formulation shown in Table 1 were filtered through a filter having a pore size of 0.2 μm, yielding positive resist film-forming coating solutions.

On a substrate (silicon wafer) having deposited thereon an antireflective coating (ARC-29A, Nissan Chemical Industries, Ltd.) of 90 nm thick, each resist solution was spin coated and prebaked on a hot plate at an optimum temperature for 60 seconds to form a resist film of 1,200 Å thick. As used herein, the term "optimum temperature" refers to the prebaking temperature which ensures that a pattern resulting from subsequent processing has a satisfactory profile which is highly rectangular and free of bridges or pattern edge chipping, when observed under top-down scanning electron microscope (TDSEM) S9320 (Hitachi, Ltd.). The optimum prebaking temperature is shown in Table 2.

The first resist film thus formed was subjected to patternwise exposure by means of an ArF scanner S-307E (Nikon Corp., NA 0.85, σ 0.93-0.62, dipole illumination). The mask used was a 6% halftone phase shift mask (HTPSM) bearing thereon a line-and-space design consisting of 70-nm lines and 160-nm pitches (equivalent resist pattern size). Exposure of the resist film was done while selecting an optimum focus and varying the exposure dose from a minimum dose to a maximum dose.

Following exposure, the resist film was baked on a hot plate for 60 seconds (post-exposure bake, PEB). The appropriate PEB temperature for each resist composition is also reported in Table 2. The appropriate PEB temperature refers to the temperature at which a wide process margin is observed for that resist composition. PEB was followed by development in a 2.38 wt % tetramethylammonium hydroxide (TMAH) aqueous solution for 30 seconds, yielding a positive pattern.

TABLE 2

| Example | Formulation No. | Prebake temperature (° C. × 60 sec) | PEB temperature (° C. × 60 sec) | Optimum exposure dose capable of 40 nm finish from 70 nm line/160 nm pitch mask design (mJ) |
|---|---|---|---|---|
| Example 1 | F-001 | 100 | 100 | 37 |
| Example 2 | F-002 | 100 | 100 | 40 |
| Example 3 | F-003 | 105 | 105 | 42 |
| Example 4 | F-004 | 105 | 105 | 45 |
| Example 5 | F-005 | 100 | 100 | 39 |
| Example 6 | F-006 | 100 | 100 | 40 |
| Example 7 | F-007 | 100 | 100 | 41 |
| Example 8 | F-008 | 100 | 100 | 40 |
| Example 9 | F-009 | 100 | 100 | 41 |
| Example 10 | F-010 | 100 | 100 | 39 |
| Comparative Example 1 | F-011 | 100 | 100 | 40 |
| Comparative Example 2 | F-012 | 100 | 100 | 40 |
| Comparative Example 3 | F-013 | 95 | 95 | 41 |
| Example 11 | F-014 | 100 | 100 | 38 |
| Example 12 | F-015 | 100 | 100 | 40 |
| Example 13 | F-016 | 105 | 105 | 41 |
| Example 14 | F-017 | 105 | 105 | 46 |
| Example 15 | F-018 | 100 | 100 | 38 |
| Example 16 | F-019 | 100 | 100 | 39 |
| Example 17 | F-020 | 100 | 100 | 40 |
| Example 18 | F-021 | 100 | 100 | 41 |
| Example 19 | F-022 | 100 | 100 | 42 |
| Example 20 | F-023 | 100 | 100 | 40 |
| Comparative Example 4 | F-024 | 100 | 100 | 39 |
| Comparative Example 5 | F-025 | 100 | 100 | 39 |
| Comparative Example 6 | F-026 | 95 | 95 | 40 |

Table 2 also reports the optimum exposure dose at which 40-nm lines were finished from the line-and-space design consisting of 70-nm lines and 160-nm pitches (equivalent resist pattern size) on the mask.

Next, in Examples 1 to 10 and Comparative Examples 1 to 3, the pattern of 40-nm lines finished from the line-and-space design consisting of 70-nm lines and 160-nm pitches (equivalent resist pattern size) on the mask was subjected to flood exposure using the ArF scanner at an ArF exposure dose of 50 mJ, and heat treated on a hot plate at 200° C. for 60 seconds.

In Examples 11 to 20 and Comparative Examples 4 to 6 wherein the thermo-acid generator was added, flood exposure was omitted, and the pattern was heat treated on a hot plate at 200° C. for 60 seconds.

The flood exposure and heat treatment steps described above serve for the purpose of inducing crosslinking reaction in the first resist pattern to endow it with resistance to an organic solvent used in coating of the second resist material, and for the purpose of acquiring resistance to an alkaline developer used in the developing step to form the second resist pattern. After the flood exposure and heat treatment steps described above, the line patterns of Examples 1 to 20 and Comparative Examples 1 to 6 were examined by dispensing 5 mL of the solvent used in the second resist material, i.e., PGMEA onto the pattern while rotating the pattern-bearing substrate, and observing how the pattern changed thereafter. The results are shown in Table 3.

Further, the line patterns of Examples 1 to 20 and Comparative Examples 1 to 6 were exposed at 50 mJ (corresponding to patterning of the second resist), then heat treated at 100° C. for 60 seconds (corresponding to PEB of the second resist), and finally developed with an alkaline developer (2.38 wt % TMAH) for 30 seconds. Any subsequent pattern changes were observed. The results are shown in Table 3.

TABLE 3

| Example | Formulation No. | After PGMEA dispensing (corresponding to 2nd resist coating), 40 nm finish pattern from 70 nm line/160 nm pitch mask design | After 2.38% TMAH development (corresponding to 2nd resist patterning), 40 nm finish pattern from 70 nm line/160 nm pitch mask design |
|---|---|---|---|
| Example 1 | F-001 | line pattern retained | line pattern retained |
| Example 2 | F-002 | line pattern retained | line pattern retained 40 nm → 45 nm line width change |
| Example 3 | F-003 | line pattern retained | line pattern retained |
| Example 4 | F-004 | line pattern retained | line pattern retained |
| Example 5 | F-005 | line pattern retained | line pattern retained |
| Example 6 | F-006 | line pattern retained | line pattern retained 40 nm → 46 nm line width change |
| Example 7 | F-007 | line pattern retained | line pattern retained |
| Example 8 | F-008 | line pattern retained | line pattern retained |
| Example 9 | F-009 | line pattern retained | line pattern retained |
| Example 10 | F-010 | line pattern retained | line pattern retained |
| Comparative Example 1 | F-011 | line pattern retained | pattern and film dissolved away |
| Comparative Example 2 | F-012 | line pattern retained | pattern and film dissolved away |
| Comparative Example 3 | F-013 | pattern and film dissolved away | pattern and film dissolved away |
| Example 11 | F-014 | line pattern retained | line pattern retained |
| Example 12 | F-015 | line pattern retained | line pattern retained 40 nm → 43 nm line width change |
| Example 13 | F-016 | line pattern retained | line pattern retained |
| Example 14 | F-017 | line pattern retained | line pattern retained |
| Example 15 | F-018 | line pattern retained | line pattern retained 40 nm → 45 nm line width change |
| Example 16 | F-019 | line pattern retained | line pattern retained |
| Example 17 | F-020 | line pattern retained | line pattern retained |
| Example 18 | F-021 | line pattern retained | line pattern retained |
| Example 19 | F-022 | line pattern retained | line pattern retained |
| Example 20 | F-023 | line pattern retained | line pattern retained |
| Comparative Example 4 | F-024 | line pattern retained | pattern extinguished |
| Comparative Example 5 | F-025 | line pattern retained | pattern extinguished |
| Comparative Example 6 | F-026 | pattern and film dissolved away | pattern extinguished |

In Table 3, the first resist patterns of Examples 1 to 10 and 11 to 20 were retained because they had been insolubilized in PGMEA which was the organic solvent used in coating of the second resist material. The patterns were also retained during the exposure, PEB and development steps used in patterning of the second resist material, indicating that they had been insolubilized in the alkaline developer. The first resist patterns of Comparative Examples 1, 2, 4 and 5 were insoluble in PGMEA (corresponding to the second resist coating), but did not display resistance to alkaline developer, and so these patterns extinguished when contacted with the alkaline developer (corresponding to the second resist patterning). The patterns of Comparative Examples 3 and 6 were neither insoluble in PGMEA (corresponding to the second resist coating) nor resistant to alkaline developer.

Example 21

The composition of Example 7 (Formulation F-007) was used as the first resist material. By the patterning process described above, a line pattern of 40-nm lines finished from the line-and-space design consisting of 70-nm lines and 160-nm pitches (equivalent resist pattern size) on the mask was formed. [substrate with ARC-29A (by Nissan Chemical Industries, Ltd.) 90 nm, Formulation F-007, coating thickness 1,200 Å, prebaking 100° C.×60 sec, PEB 100° C.×60 sec (S-307E by Nikon Corp., NA=0.85, σ=0.93-0.62, dipole), 40-nm line finishing optimum exposure 41 mJ]

Then, using the same scanner, the first resist pattern was subjected to flood exposure of 50 mJ and heat treatment of 200° C.×60 sec.

The composition of Formulation F-007 as the second resist material was coated on the first resist pattern under the same conditions as above. The second resist film was patterned under the same conditions as above. The patterning of the second resist film included exposure so as to define lines alternately in the first resist line pattern. That is, exposure was done while shielding radiation between lines of the first resist line pattern. Exposure of the second resist film was followed by PEB (100° C.×60 sec) and development. A double pattern was formed in which the 1:3 line-and-space pattern of first resist consisting of 40 nm lines and 160 nm pitches and the same 1:3 line-and-space pattern of second resist consisting of 40 nm lines and 160 nm pitches overlapped. These lines and spaces were observed as a satisfactory rectangular 1:1 pattern of 40 nm lines and 80 nm pitches.

Example 22

The composition of Example 10 (Formulation F-010) was selected as the first resist material. A pattern of 40-nm lines and 160-nm pitches was formed under optimum conditions. [substrate with ARC-29A (by Nissan Chemical Industries, Ltd.) 90 nm, Formulation F-010, coating thickness 1,200 Å, prebaking 100° C.×60 sec, PEB 100° C.×60 sec (S-307E by Nikon Corp., NA=0.85, σ=0.93-0.62, dipole), 40-nm line finishing optimum exposure 39 mJ]

After patterning of the first resist, flood exposure and heat treatment were performed under the same conditions as above.

The composition of Formulation F-012 in Comparative Example 2 was selected as the second resist material. It was coated on the first resist pattern and patterned. [Formulation F-012, coating thickness 1,200 Å, prebaking 100° C.×60 sec, PEB 100° C.×60 sec (S-307E by Nikon Corp., NA=0.85, σ=0.93-0.62, dipole), 40-nm line finishing optimum exposure 40 mJ] After patterning of the second resist, the resulting lines and spaces were observed as a satisfactory rectangular 1:1 pattern of 40 nm lines and 80 nm pitches.

Example 23

The composition of Example 20 (Formulation F-020) was selected as the first resist material. A pattern of 40-nm lines and 160-nm pitches was formed under optimum conditions. [substrate with ARC-29A (by Nissan Chemical Industries, Ltd.) 90 nm, Formulation F-020, coating thickness 1,200 Å, prebaking 100° C.×60 sec, PEB 100° C.×60 sec (S-307E by Nikon Corp., NA=0.85, σ=0.93-0.62, dipole), 40-nm line finishing optimum exposure 40 mJ]

After patterning of the first resist, flood exposure was omitted and only heat treatment of 200° C.×60 sec was performed.

The composition of Formulation F-012 in Comparative Example 2 was selected as the second resist material. It was coated on the first resist pattern and patterned. [Formulation F-012, coating thickness 1,200 Å, prebaking 100° C.×60 sec, PEB 100° C.×60 sec (S-307E by Nikon Corp., NA=0.85, σ=0.93-0.62, dipole), 40-nm line finishing optimum exposure 40 mJ] After patterning of the second resist, the resulting lines and spaces were observed as a satisfactory rectangular 1:1 pattern of 40 nm lines and 80 nm pitches.

Examples below use negative resist compositions as the second resist material.

Polymers shown below were synthesized as the base polymer in negative resist compositions. A photoacid generator, basic compound, and acid crosslinker are shown below.

Resist Polymer 14
(polymer for use in second negative resist composition)
Mw=8,400
Mw/Mn=1.80

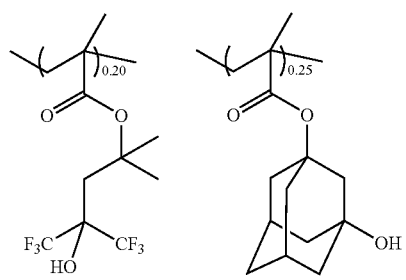

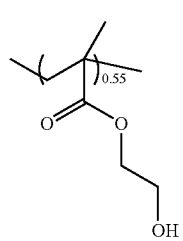

Resist Polymer 15
(polymer for use in second negative resist composition)
Mw=8,700
Mw/Mn=1.88

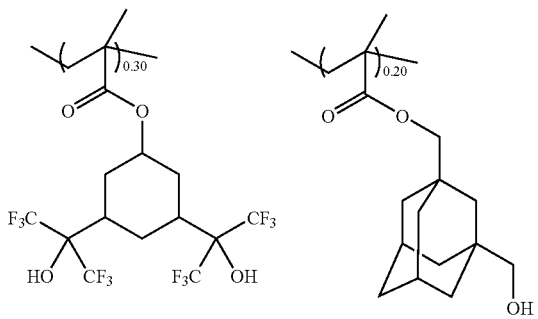

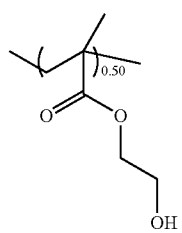

Acid generator: PAG2 of the following structural formula

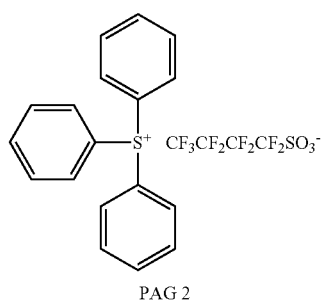

PAG 2

Basic compound: Quencher 2 of the following structural formula

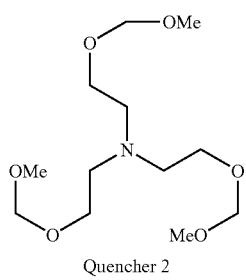

Quencher 2

Acid crosslinker: CL of the following structural formula

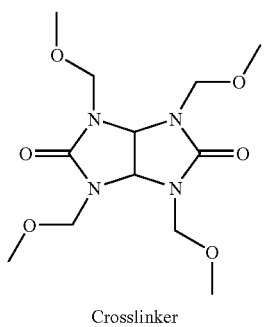

Crosslinker

Organic solvent: 2-methyl-1-butanol

Negative resist compositions were prepared according to the formulation shown in Table 4 by combining the polymers with the acid generator, basic compound, and acid crosslinker and filtering through a filter having a pore size of 0.2 μm. These negative resist compositions were used as the second resist material.

TABLE 4

| Resist composition | Formulation No. | Polymer | PAG | Basic compound | Crosslinker | Organic solvent |
|---|---|---|---|---|---|---|
| 2nd negative resist | F-027 | Resist Polymer 14 (100) | PAG2 (5) | Quencher 2 (1.4) | CL (3.5) | 2-Me-1-Butanol (2,700) |
| | F-028 | Resist Polymer 15 (100) | PAG2 (5) | Quencher 2 (1.4) | CL (3.5) | 2-Me-1-Butanol (2,700) |

Example 24

The composition of Example 10 (Formulation F-010) was selected as the first resist material. A pattern of 40-nm lines and 160-nm pitches was formed under optimum conditions. [substrate with ARC-29A (by Nissan Chemical Industries, Ltd.) 90 nm, Formulation F-010, coating thickness 1,200 Å, prebaking 100° C.×60 sec, PEB 100° C.×60 sec (S-307E by Nikon Corp., NA=0.85, σ=0.93-0.62, dipole), 40-nm line finishing optimum exposure 39 mJ]

After patterning of the first resist, flood exposure (50 mJ) and heat treatment (200° C.×60 sec) were performed under the same conditions as above.

The negative resist composition of Formulation F-027 (Table 4) was selected as the second resist material. It was coated on the first resist pattern and patterned. [Formulation F-027, coating thickness 1,200 Å, prebaking 100° C.×60 sec, PEB 80° C.×60 sec (S-307E by Nikon Corp., NA=0.85, σ=0.93-0.62, dipole), 40-nm line finishing optimum exposure 28 mJ] Since the second resist material is negative so that the exposed areas become lines (as opposed to the above examples wherein the second resist material is positive), exposure was made between lines of the first resist pattern. After patterning of the second resist, the resulting lines and spaces were observed as a satisfactory rectangular 1:1 pattern of 40 nm lines and 80 nm pitches.

Example 25

The composition of Example 20 (Formulation F-020) was selected as the first resist material. A pattern of 40-nm lines and 160-nm pitches was formed under optimum conditions. [substrate with ARC-29A (by Nissan Chemical Industries, Ltd.) 90 nm, Formulation F-020, coating thickness 1,200 Å, prebaking 100° C.×60 sec, PEB 100° C.×60 sec (S-307E by Nikon Corp., NA=0.85, σ=0.93-0.62, dipole), 40-nm line finishing optimum exposure 40 mJ]

After patterning of the first resist, flood exposure was omitted and only heat treatment (200° C.×60 sec) was performed.

The negative resist composition of Formulation F-028 (Table 4) was selected as the second resist material. It was coated on the first resist pattern and patterned. [Formulation F-028, coating thickness 1,200 Å, prebaking 100° C.×60 sec, PEB 80° C.×60 sec (S-307E by Nikon Corp., NA=0.85, σ=0.93-0.62, dipole), 40-nm line finishing optimum exposure 36 mJ] After patterning of the second resist, the resulting lines and spaces were observed as a satisfactory rectangular 1:1 pattern of 40 nm lines and 80 nm pitches.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2008-227775 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A double pattern forming process comprising the steps of:
coating a first chemically amplified positive resist composition onto a processable substrate, said resist composition comprising a resin comprising recurring units having an alkali-soluble group protected with an acid labile group which is eliminatable with acid, an acid generator, and a solvent, and prebaking the resist composition to remove the unnecessary solvent and form a first resist film,
exposing the first resist film to high-energy radiation in a first pattern of exposed and unexposed areas, post-exposure baking for causing the acid generated by the acid generator upon exposure to act on the acid labile groups on the resin whereby the acid labile groups on the resin in the exposed area undergo elimination reaction so that the resin in the exposed area becomes alkali soluble, and developing the exposed resist film with an alkaline developer to form a first positive resist pattern,
rendering the first positive resist pattern insoluble in a solvent used in a second resist composition to be subsequently coated and also insoluble in an alkaline developer to be applied upon subsequent patterning of the second resist composition, the insolubilizing step including application of heat and/or high-energy radiation, coating a second chemically amplified resist composition on the first resist pattern, prebaking the second resist composition to remove the unnecessary solvent and form a second resist film, exposing the second resist film to high-energy radiation in a second pattern of exposed and unexposed areas, and developing the exposed second resist film with an alkaline developer to form a second resist pattern, wherein the resin in the first resist composition comprises recurring units of the general formula (1):

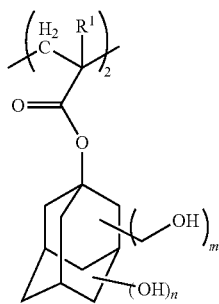

(1)

wherein $R^1$ is each independently hydrogen, methyl or trifluoromethyl, m is 1 or 2, n is 0 or 1, and "a" indicative of a ratio of the recurring units incorporated in the resin is in the range: $0.01 \leq a < 1$.

2. The process of claim 1 wherein the resin in the first chemically amplified positive resist composition comprises recurring units having an alkali-soluble group protected with an acid labile group which is eliminatable with acid, represented by the general formula (2), and recurring units represented by the general formula (3):

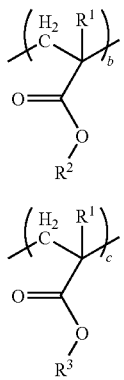

(2)

(3)

wherein $R^1$ is each independently hydrogen, methyl or trifluoromethyl, $R^2$ is an acid labile group, $R^3$ is a group of lactone structure, b and c indicative of a ratio of the respective recurring units incorporated in the resin are in the range: $0.01 \leq b < 1$, $0.01 \leq c < 1$, and $0.3 \leq a+b+c \leq 1$.

3. The process of claim 2 wherein the resin in the first chemically amplified positive resist composition further comprises recurring units having a 7-oxanorbornane ring structure represented by the general formula (4), (5) or (6):

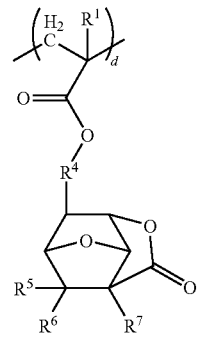

(4)

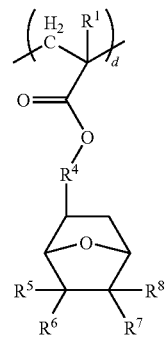

(5)

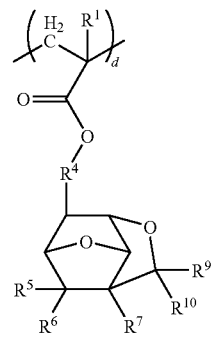

(6)

wherein $R^1$ is each independently hydrogen, methyl or trifluoromethyl, $R^4$ is a single bond, or a straight, branched or cyclic $C_1$-$C_6$ alkylene group which may have an ether or ester group and which has a primary or secondary carbon atom through which it is linked to the ester moiety in the formula, $R^5$, $R^6$, $R^7$, and $R^8$ are each independently hydrogen or a straight, branched or cyclic $C_1$-$C_6$ alkyl group, $R^9$ and $R^{10}$ are each independently hydrogen, a straight, branched or cyclic $C_1$-$C_6$ alkyl group or —$CO_2R^{11}$, or may bond together to form a cyclic alkyl group with the carbon atom to which they are attached, $R^{11}$ is hydrogen or a straight, branched or cyclic $C_1$-$C_6$ alkyl group, and d is a number in the range: $0 \leq d \leq 0.5$ and $0.3 \leq a+b+c+d \leq 1$.

4. The process of claim 1 wherein in the steps of coating a first positive resist composition onto a processable substrate, prebaking the resist composition to form a first resist film, exposing the first resist film to high-energy radiation in a first pattern of exposed and unexposed areas, post-exposure baking for causing the acid generated by the acid generator upon exposure to act on the acid labile groups on the resin whereby the acid labile groups on the resin in the exposed area undergo elimination reaction so that the resin in the exposed area becomes alkali soluble, developing the exposed resist film with an alkaline developer to form a first positive resist pattern, and applying heat and/or high-energy radiation to render the first positive resist pattern insoluble in a solvent used in a second resist composition to be subsequently coated and also insoluble in an alkaline developer to be applied upon subsequent patterning of the second resist composition, wherein a compound capable of generating an acid upon exposure to high-energy radiation and/or a compound capable of generating an acid upon heating is added to the first resist composition for the purpose of promoting insolubilization in both solvent and alkaline developer.

5. The process of claim 1 wherein in the steps of coating a first chemically amplified positive resist composition onto a processable substrate, prebaking the resist composition to form a resist film, exposing the resist film to a pattern of high-energy radiation, post-exposure baking for causing the acid generated by the acid generator upon exposure to act on the acid labile groups on the resin whereby the acid labile groups on the resin in the exposed area undergo elimination reaction so that the resin in the exposed area becomes alkali soluble, and developing the exposed resist film with an alkaline developer to form a first positive resist pattern, the exposing step is effected by the immersion lithography wherein a high refractive index liquid having a refractive index of at least 1.0 intervenes between the resist film and a projection lens, in the steps of coating a second chemically amplified resist composition on the first resist pattern, prebaking the second resist composition to form a second resist film, exposing the second resist film to a pattern of high-energy radiation, post-exposure baking for causing the acid generated by the acid generator upon exposure to act on the acid labile groups on the resin whereby the acid labile groups on the resin in the exposed area undergo elimination reaction, and developing the exposed second resist film with an alkaline developer to form a second resist pattern, the exposing step is effected by the immersion lithography wherein a high refractive index liquid having a refractive index of at least 1.0 intervenes between the second resist film and a projection lens.

6. The process of claim 1 wherein in the steps of coating a first chemically amplified positive resist composition onto a processable substrate, prebaking the resist composition to form a first resist film, exposing the resist film to high-energy radiation, post-exposure baking, post-exposure baking for causing the acid generated by the acid generator upon exposure to act on the acid labile groups on the resin whereby the acid labile groups on the resin in the exposed area undergo elimination reaction so that the resin in the exposed area becomes alkali soluble, and developing the exposed resist film with an alkaline developer to form a first positive resist pattern, the step of applying a protective coating on the first resist film is further included, and the exposing step is effected by the immersion lithography wherein a high refractive index liquid having a refractive index of at least 1.0 intervenes between the first resist film and a projection lens;

in the steps of coating a second chemically amplified resist composition on the first resist pattern, prebaking the second resist composition to form a second resist film, exposing the second resist film to high-energy radiation, post-exposure baking for causing the acid generated by the acid generator upon exposure to act on the acid labile groups on the resin whereby the acid labile groups on the resin in the exposed area undergo elimination reaction, and developing the exposed second resist film with an alkaline developer to form a second resist pattern, the step of applying a protective coating on the second resist film is further included, and the exposing step is effected by the immersion lithography wherein a high refractive index liquid having a refractive index of at least 1.0 intervenes between the second resist film and a projection lens.

7. The process of claim 1 wherein said second chemically amplified resist composition is a positive resist composition.

8. The process of claim 1 wherein said second chemically amplified resist composition is a negative resist composition.

* * * * *